United States Patent
Sanjoh (12)

(10) Patent No.: US 6,174,365 B1
(45) Date of Patent: Jan. 16, 2001

(54) APPARATUS FOR CRYSTAL GROWTH AND CRYSTAL GROWTH METHOD EMPLOYING THE SAME

(75) Inventor: Akira Sanjoh, Osaka (JP)

(73) Assignee: Sumitomo Metal Industries, Ltd., Osaka (JP)

( * ) Notice: Under 35 U.S.C. 154(b), the term of this patent shall be extended for 0 days.

(21) Appl. No.: 09/225,706

(22) Filed: Jan. 6, 1999

Related U.S. Application Data

(63) Continuation of application No. PCT/JP97/02359, filed on Jul. 8, 1997.

(30) Foreign Application Priority Data

| Jul. 15, 1996 | (JP) | ................................................... | 8-205411 |
| Sep. 3, 1996 | (JP) | ................................................... | 8-253793 |
| Nov. 29, 1996 | (JP) | ................................................... | 8-319279 |

(51) Int. Cl.⁷ .................................................. C30B 21/02
(52) U.S. Cl. ............................ 117/68; 117/206; 117/919; 117/931; 422/245.1
(58) Field of Search ........................ 422/245.1; 117/5, 117/11, 68, 206, 919, 931

(56) References Cited

U.S. PATENT DOCUMENTS

| 4,990,216 | 2/1991 | Fujita et al. . | |
| 5,365,456 | * 11/1994 | Subbiah | ............................... 364/499 |
| 6,017,390 | * 1/2000 | Charych et al. | ....................... 117/68 |

FOREIGN PATENT DOCUMENTS

| 0 274 824 A1 | 7/1988 | (EP) . |
| 0 402 917 A2 | 12/1990 | (EP) . |
| 0 402 917 A3 | 12/1990 | (EP) . |
| 2-18373 | 1/1990 | (JP) . |
| 8-34699 | 2/1996 | (JP) . |

OTHER PUBLICATIONS

M. Thakur et al., Journal of Crystal Growth 106 (1990) Dec., No. 4, pp. 724–727.
E.I. Givargizov et al., Jouranl of Crystal Growth 112 (1991). Jul., No. 4, pp. 758–772.
Patent Abstract of Japanese 8–34699A.

* cited by examiner

*Primary Examiner*—Felisa Hiteschew
(74) *Attorney, Agent, or Firm*—Burns, Doane, Swecker & Mathis, LLP

(57) ABSTRACT

Provided are an apparatus and a method which can accelerate crystallization of a biological macromolecule such as protein. A plurality of solution storage parts are formed on a silicon substrate whose valence electrons are controlled by controlling the concentration and/or the type of impurity. These solution storage parts are connected with each other by passages. The storage part is made to hold a buffer solution containing molecules of protein or the like to be crystallized. The storage parts are also made to hold solutions capable of accelerating crystallization of protein or the like respectively. These solutions are shifted to the solution storage part through the passages for preparing a mixed solution in a different ratio in each storage part. Thus, different conditions for crystallization can be simultaneously formed in a short time with a small amount of sample. A crystal of protein or the like is grown in the storage part holding the mixed solution. Growth of the crystal is controlled by the electric properties which are brought to the silicon substrate surface by the valence electron control

56 Claims, 22 Drawing Sheets

X−X′

Y−Y′

Z−Z′

APPARATUS FOR CRYSTAL GROWTH AND CRYSTAL GROWTH METHOD EMPLOYING THE SAME

This application is a continuation of Application Ser. No. PCT/JP97/02359, filed in Japan on Jul. 8, 1997, which designates the United States of America.

BACKGROUND OF THE INVENTION

1. Field of the Invention

The present invention relates to a technique for performing crystallization of macromolecules, and more particularly, it relates to a technique for performing crystallization of various biological macromolecules such as proteins by employing a semiconductor substrate or the like whose valence electrons are controlled.

2. Description of the Background Art

For understanding specific properties and functions in various types of biological macromolecules such as protein and complexes thereof, detailed steric structures thereof are indispensable information. From the basic chemical viewpoint, for example, information on the three-dimensional structure of protein or the like serves as the basis for understanding the mechanism of function appearance in a biochemical system by an enzyme or hormone. Particularly in the fields of pharmaceutical science, genetic engineering and chemical engineering among industrial circles, the three-dimensional structure provides information indispensable for rational molecular design for facilitating drug design, protein engineering, biochemical synthesis and the like.

As a method of obtaining three-dimensional steric structural information of biological macromolecules at atomic levels, X-ray crystal structural analysis is the most cogent and high-accuracy means at present. The analytic speed is remarkably improved by rapid improvement of arithmetic processing speed of computers in addition to reduction of measuring times and improvement of measuring accuracy due to recent hardware improvement of X-ray light sources and analyzers. The three-dimensional structures are conceivably going to be clarified by the main stream of this method also from now on.

In order to decide the three-dimensional structure of a biological macromolecule by X-ray crystal structural analysis, on the other hand, it is indispensable to crystallize the target substance after extraction and purification. At present, however, there is neither technique nor apparatus which can necessarily crystallize any substance when applied, and hence crystallization is progressed while repeating trial and error drawing on intuition and experience under the present circumstances. A search under an enormous number of experimental conditions is necessary for obtaining a crystal of a biological macromolecule, and crystal growth forms the main bottleneck in the field of the X-ray crystallographic analysis.

Crystallization of a biological macromolecule such as protein is basically adapted to perform a treatment of eliminating a solvent from an aqueous or anhydrous solution containing the macromolecule thereby attaining a supersaturated state and growing a crystal, similarly to the case of a general low molecular weight compound such as inorganic salt. As typical methods therefor, there are (1) a batch method, (2) dialysis and (3) a gas-liquid correlation diffusion method, which are chosen depending on the type, the quantity, the properties etc. of a sample.

The batch method is a method of directly adding a precipitant eliminating hydration water to a solution containing a biological macromolecule for reducing the solubility of the biological macromolecule and converting the same to a solid phase. In this method, solid ammonium sulfate, for example, is frequently used. This method has such disadvantages that the same requires a large amount of solution sample, fine adjustment of a salt concentration and pH is difficult, skill is required for the operation, and reproducibility is low. As shown in FIG. 46, for example, the dialysis, which overcomes the disadvantages of the batch method, is a method of placing a solution 572 containing a biological macromolecule inside a sealed dialytic tube 571 for continuously changing the pH etc. of a dialytic tube outer liquid 573 (e.g., a buffer solution) and making crystallization. According to this method, the salt concentrations of the inner and outer liquids and the pH difference are adjustable at arbitrary speeds, and hence the conditions for crystallization are easy to find out. As shown in FIG. 47, for example, a gas-liquid correlation diffusion method among the diffusion methods is a technique of placing a droplet 582 of a sample solution on a sample holder 581 such as a cover glass and placing this droplet and a precipitant solution 584 in a closed container 583, thereby slowly setting up equilibrium by evaporation of volatile components therebetween. Furthermore, as shown in FIG. 48, a liquid phase-liquid phase diffusion method among the diffusion methods is a technique of placing a droplet 592 of a mother liquor containing a target substance and a droplet 591 of a precipitant on a substrate 590 at a space of about 5 mm, and forming a thin liquid flow 593 with the point of a needle or the like therebetween. Mutual diffusion is occurred through the liquid flow 593, and crystallization is facilitated. This diffusion method has such an advantage that the amount of the solution may be extremely small as compared with the batch method or the like.

However, there are various problems in crystallization of a biological macromolecule such as protein as described above, in the present circumstances.

First, it has been difficult to obtain a crystal of excellent crystallinity or a large-sized single crystal. It is considered that this is because a biological macromolecule is readily influenced by gravity since its molecular, weight is generally large and causes convection in a solution (e.g., F. Rosenberger, J. Cryst. Growth, 76, 618 (1986)). Namely, the biological macromolecule or a formed fine crystal nucleus precipitates by its own weight, whereby convection of the solution around the molecules or the nucleus is caused. Also around the formed crystal surface, the concentration of the molecules is decreased and local convection of the solution takes place. Due to the convection in the solution generated in the aforementioned manner, the formed crystal moves in the solution, and moreover the layer for supplying the molecules by diffusion in the periphery of the crystal is remarkably reduced. Thus, the crystal growth rate can be reduced, or anisotropic growth can take place on the crystal plane, so that crystallization can be hindered.

A large amount of solvent (mainly water) ($\geq 50$ volume %) is contained in a biological macromolecule crystal, dissimilarly to crystals of other substances. This solvent is disorderly and readily movable in the intermolecular clearances of the crystal. Although the molecules are gigantic, further, there is little wide-ranging intermolecular packing contact in the crystal and only slight molecule-to-molecule contact or contact by hydrogen bond through water molecules is present. Such a state is also the factor hindering crystallization.

Further, a biological macromolecule is extremely sensitive to the conditions employed for crystallization. While the biological macromolecule is stabilized in the solvent by interaction between individual molecular surfaces, charge distributions on the molecular surfaces, particularly conformation of amino acids in the vicinity of the molecular surfaces etc., extremely vary with the environment, i.e., pH, ionic strength and temperature of the solution, and type and dielectric constant of the buffer solution, and the like. Therefore, the crystallization process has been a multiparameter process in which complicated various conditions are entangled with each other, and it has been impossible to establish a unific technique which is applicable to any substance. As to protein, crystallization of hydrophobic membrane protein is extremely difficult at present although it is biochemically extremely important as compared with water-soluble protein, and very few examples of the hydrophobic membrane protein have succeeded in crystallization and analysis of high resolution.

Further, the obtained biological macromolecule is generally in a very small amount. For example, protein such as enzyme is generally extracted from cells or the like and purified, while the amount of the sample finally obtained for crystallization is generally extremely small since its content is small. It is said that the concentration of a biological macromolecule in a solution should be about 50 mg/ml for performing crystallization. Therefore, repeated crystallization experiments (screening) under various conditions should be carried out as to a solution of an amount as small as possible.

While the amount of the sample may be small in the diffusion methods as described above, optimum conditions for crystallization must be found out by varying the salt concentration, the pH etc. of the precipitant over a wide range to obtain a crystal of high quality. In this case, the conditions can be found out only by trial and error. Further, a glass substrate for forming a droplet of the sample thereon readily causes mass generation of unnecessary crystal nuclei. In order to suppress this, surface treatments such as surface polishing and a water-repellent treatment should be previously performed As described above, crystallization of biological macromolecules such as protein and complexes thereof forms the most significant bottleneck for the X-ray crystal structural analysis since the same has heretofore been progressed while repeating trial and error, although this is an important process in science and industry. Therefore, it is necessary to hereafter understand the basic principle of crystallization and develop a crystallization technique that is applicable to any molecule.

SUMMARY OF THE INVENTION

An object of the present invention is to technically overcome the disadvantages of the conventional crystallization process which has been progressed while repeating trial and error with no existence of a technique applicable to any substance due to the provision of various properties as described above.

Specifically, an object of the present invention is to reduce the effect of convection in a solution caused by the effect of gravity and to control nucleation in crystallization of various biological macromolecules and biological tissues mainly composed of biological macromolecules.

Another object of the present invention is to provide a technique which can suppress or control mass formation of microcrystals and obtain a large-sized crystal capable of X-ray structural analysis.

Still another object of the present invention is to provide a method and an apparatus for enabling crystallization with a small amount of solution.

According to the present invention, an apparatus for growing a crystal of a macromolecule contained in a solution is provided. This apparatus comprises a substrate whose valence electrons are controlled so that the concentration of holes or electrons in a surface part can be controlled in response to the environment of the solution containing the macromolecule, wherein the substrate has a plurality of solution storage parts for holding a solution necessary for crystal growth, and a passage provided between the plurality of solution storage parts. In at least one of the plurality of solution storage parts, the valence electrons are controlled so that the concentration of the holes or electrons in the surface part can be controlled in response to the environment of the solution containing the macromolecule. In the apparatus according to the present invention, the solution can move through the passage. Under movement of the solution, more proper conditions for crystallization can be created in any storage part whose valence electrons are controlled. A crystal can be grown in such a storage part.

According to the present invention, further, a method of growing a crystal with such an apparatus is provided.

In one aspect according to the present invention, the apparatus comprises a substrate whose valence electrons are controlled so that the concentration of holes or electrons in a surface part can be controlled in response to the environment of a solution containing a macromolecule. The surface of the substrate has a plurality of first solution storage parts for holding at least two types of solutions respectively, a plurality of second solution storage parts in which the solution containing the macromolecule is allowed to stay for crystal growth, and a plurality of passages connecting the plurality of first solution storage parts with the plurality of second solution storage parts and enabling mobilization of the solutions. At least in the second solution storage parts of the substrate, the valence electrons are controlled so that the concentration of the holes or electrons in the surface part can be controlled in response to the environment of the solution containing the macromolecule.

The apparatus according to the present invention may further have means for heating the solution in the first solution storage part.

Further, the apparatus according to the present invention may further have an electrode for applying a voltage at least to the second solution storage part.

The plural passages formed on the substrate preferably different widths and/or depths.

In the surface of the substrate, the valence electrons are preferably so controlled that formation of a crystal nucleus of the macromolecule and growth of a crystal are facilitated in a specific region of the second solution storage parts while formation of crystal nuclei is suppressed in the remaining regions. By controlling the valence electrons so, the crystal can be selectively grown in the specific region of the second solution storage parts.

The apparatus according to the present invention preferably comprises a semiconductor substrate to which impurity is added, for example. Valence electron control in the semiconductor substrate can be performed by control of the concentration and/or the types of the impurities.

A silicon crystal substrate may be employed as a preferable semiconductor substrate.

In the apparatus comprising a semiconductor substrate, a groove or hole may be formed in the second solution storage part. In this case, the concentration and/or the type of the impurity may be different between the inside potion and the outside portion of the groove or hole.

In the apparatus according to the present invention, a coat consisting essentially of an oxide may be provided on the surface to come into contact with the solution. Such a coat provides the surface with hydrophilicity.

The present invention provides an apparatus for crystal growth, which comprises the aforementioned apparatus for crystal growth, a container which can house the apparatus in a sealed state along with a precipitant or a buffer solution, and means for supporting the apparatus in the container.

The present invention provides a method of growing a crystal of a macromolecule contained in a solution. This method comprises a step of providing the aforementioned apparatus for crystal growth, a step of making the plurality of first solution storage parts provided in the apparatus hold a first solution containing a macromolecule and a second solution which is different from the first solution, respectively, a step of allowing transition of the said first solution and the second solution to he plurality of second solution storage parts provided in the apparatus through the plurality of passages and allowing a plurality of types of mixed solutions, in which the first solution and the second solution have been mixed with each other in different ratios, to stay in the plurality of second solution storage parts respectively, and a step of growing a crystal of the macromolecule in the plurality of second solution storage parts storing the mixed solutions respectively under an electrical state which is brought to the surface of the apparatus by the controlled valence electrons.

The method according to the present invention may further comprise a step of heating the solution in the first solution storage part, so that transition of the solution from the first solution storage part through the passage can be accelerated.

The method according to the present invention may further comprise a step of applying a voltage at least to the second solution storage part, so that the electrical state brought to the surface of the apparatus can be controlled.

In the method according to the present invention, when the apparatus having a groove or hole formed in the second solution storage part by fine working is employed, crystallization of the macromolecule can be facilitated in the groove or hole.

In the method according to the present invention, a buffer solution and/or a salt solution for changing the pH and/or the salt concentration of the first solution may be employed as the second solution.

In another aspect according to the present invention, an apparatus for crystal growth comprises a substrate whose valence electrons are controlled so that the concentration of holes or electrons in a surface part can be controlled in response to the environment of a solution containing a macromolecule, wherein the surface of this substrate comprises a plurality of first solution storage parts for holding at least two types of solutions respectively, a plurality of first passages for respectively discharging the solutions from the plurality of first solution storage parts and unidirectionally feeding the same, a second solution storage part simultaneously receiving at least two types of solutions fed by the plurality of first passages respectively, a second passage for discharging the solution fiom the second solution storage part and unidirectionally feeding the same, and a third solution storage part receiving the solution fed by the second passage. At least in the second solution storage part of the substrate, the valence electrons are controlled so that the concentration of the holes or electrons in the surface part can be controlled in response to the environment of the solution containing the macromolecule.

The first passage and/or the second passage may be a groove formed on the substrate. This groove may have a stepwise shape or a gradient for unidirectionally feeding the solution. Further, the first passage and/or the second passage may comprise a plurality of grooves, whose widths and depths differ from each other, formed on the substrate. The width of the groove may be widened as going from the upper stream to the lower stream, and the depth of the groove is preferably deepened as going from the upper stream to the lower stream.

In the surface of the substrate, the valence electrons are preferably so controlled that formation of a crystal nucleus of the macromolecule and growth of a crystal are facilitated in a specific region of the second solution storage part while formation of a crystal nucleus is suppressed in the remaining region. By controlling the valence electrons so, the crystal can be selectively grown in the specific region of the second solution storage part.

In the apparatus according to the present invention, a groove or hole is preferably formed on the second solution storage part of the substrate. The groove or hole can effectively prevent crystal growth from being hindered by convection of the solution.

The apparatus according to the present invention may further comprise means for heating the substrate. Such means may be an electrode formed on the surface of the substrate, for example.

In the apparatus according to the present invention, a plurality of the second solution storage parts may be provided. The plurality of first passages for carrying the same type of solution are connected to these second solution storage parts. Among these first passages, a passage toward one of the second solution storage parts may have a length and/or a width different from that of a passage toward another one of the second solution storage parts. Furthermore, its depth may be varied at need. With such structures, the flow rates of the solutions fed by the respective ones of the first passages differ from each other. The flow rate of the solution which one of the second solution storage parts receives is different from the flow rate of the solution which another one of the second solution storage parts receives. Therefore, liquids in which at least two types of solutions are mixed with each other in different ratios can be prepared in the plurality of second solution storage parts.

The apparatus according to the present invention may further have an electrode for applying a voltage at least to the second solution storage part.

The apparatus according to the present invention preferably comprises a semiconductor substrate to which impurity is added, for example. Valence electron control in the semiconductor substrate may be performed by control of the concentration and/or the type of the impurity. A silicon crystal substrate may preferably be employed as the semiconductor substrate.

In a method of growing a crystal of a macromolecule with the apparatus having the first, second and third solution storage parts, a first solution containing the macromolecule and a second solution which is different the first solution may first be held in the plurality of first solution storage parts respectively. The first solution and the second solution may be moved to the second solution storage part through the plurality of first passages so that the first solution and the second solution are mixed with each other therein. While guiding the obtained mixed solution from the second solution storage part to the third solution storage part through a second passage, a crystal of the macromolecule may be grown in the second solution storage part storing the mixed solution under an electrical state which is brought to the surface of the apparatus by the controlled valence electrons. In this crystal growth method, the apparatus may have a plurality of second solution storage parts and a plurality of first passages whose sizes differ from each other. In the plurality of second solution storage parts, a plurality of mixed solutions in which the first solution and the second solution are mixed with each other in different ratios may be held. In this method, the substrate may be heated. In this method, a voltage may be applied to the second solution storage part, so that the electrical state brought to the surface of the apparatus can be controlled. In this method, the apparatus in which a groove or hole is formed in the second solution storage part may be employed, so that convection can be suppressed by the groove or hole and/or crystal growth of the macromolecule can be facilitated. In this method, the second solution may be a buffer solution and/or a salt solution for changing the pH and/or the salt concentration of the first solution.

In still another aspect according to the present invention, an apparatus for crystal growth comprises a substrate, having an opposed pair of principal surfaces, whose valence electrons are controlled so that the concentration of holes or electrons in the principal surface parts can be controlled in response to the environment of a solution containing a macromolecule, wherein the substrate comprises a first solution storage part, provided on one of the pair of principal surfaces, for holding a solution employed for crystal growth, a passage, provided on one of the pair of principal surfaces, for discharging the solution from the first solution storage part and feeding the same in a prescribed direction, a second solution storage part, provided on one of the pair of principal surfaces, for receiving the solution fed from the passage, a through hole for guiding the solution present in the second solution storage part to the other of the pair of principal surfaces, and a third solution storage part for receiving the solution fed through the through hole in the other of the pair of principal surfaces. At least in the second solution storage part and/or the third solution storage part of this substrate, the valence electrons are controlled so that the concentration of the holes or electrons in the surface parts can be controlled in response to the environment of the solution containing the macromolecule.

The passage may be formed of a plurality of grooves whose widths and/or depths differ from each other. These grooves may be formed on the substrate itself, or may be formed by working a film provided on the substrate. The width of the groove forming the passage may be widened as going from the upper stream to the lower stream. Further, the groove forming the passage may be deepened as going from the upper stream to the lower stream. Such a structure allows the solution to unidirectionally flow in the passage. In addition, the groove forming the passage may have a stepwise shape or gradient for unidirectionally feeding the solution.

A plurality of second solution storage parts and the third solution storage parts may be provided on the substrate. In this case, the diameter of a through hole feeding the solution from one of the second solution storage parts may differ from the diameter of a through hole feeding the solution from another of the second solution storage parts. Different conditions and environments for crystal growth can be provided by varying the diameters of through holes with the storage parts.

The apparatus according to the present invention may further comprise means for heating the substrate. Such means may be an electrode formed on the surface of the substrate, for example.

In the apparatus according to the present invention, it is preferable to form a groove or hole in the second solution storage part of the substrate. The groove or hole can effectively prevent crystal growth from being hindered by convection of the solution.

In the surface of the substrate, the valence electrons are preferably so controlled that formation of a crystal nucleus of the macromolecule and growth of a crystal are facilitated in a specific region of the second solution storage part and/or the third solution storage part while formation of crystal nuclei is suppressed in the remaining regions By controlling the valence electrons so, the crystal can be grown selectively in the specific region of the second solution storage part and/or the third solution storage part.

The apparatus according to the present invention preferably comprises a semiconductor substrate to which impurity is added, for example. Valence electron control in the semiconductor substrate may be performed by control of the concentration and/or the type of the impurity. A silicon crystal substrate may preferably be employed as the semiconductor substrate.

In a crystal growth method employing the apparatus having the through hole, the first solution storage part may hold a solution containing a macromolecule. The solution may be fed from the first solution storage part to the second solution storage part through the passage. The solution can be circulated between the second solution storage part and the third solution storage part via the through hole. In the second solution storage part and/or the third solution storage part, a crystal of the macromolecule can be grown under an electrical state which is brought to the surface of the apparatus by the controlled valence electrons. In this method, the apparatus may have a plurality of first solution storage parts, a plurality of second solution storage parts and a plurality of passages whose lengths and/or widths differ from each other. The plurality of first solution storage parts may hold a first solution containing the macromolecule and a second solution which is different from the first solution respectively. The first solution and the second solution may be moved to the plurality of second solution storage parts through the plurality of passages so that the plurality of second solution storage parts hold a plurality of mixed solutions in which the first solution and the second solution are mixed with each other in different ratios respectively. In this method, the substrate may be heated. In this method, further, a voltage may be applied to the second solution storage part so that the electrical state which is brought to the surface of the apparatus can be controlled. This method may employ such an apparatus that a groove or hole is formed in the second solution storage part. By the groove or hole, convection can be suppressed and/or growth of the crystal can be facilitated. In this method, when the first solution and the second solution are employed, the second solution may be a buffer solution and/or a salt solution for changing the pH and/or the salt concentration of the first solution.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 34 is a schematic diagram showing the surface potential of the solution storage part shown in FIG. 32.

FIG. 35 is a schematic diagram showing a further example of the solution storage part for crystallization.

FIG. 36A to FIG. 36C are schematic sectional views for illustrating such states that the solution comes to be held in the solution storage part for crystallization.

FIGS. 37, 38 and 39 are photomicrographs of the crystals formed in Example 1.

FIGS. 40, 41 and 42 are perspective views schematically showing the crystals shown in FIGS. 37, 38 and 39 respectively.

FIG. 43 is a schematic diagram showing the structure of the crystal growth apparatus employed in Example 2.

FIGS. 44 and 45 are photomicrographs of the crystals formed in Example 2.

FIG. 46 is a schematic diagram showing an example of an apparatus employed for a conventional method.

FIG. 47 is a schematic diagram showing another example of an apparatus employed for a conventional method.

FIG. 48 is a schematic diagram showing still another example of an apparatus employed for a conventional method.

DETAILED DESCRIPTION OF THE INVENTION

In most of biological macromolecules such as protein, intermolecular recognition is made by a geometrically specific structure and electrostatic interaction (electrostatic repulsive force and attraction, and van der Waals force) in a solution. In the intermolecular interaction based on electrostatic energy, it is predicted that slight difference between space charge distributions on individual molecular outer-most surfaces exerts decisive influence on the degree of the intermolecular recognition and easiness of formation of a molecule aggregate. Therefore, it is conceivable that, among individual molecules repeating collision while making Brownian movement in a solution, a nucleus of a molecular aggregate having a periodic and regular structure is extremely hard to form. Further, it is conceivable that, even if a crystal nucleus is formed, it comes to that respective molecules aggregating around the nucleus are loosely bonded to each other to result in low crystallinity when the molecular structures and charge distributions on the respective molecular surfaces are not identical to each other but have redundancy.

As regards crystal formation of protein molecules, it has been reported that an initial process of nucleation is important. Yonath et al. have observed an initial crystallization process of a gigantic ribosomal subunit extracted from Bacillus Stearothermophilus with an electron microscope. According to this, they state that progress of crystallization requires that respective molecules aggregate in a two-dimensionally regular structure (network, stellate or zigzag lattice) in the initial process Biochemistry International, Vol. 5, 629–636 (1982)).

It is not clear whether or not this is indispensable to all substances in common. However, protein molecules are generally hard to aggregate since the intermolecular interaction is weak and the molecular surfaces are locally charged. Taking this into consideration, it is conceivable that, if some conditions for two-dimensionally arranging the molecules are set to form a nucleus in the initial process of crystallization, subsequent crystallization may epitaxially progresses based on the nucleus.

Figure 1A:
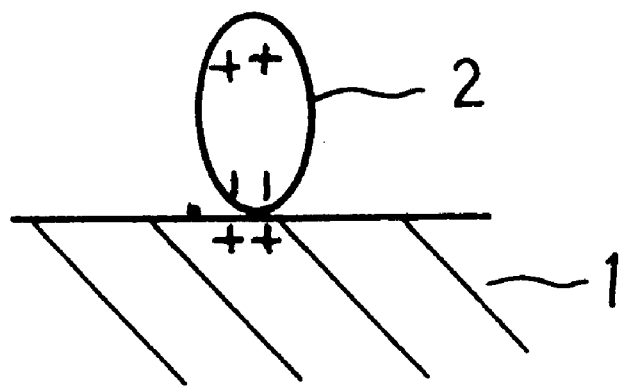
FIG. 1A and FIG. 1B are schematic diagrams illustrating such a state that a crystal nucleus is fixed to a surface of the apparatus and crystal growth progresses in accordance with the present invention.
Figure 1B:
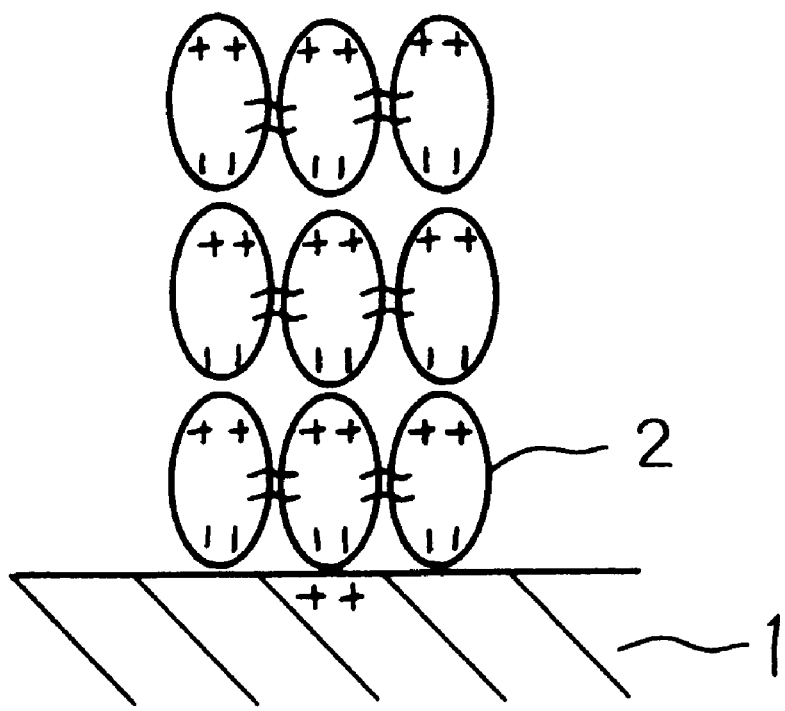

In the present invention, in order to stably form a crystal nucleus, a substrate whose valence electrons are controlled is brought into contact with a solution containing a substance to be crystallized. The substrate can control the concentration of electrons and holes by valence electron control from the surface coming into contact with the solution toward the inside, or in a section of the substrate, so that the electrical state on the surface of the substrate can be controlled. For example, FIGS. 1A and 1B schematically show such a state that a crystal nucleus is fixed on the substrate surface and a crystal grows in accordance with the present invention. As shown in FIG. 1A, a crystal nucleus 2 is fixed by electrostatic action to the surface of a substrate 1 which is brought into a prescribed electrical state, due to valence electron control. As shown in FIG. 1B, a compound such as protein aggregates on the substrate surface by electrostatic interaction, and formation of crystal nuclei is facilitated or accelerated, resulting in crystal growth. Therefore, controlling the electrical properties of the substrate surface can control crystallization. For example, the type, amount, arrangement density and the like of the crystal nucleus fixed to the substrate surface can be adjusted by valence electron control, so that crystallization can be controlled. The formed crystal nuclei are fixed to the substrate surface. Thus, it is also expected that small movement of the nuclei caused by convection or the like in the solution is suppressed, and the molecules regularly aggregate owing to the formation of the nuclei, so that the crystallinity improves. Even if charge distributions on the surfaces of the molecules to be crystallized are slightly changed due to change of pH of the solution or denaturation of the molecules, it is expected that space charges compensating for effective surface charges of the molecules are necessarily induced in the substrate surface, so that two-dimensional formation of the crystal nuclei can readily and preferentially be achieved.

According to a preferred mode of the present invention, a plurality of first solution storage parts for holding a mother liquor, a precipitant, a buffer solution and the like respectively and a plurality of second solution storage parts for receiving the liquids from the plurality of first solution storage parts and growing a crystal may be formed on a surface of the substrate forming the apparatus. Mobilization of the liquids between the first solution storage parts and the second solution storage parts is performed through the passages provided on the surface of the substrate. The passage may also be provided between the plurality of second solution storage parts as well as between the first solution storage part and the second solution storage part. By transition of the liquid through the passage, different types of solutions may be supplied from the plurality of first solution storage parts to the second solution storage parts for obtaining mixed solutions. The mixed solutions obtained in the plurality of second solution storage parts respectively may have different compositions depending on the respective positions of the second solution storage parts and the arrangement of the passages or the sizes and shapes of the passages. Namely, plural types of solutions may be mixed in the plurality of second solution storage parts in different ratios. In the system connecting the solution storage parts with each other through the passages, mutual diffusion of the plurality of solutions can be spatially and temporally continuously changed, and different conditions for crystallization can be brought with good reproducibility in the plurality of second solution storage parts for performing crystallization. When a large number of second solution storage parts are provided on the substrate, finely different conditions can be prepared. Thus, different types of crystallization conditions can be obtained on a single substrate, and it is expectable that any of these is optimum for crystallization of a necessary compound.

In the plurality of passages formed on the substrate, it is preferable that the widths and/or the depths thereof are different from each other. The supply amount of the solution can be varied by changing the size of the passage. The mixing ratio of the plural types of solutions can be controlled by changing the flow rates of the solutions supplied to the second solution storage parts for performing crystallization. When the flow rate is adjusted for each of the passages, further variation of the mixing ratios can be obtained, and hence more conditions can be prepared for crystallization.

In the present invention, means for heating the solution held in the first solution storage part may be formed on the apparatus. Such means may be a heating electrode which is formed on the substrate forming the apparatus, for example. Each of the heated solutions is extruded to the passages by the volume expansion serving as driving force. The heated solutions come to readily flow since the viscosity is lowered. Therefore, transition of the solutions is facilitated by the heating. As another method of accelerating transition of the solutions, vertical difference may be provided between the solution storage parts connected with each other through the passage. Further, a groove of fine width may be formed as the passage. When the space of the groove is narrow, the liquid can be moved by surface tension.

When the substrate is partially heated with the heating means, a temperature gradient can be provided in the substrate. Depending on the temperature gradient, temperature difference is generated between the plurality of second solution storage parts. In the solutions different in temperature from each other, the solubility of the substance to be crystallized is also different. Therefore, more conditions for crystallization can be obtained in a single substrate due to the temperature difference.

In the present invention, a voltage may also be applied to the substrate. The voltage may be applied through an electrode which is formed on a substrate surface opposite to the surface formed with the solution storage parts, for example. Such an electrode is preferably provided such that the voltage is applied at least to the second solution storage part. By applying a bias voltage through the electrode, an electrostatic effect acting on the substrate surface can be increased or reduced as described later in detail. Particularly by increasing the surface potential in the second solution storage part, acceleration of crystal growth can be attained. By application of the voltage, selective reaction and aggregation action of the molecules to be crystallized with respect to the substrate surface can be improved.

By forming a groove or hole in the second solution storage part by fine working, the convection suppressing effect of the electrostatic attraction acting on the substrate can be improved. Particularly on the bottom portion of the groove formed on the substrate, electrostatic interaction can be substantially isotropically exerted to the molecules to be crystallized. When a crystal nucleus is formed on the bottom portion of the groove, the crystal nucleus can be allowed to stand still on the bottom portion of the groove by electrostatic interaction so that the crystal nucleus is protected against convection caused by the influence of gravity. If the crystal grows based on the substantially stationary nucleus, it is expected that formation of excess microcrystals is suppressed and such a large-sized crystal that the molecules are regularly gathered on the surface of the crystal nucleus can be obtained.

Aggregateness of charged substances or molecules in an electrolytic solution generally depends on the sum of electric double layer repulsive force and van der Waals force therebetween, and hence it is extremely important to control the concentration of salt added into the electrolytic solution for adjusting a surface potential in allowing aggregation of the substances or the molecules. According to the present invention, however, the electrostatic property of the substrate surface forming the apparatus can be previously adjusted by valence electron control, and hence there also arises such a merit that adjustment of the salt concentration becomes easy or unnecessary.

Any substance may be employed for the apparatus for such a object as far as such a substance has the aforementioned electrostatic property, allows charge amount and polarity to be controlled and is chemically stable in a solution. A silicon crystal may be one of the most suitable materials for attaining this object. The mechanism of crystallization expected in the case of employing a silicon crystal will be described below. However, the mechanism described below can also be applied to another substrate employed in accordance with the present invention.

Figure 2:
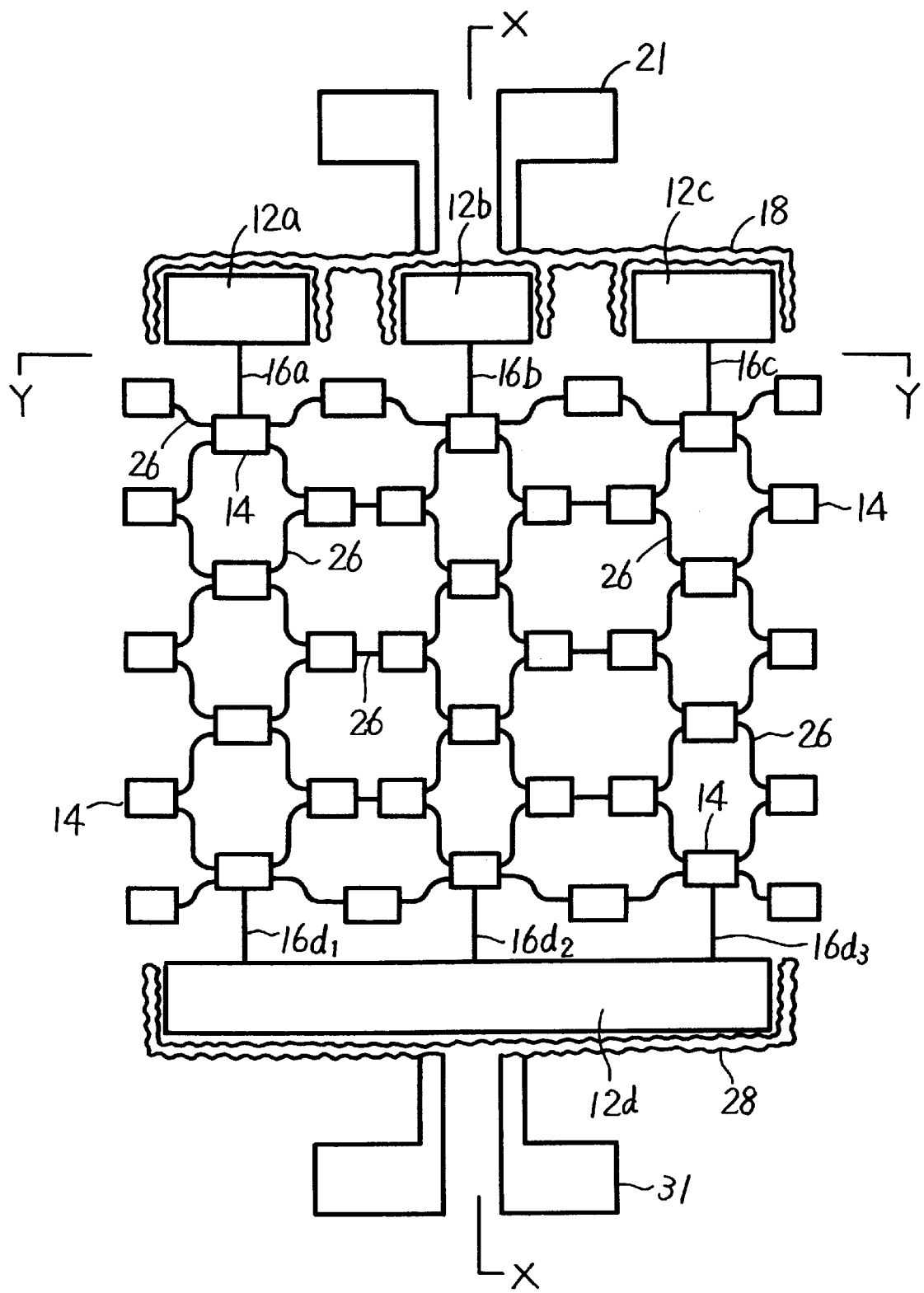
FIG. 2 is a schematic diagram showing an example of the apparatus for crystal growth according to the present invention.
Figure 3:
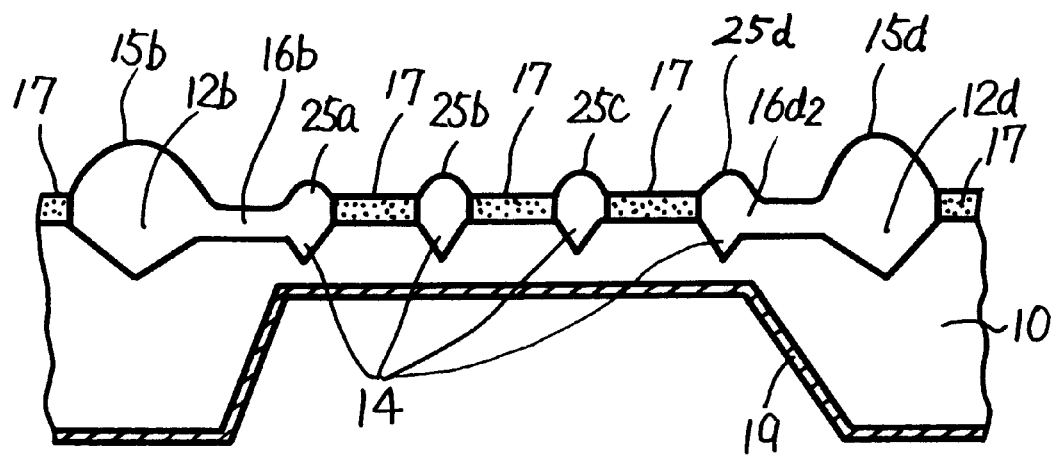
FIG. 3 is an X—X sectional view of the apparatus shown in FIG. 2.
Figure 4:
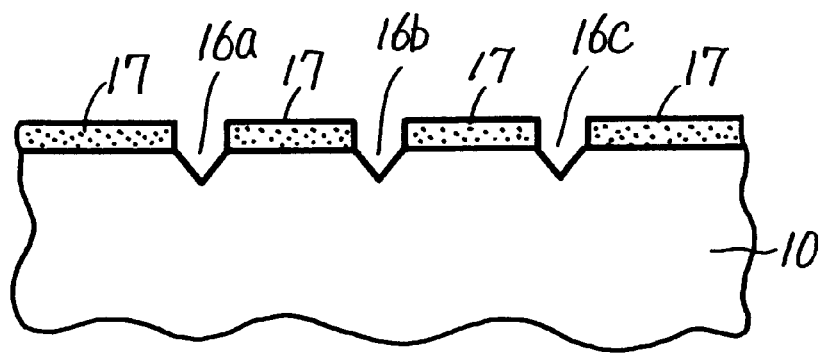
FIG. 4 is a Y—Y sectional view of the apparatus shown in FIG. 2.

FIGS. 2, 3 and 4 show an example of the apparatus for crystal growth according to the present invention. The structure shown in the figures is obtained by working a silicon substrate. FIG. 2 schematically shows the structure formed on the surface of the silicon substrate. FIG. 3 and FIG. 4 are X—X and Y—Y sectional views of the device shown in FIG. 2.

As shown in FIG. 2, a plurality of solution storage parts 12a, 12b, 12c, 12d and 14 are formed on the surface of the silicon substrate. The solution storage parts 12a to 12d correspond to the first solution storage part according to the present invention, and hold a solution containing a macromolecule and other necessary solutions respectively. A large number of solution storage parts 14, which correspond to the second solution storage part according to the present invention, are adapted to receive the plural types of solutions supplied from the solution storage parts 12a to 12d for preparing mixed solutions. At the solution storage parts 14, the solution containing the macromolecule and the other solutions meet each other, and conditions for crystallization are prepared. In any of the large number of solution storage parts 14, optimum crystallization conditions are created and crystallization is facilitated. The solution storage part 12a is connected with the solution storage parts 14 through a passage 16a. Similarly, the solution storage parts 12b, 12c and 12d are connected with the corresponding storage parts 14 through passages 16b, 16c, $16d_1$, $16d_2$ and $16d_3$. Further, passages 26 are also provided between the large number of solution storage parts 14. The passages 26 connect adjacent storage parts 14 with each other.

A heating electrode 18 is formed alongside of the solution storage parts 12a, 12b and 12c. The electrode 18 is connected to a pad 21. A heating electrode 28 is also provided alongside of the solution storage part 12d, and the electrode 28 is connected to a pad 31. The solutions held in the storage parts 12a to 12d are heated by energizing the electrodes 18 and 28 through the pads 21 and 31 respectively. While transition of the solutions is facilitated by heating as described above, these heating means may not be present.

FIG. 3 shows a section of the substrate forming the apparatus. V-grooves whose sizes differ from each other are formed on the silicon substrate 10, and these portions serve as the solution storage parts 12b, 14 and 12d respectively. Although not illustrated, V-grooves are also formed on the portions of the solution storage parts 12a and 12c shown in FIG. 2. On the substrate 10, a water-repellent layer 17 consisting of water-repellent resin, for example, is formed around the portions where the V-grooves are formed. This layer prevents the solutions from spreading on the substrate, so that the given solutions are reliably held in the respective solution storage parts. Respective solutions 15b, 15d, 25a, 25b, 25c and 25d are held in the spaces defined by the V-grooves and the water-repellent layer 17. An electrode 19 is provided on the rear surface of the silicon substrate 10. In the silicon substrate, its thickness varies with the portions where the solution storage parts 12b and 12d are formed and the portions where the solution storage parts 14 are formed. When a voltage is applied to the electrode 19 in such a structure, an electrical state (surface potential) brought to the substrate surface comes to vary with the storage parts 12b and 12d and the storage parts 14. When the distance between the rear surface electrode and the front surface is narrowed, strength of the electric field brought to the substrate surface by application of the voltage can be increased. Therefore, a high bias voltage can be selectively applied to the solution storage parts 14 for performing crystallization, and the surface potential can be increased at these portions for accelerating crystal growth.

FIG. 4 shows the structure having the passages formed on the silicon substrate. The passages 16a, 16b and 16c having the V-grooves are formed on the silicon substrate 10. The water-repellent layer 17 is also provided around the passages 16a to 16c. The solutions 25 are held in the spaces defined by the V-grooves and the water-repellent layer 17.

In the apparatus shown in FIGS. 2, 3 and 4, the storage parts 12a and 12c, the storage part 12b and the storage part 12d may be allowed to hold a buffer solution whose pH is adjusted, an aqueous solution of prescribed salt, and an aqueous solution (mother liquor) containing molecules (e.g., protein) to be crystallized respectively so that the solutions forms droplets. Further, the buffer solution or the aqueous solution of salt may be held in some of the storage parts 14 at need. Then, the overall substrate or the solution storage parts are heated by energizing. Due to the heating, transition of the solutions from the respective storage parts is facilitated. The respective passages sophisticatedly connect the storage parts 14 with each other as shown in the figures, and hence the mother liquor, the buffer solution and the salt solution are gradually mixed with each other in the respective storage parts in various concentration ratios. At this time, inflow and outflow of the solutions are repeated through the passages, and the mixing ratios temporally and spatially change little by little. Namely, various mixed solutions in which the concentrations of the molecules to be crystallized, the buffer solution and the salt differ from each other little by little are prepared in many storage parts 14. A mixing ratio optimum for crystallization is brought in any of these mixed solutions, and crystallization is facilitated there. When a groove is formed in the solution storage part for growing a crystal, control of formation of a crystal nucleus and acceleration of crystal growth can be attained as described later.

While the solution storage parts and passages having V-grooves are employed in the apparatus shown in FIG. 2 to FIG. 4, the shapes thereof may be changed to various ones. FIG. 5A to FIG. 5E, FIG. 6A to FIG. 6E and FIG. 7A to FIG. 7F further show examples of the first solution storage parts, the passages and the second solution storage parts.

Figure 5A:
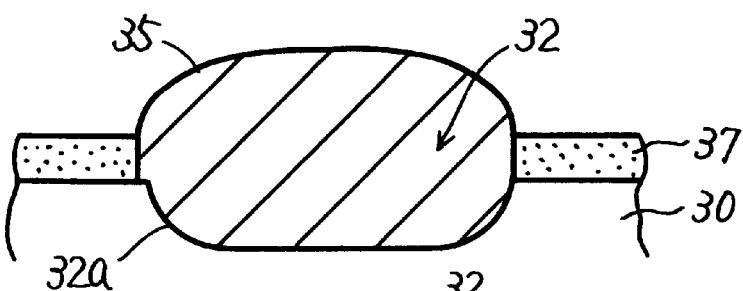
FIG. 5A to FIG. 5E are schematic sectional views showing examples of the first solution storage part in the apparatus for crystal growth according to the present invention.
Figure 5B:
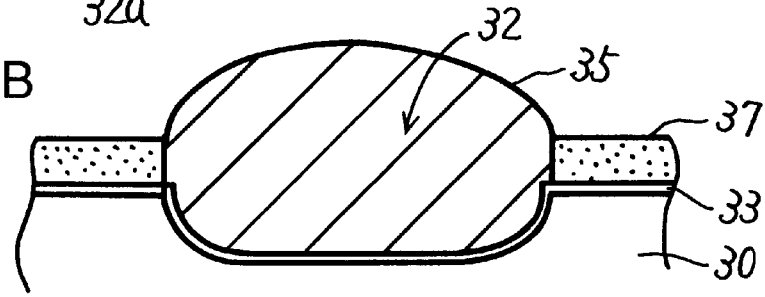
Figure 5C:
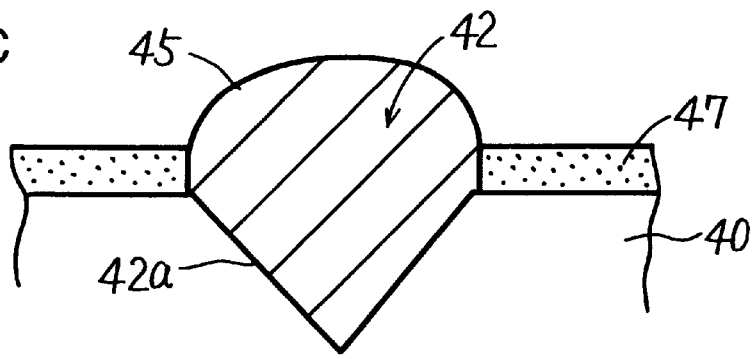
Figure 5D:
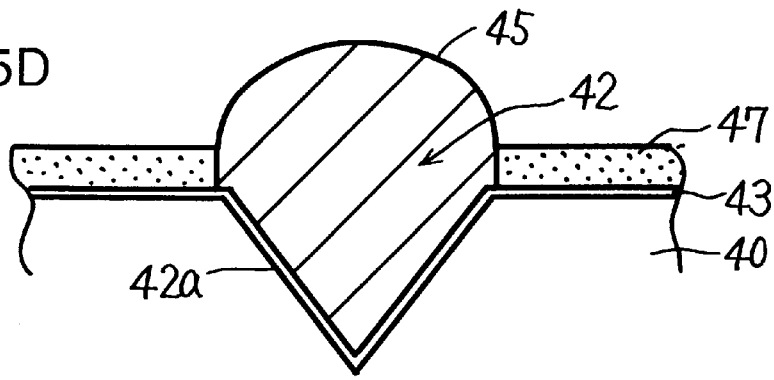
Figure 5E:
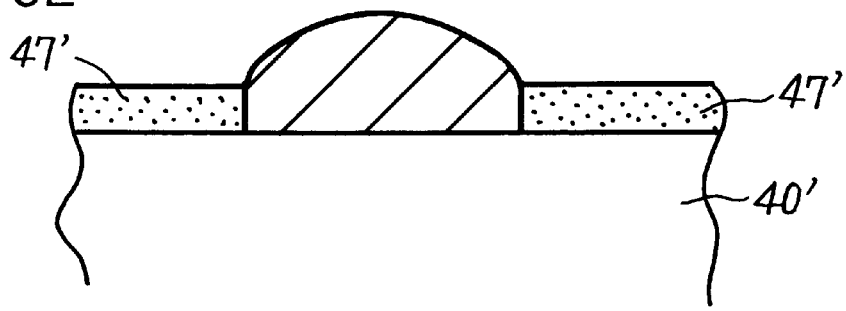

The first solution storage parts formed on the substrate surface of the apparatus according to the present invention may have the shapes as shown in FIG. 5A to FIG. 5E, for example. As shown in FIG. 5A to FIG. 5D, grooves are preferably formed in the first solution storage parts, in order to hold a necessary and sufficient amount of droplet. In the storage part shown in FIG. 5A, a U-shaped groove 32a is formed on a silicon substrate 30. The groove 32a is surrounded with a water-repellent layer 37 consisting of water-repellent resin, for example. A storage part 32 holding a solution 35 is formed of the groove 32a and the water-repellent layer 37. In the storage part shown in FIG. 5B, a silicon oxide film 33 is formed on a silicon substrate 30. The oxide film gives hydrophilicity to the silicon substrate. The other structure is similar to that of FIG. 5A. In the storage part shown in FIG. 5C, a V-groove 42a is formed on a silicon substrate 40. A water-repellant layer 47 consisting of water-repellent resin, for example, is formed around the groove 42a. A solution 45 is held in a storage part 42 formed of the groove 42a and the water-repellent layer 47. In the storage part shown in FIG. 5D, a silicon oxide film 43 is formed on a silicon substrate 40. The remaining structure is similar to that shown in FIG. 5C. In these structures, the U-shaped grooves and the V-grooves may be formed by etching the silicon substrate. The water-repellent layer may be formed by coating the silicon substrate with water-repellent resin and patterning the resin by photolithography or the like, for example. As shown in FIG. 5E, the solution storage part may be formed without forming a groove. In this case, a water-repellent layer 47' is formed on a silicon substrate 40' in a prescribed pattern so that the portion where the surface of the silicon substrate 40' is exposed may be employed as the solution storage part. When an aqueous solution is employed, an oxide film may be formed on the silicon surface where the groove is provided, so that the portion can have an increased hydrophilicity and flow of the solution can be improved.

Figure 6A:
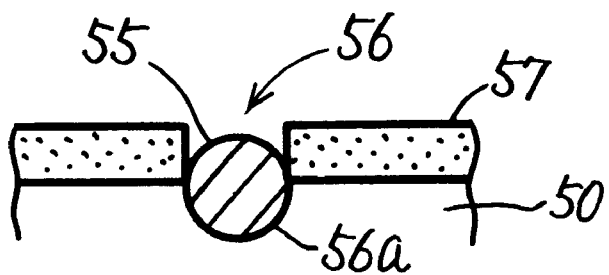
FIG. 6A to FIG. 6E are schematic sectional views showing examples of the passage in the apparatus for crystal growth according to the present invention.
Figure 6B:
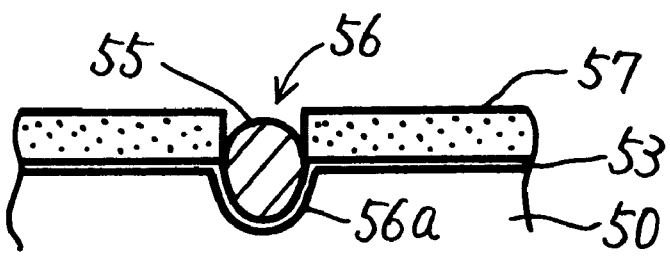
Figure 6C:
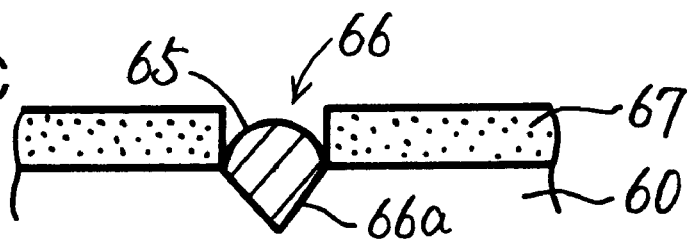
Figure 6D:
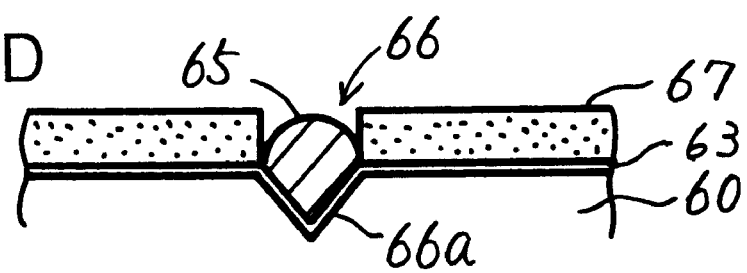
Figure 6E:
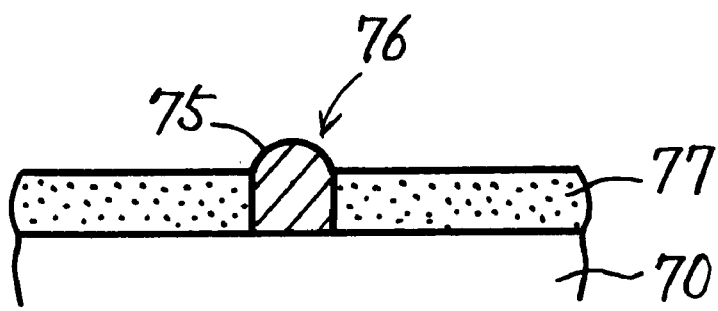

FIG. 6A to FIG. 6E show examples of the passages. As shown in FIG. 6A, a U-shaped groove 56a may be formed on a silicon substrate 50, and a water-repellent layer 57 consisting of water-repellent resin may be formed around the groove. A passage 56 is formed of the grooves 56a and the water-repellent layer 57, and a solution 55 is passed thereto. The structure shown in FIG. 6B is similar to the structure of FIG. 6A except that a silicon oxide film 53 is formed on a silicon substrate 50. A passage 66 shown in FIG. 6C has a V-groove 66a which is formed on a silicon substrate 60. A solution 65 is passed to the passage 66 formed of the groove 66a and a water-repellent layer 67 surrounding the groove. The structure shown in FIG. 6D is similar to the structure of FIG. 6C, except that a silicon oxide film 63 is formed on a silicon substrate 60. In such structures having grooves, the U-grooves and the V-grooves may be formed by etching the silicon substrate. The water-repellent layer is obtained by coating the silicon substrate with water-repellent resin and patterning the resin by photolithography or the like, for example. As shown in FIG. 6E, a structure with no groove can be more conveniently obtained. In this case, a water-repellent layer 77 is provided on a silicon substrate 70 except the portion for formation of the passage. A solution 75 is passed to a passage 76 which is surrounded with the water-repellent layer 77. When an aqueous solution is employed, a silicon oxide film may be formed on the silicon surface with a groove, so that hydrophilicity is increased and the flow of the solution is improved.

Figure 7A:
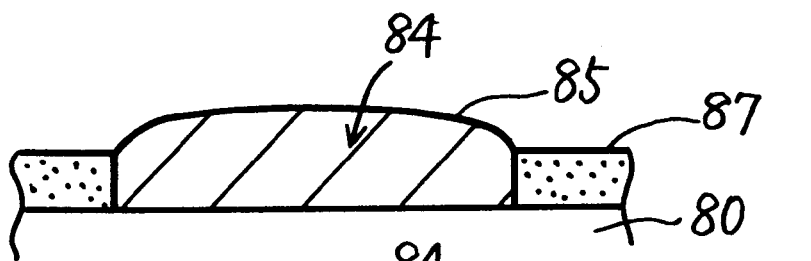
FIG. 7A to FIG. 7F are schematic sectional views showing examples of the second solution storage part in the apparatus for crystal growth according to the present invention.
Figure 7B:
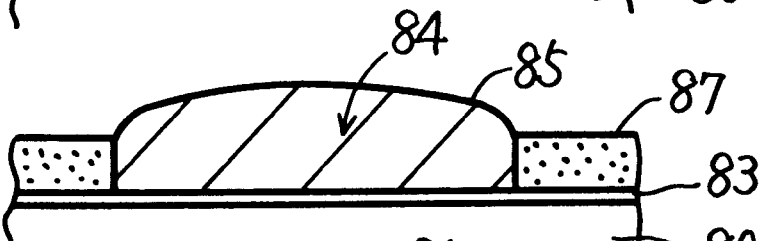

FIGS. 7A to 7F show examples of the structures of the second solution storage part. In the structure shown in FIG. 7A, a water-repellent layer 87 consisting of water-repellent resin, for example, is formed on a silicon substrate 80 in a prescribed pattern. A solution storage part 84 for holding a solution 85 is formed at a portion surrounded with the water-repellent layer 87 and having the silicon substrate 80 exposed. The surface of a silicon substrate generally has such an advantage that crystal defects and fixed charges are extremely small so that excessive generation of crystal nuclei of the molecules to be crystallized hardly occurs on the surface. Therefore, the structure as shown in FIG. 7A can also provide a space for performing crystallization. In the structure shown in FIG. 7B, a silicon oxide film 83 is formed on a silicon substrate 80. The remaining portion is similar to the structure shown in FIG. 7A. The oxide film may be formed on the silicon surface depending on the characteristics of the molecules (e.g., protein molecules) to be crystallized. The oxide film improves the hydrophilicity of the silicon surface. In the structure shown in FIG. 7C, a second silicon layer 80b is formed on a first silicon layer 80a. Changing the concentration and/or the type of impurity added to silicon may form such different silicon layers. A water-repellent layer 87 is formed on the silicon having a multilayer structure in a prescribed pattern, and a solution storage part 84 is formed at the portion surrounded with the water-repellant layer 87. In the structure shown in FIG. 7D, a second silicon layer 90b is formed on a first silicon layer 90a, and a V-groove 94a is formed in the layered structure. A storage part 94 holding a solution 95 is formed of a water-repellent layer 97 formed in a prescribed pattern and the V-groove 94a. Inside the V-groove 94a, the first silicon layer 90a is exposed. Outside the V-groove 94a, on the other hand, the first silicon layer 90a is covered with the second silicon layer 90b. In the structure shown in FIG. 7E, trenches 104a are formed in a solution storage part 104. The trench 104a has a depth larger than the width of the opening, and has a shape whose aspect ratio is high. As shown in the figure, plural trenches are preferably provided. The solution storage part 104 is provided in the substrate having a first silicon layer 100a and a second silicon layer 10b formed thereon. In the structure shown in FIG. 7F, a U-shaped groove 114a is formed in a solution storage part 114. A second silicon layer 110b is formed on a first silicon layer 11a, and a water-repellent layer 117 is provided around the solution storage part 114.

Figure 7C:
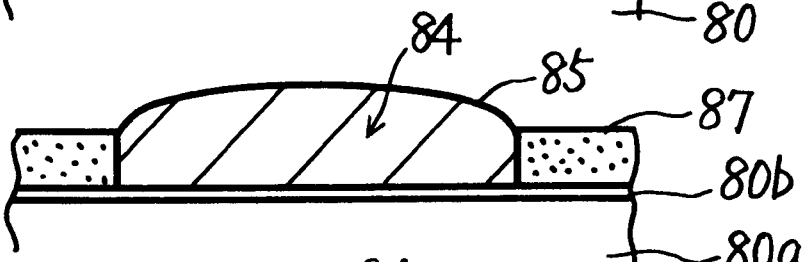
Figure 7D:
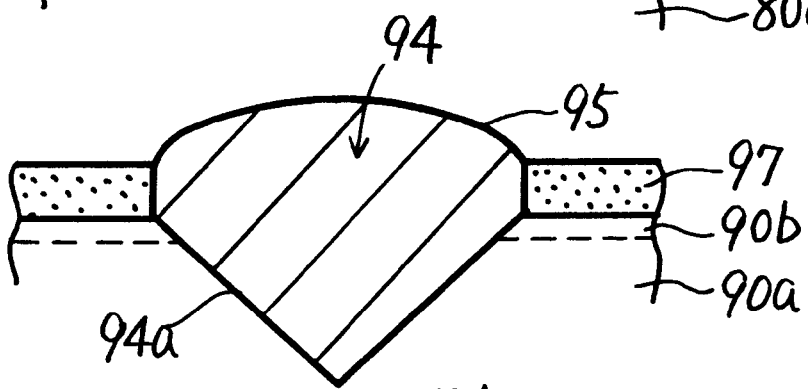
Figure 7E:
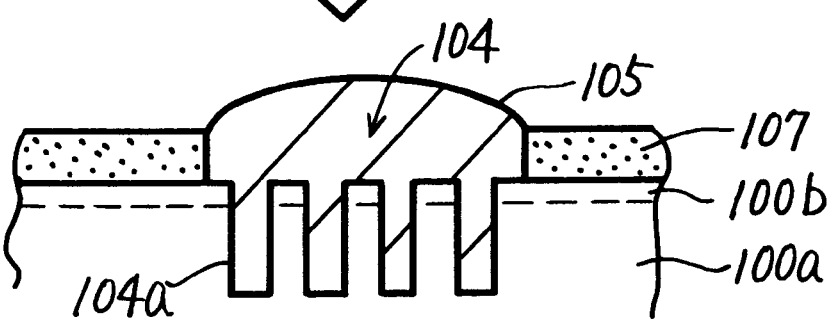
Figure 7F:
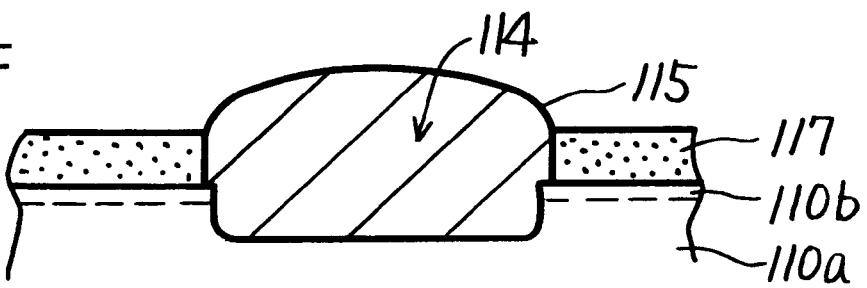

In the structures shown in FIG. 7D to FIG. 7F, the V-groove, the trench and the U-groove may be formed by chemically etching the silicon surface, for example. By forming the groove in the solution storage part, convection of the solution in the storage part can be effectively suppressed, so that the forming of crystal nuclei and growth of large-sized crystals can take place more stably. In the structures shown in FIG. 7D to FIG. 7F, a silicon oxide film may also be formed on the surface. The oxide film improves the hydrophilicity of the silicon surface. In the storage parts shown in FIG. 7A to FIG. 7F, the water-repellent layer may be formed by applying water-repellent resin and then patterning the resin by photolithography or the like, for example.

In the solution storage parts for crystallization shown in FIG. 7A to FIG. 7F, silicon whose valence electrons are controlled may be employed. Due to the controlled valence electrons, an electrical state responsive to the state of the solution is brought to the silicon surface coming to contact with the solution. For the control of the valence electrons, it is particularly preferable to form a plurality of silicon layers having different concentrations and/or types of impurities in the solution storage part. The structures shown in FIG. 7C to FIG. 7F are examples in which a plurality of silicon layers are formed with different states of controlled valence electrons. In these structures, p-type silicon and n-type silicon may be used for the first silicon layer and the second silicon layer respectively. In this case, it is conceivable that the molecules having negative effective surface charges can be more effectively crystallized particularly in the groove where the p-type silicon layer is exposed. N-type silicon having a low impurity concentration and high resistance may also be used for the first silicon layer, and n-type silicon having a high impurity concentration and low resistance may also used for the second silicon layer. In this case, it is also conceivable that the molecules having negative effective surface charges can be effectively crystallized in the groove where the n-type silicon of high resistance is exposed in particular. With respect to crystallization of the molecules having positive effective surface charges, on the other hand, it is conceivable that the polarities of the aforementioned silicon may be reversed. Namely, n-type silicon may be employed for the first silicon layer, and p-type silicon may be employed for the second silicon. It would also be effective to form p-type silicon layers or regions having different concentrations of impurity.

Such a mechanism that crystallization is controlled by the valence electron control in the substrate is hereafter described. When bringing an electrolytic aqueous solution containing a macromolecule dissociating and having negative effective surface charge into contact with an n- or p-type silicon crystal having valence electrons controlled, a Schottky barrier is formed with respect to an n-type silicon surface, while ohmic contact is obtained with respect to a p-type silicon surface. On the p-type silicon surface, holes are regularly supplied from the bulk silicon side to the macromolecular electrolyte having negative charge (ohmic property), and hence it is expected that the macromolecules regularly continuously aggregate on the silicon surface. On the other hand, a surface potential dependent on the electrolyte concentration of the aqueous solution is generated on the surface of the n-type silicon, while a space charge layer region is formed in the inside. The space charge amount also depends on the dopant concentration of the n-type silicon. Therefore, it is expected that the macromolecules having negative charge in the electrolytic solution continuously aggregate on the silicon surface until at least compensating for the positive space charge owned by the n-type silicon. It is expected that on the surface of the silicon in which the space charge layer region is formed, aggregation and crystallization of the macromolecule limitedly take place. On the other hand, it is expected that on the surface with which ohmic contact is formed, aggregation of the macromolecule unlimitedly progresses.

In addition, when at least two regions whose impurity concentrations differ from each other are formed in n-type silicon, for example, it is expected that these regions bring out crystallization in different modes. As described below, the effects are different between the case that the n-type silicon has low impurity concentration and high resistance and the case that the n-type silicon has high impurity concentration and low resistance. In the n-type silicon of a low impurity concentration (or high resistance), a depletion layer capacity is small due to the fact that the width of a space charge layer formed in the vicinity of the surface widens since the dopant concentration is low. Therefore, it is expected that a surface potential induced in the n-type silicon of a low impurity concentration is larger than that induced in the n-type silicon of a high impurity concentration (or low resistance). The surface potential is reverse in polarity to the effective surface potential owned by the macromolecule, whereby aggregation of the molecules is accelerated by the action of electrostatic attraction. Namely, it is expected that the n-type silicon substrate of a low impurity concentration and high resistance can deposit more crystals on its surface than the n-type silicon substrate of a high impurity concentration and low resistance.

As to a macromolecule dissociating and having positive surface effective charge, similar effects would be brought out with the conductivity types or resistance values in reverse relation to the above.

In addition, by using the aforementioned characteristics, the forming of a crystal nucleus can be suppressed at a specific region of the substrate, while the forming of a crystal nucleus can be facilitated at another specific region. In the structure as shown in FIG. 7C, for example, crystal deposition on a specific solution storage part or on a passage where a solution passes can be prevented by employing n-type silicon of high resistance as the first silicon and employing n-type silicon of low resistance as the second silicon. The position desired for crystal growth in the substrate may also be controlled by forming a region suitable for crystallization at a specific solution storage part by valence electron control.

As described above, the regions that are spatially different in resistance from each other can be readily formed by selectively doping the silicon surface with impurity. As another method, surfaces whose resistance values differ from each other may be exposed by etching the silicon surface.

The n-type and p-type silicon crystals employed for the present invention may be those having characteristics equivalent to those of a silicon employed for a general LSI process. The specific resistance of the silicon crystals may be within the range of about 0.0001 to 1000 $\Omega$cm, and more preferably within the range of 0.001 to 100 $\Omega$cm. Various types of methods may be employed for preparing the n-type or p-type silicon having valence electrons controlled. Ion implantation may be most convenient and capable of accurately controlling impurity concentration. In this case, valence electron control of the p-type and the n-type can be readily performed by injecting ions of elements belonging to the group III and the group V of the periodic table into silicon and annealing respectively. The group III elements for bringing silicon into the p-type may include B, Al, Ga, In, Ti and the like. B is particularly general. The group V elements for bringing silicon into the n-type may include N, P, As, Sb, Bi and the like, and P, As and Sb are particularly general. It is preferable that the surfaces of the crystals are mirror-polished, in order to control deposition of crystal nuclei.

In the present invention, the thickness of the impurity layer formed on the silicon substrate surface is preferably 0.1 to 200 $\mu$m, and more preferably in the range of 1 to 50 $\mu$m. The other thickness range is not so preferable because of difficulty of preparation or loss of the effect.

While the above description has been made as to the embodiment employing semiconductor crystal silicon in which valence electron control is easy, other materials having similar functions may be properly employed in order to attain the objects. For example, semiconductor crystals other than silicon may also be preferably employed, and materials other than the semiconductor crystal, such as inorganic compounds, organic compounds, macromolecules and complexes of these whose charge distribution is controlled may be listed as the candidates. In the present invention, plural grooves or holes are formed on the substrate forming the apparatus. The substrate shown in FIG. 2 has V-grooves. In place of the grooves, pyramidal or conical holes may be provided on the substrate surface, for example. It is more preferable for these grooves or holes that the widths of the openings narrow as approaching the deeper portions. In practical crystal growth, it is rather advantageous that the surface of a single substrate has a large number of grooves or holes in several sizes.

The apparatus employed for crystallization is preferably applicable to any macromolecule. On the other hand, it is conceivable that the characteristics of the apparatus as required vary with the sizes, charge characteristics and the like of the molecules to be crystallized. Therefore, it is conceivable that the sizes of the grooves or holes should be varied depending on the sizes, charge characteristics and the like of the molecules to be crystallized. Discretely preparing a solid-state component having grooves or holes for each targeted macromolecule, however, is costly and time-consuming, and this cannot be so efficient. When the substrate has plural grooves or holes of different sizes in advance, any of the grooves or holes should provide preferable conditions for crystallization even if the targeted molecular species changes. Therefore, it is possible to perform crystallization of various molecules with a single apparatus. Thus, the labor and the cost for the apparatus preparation are also reduced.

The sizes of the opening parts of the grooves or holes and the depths of the grooves or holes formed on the substrate surface is preferably set in a proper range depending on the type of the targeted macromolecules. In general, the widths of the opening parts of the grooves or holes are preferably in the range of 0.01 to 100 $\mu$m, and the lengths of the grooves are preferably in the range of 1 to 10 mm. Further, the plurality of grooves or holes may be conveniently arranged with a space within the range of 1 $\mu$m to 1 mm. The depths of the grooves or holes are preferably set in the range of 0.01 to 200 $\mu$m, for example. However, the sizes described above mainly come from restrictions on preparation of the apparatus and other sizes will not exert decisive bad influence on the performance of the apparatus, i.e., crystallization.

Further, a water-repellent layer is preferably formed on the surface of the apparatus of a silicon substrate or the like to surround the solution storage parts and the passages. This layer can effectively prevent a solution from flowing out to the periphery when the solution is held. While a silicon surface obtained by removing the oxide film, for example, is generally water-repellent to pure water or water containing only acid or alkali, the same has decreased water-repellent property to an aqueous solution containing salt such as a buffer solution. When a buffer solution is employed, therefore, a layer consisting of a water-repellent substance should be formed around the silicon substrate. The water-repellent layer may be composed of organic resin, for example, and polyimide resin is one of the materials which can most conveniently form the water-repellent layer. When a water-repellent layer consisting of polyimide is prepared, the substrate is coated with photosensitive or non-photosensitive polyimide resin and the resin is hardened, and then unnecessary parts may be removed by etching or development to obtain a desired pattern.

While the thickness of the water-repellent layer employed in the present invention may not be functionally limited in particular, that of a thickness in the range of 0.1 to 100 $\mu$m is relatively easy to prepare. Various materials may also be employed for this layer so far as the same exhibit water repellence and are chemically stable in the solution.

Figure 8:
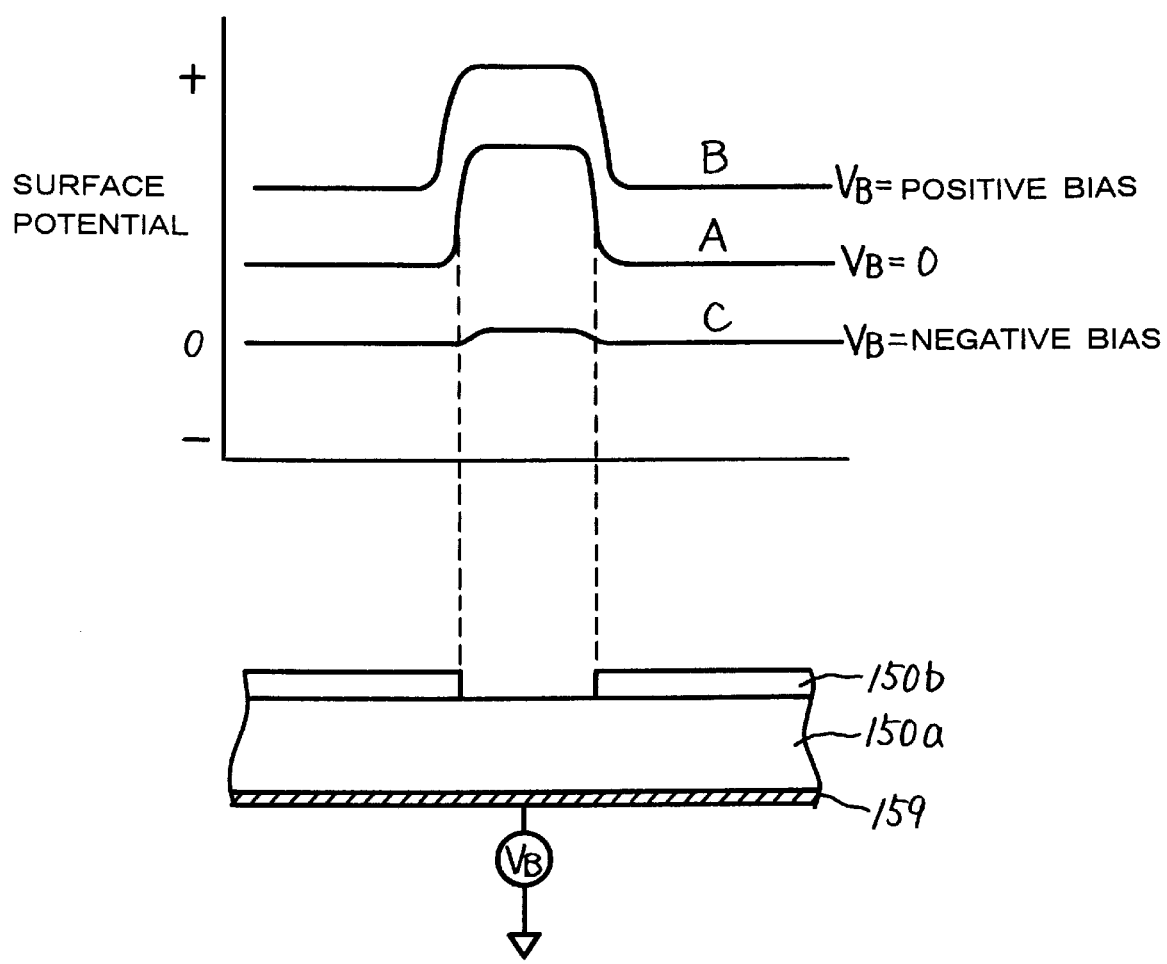
FIG. 8 is a schematic diagram showing a surface potential generated when a bias charge is applied to the apparatus for crystal growth.
Figure 9:
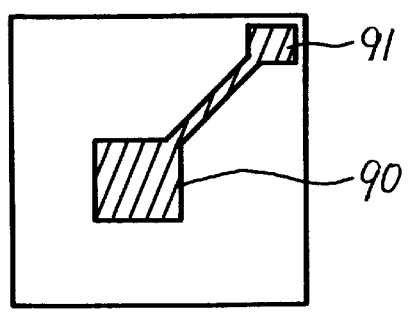
FIG. 9 is a plan view showing an example of arrangement of the electrode provided on the rear surface of the substrate in the apparatus for crystal growth according to the present invention.

In the apparatus according to the present invention, the distribution of the surface potential can be controlled by applying a voltage to the substrate. Referring to FIG. 8, principle of function in the case of applying a bias voltage to a substrate forming the apparatus according to the present invention is now described. In the substrate shown in the figure, a second silicon layer 150*b* is formed on a first silicon layer 150*a*. In the part where a solution is stored, no second silicon layer is formed but the first silicon layer is exposed. An electrode layer 159 is formed on the rear side of the first silicon layer 150*a*, so that the bias voltage can be applied. High-resistance silicon ($N^-$ silicon) may be employed as the first silicon, for example, and low-resistance silicon ($N^+$ silicon) may be employed as the second silicon. In this case, the distribution of the surface potential on the silicon surface will be represented by a chart as shown by A when no bias voltage is applied. When a positive bias voltage is applied to the substrate, the distribution of the surface potential shifts to the positive direction, and the potential increases as a whole (refer to a chart B). When a negative bias voltage is applied, on the other hand, the silicon surface will be electrically ohmic to the solution, so that the distribution of the surface potential will be substantially flattened and the potential will be substantially zero as a whole (chart C). Thus, the potential distribution on the silicon substrate surface can be arbitrarily changed by applying a voltage. Aggregation and crystallization of a macromolecule on the device surface can be more actively controlled by control of the surface potential by voltage application. The electrode for applying the voltage may be provided on the overall rear surface of the substrate, while the same may be formed only on the part which is adapted for crystal growth. As shown in FIG. 9, for example, an electrode 90 may be formed on the part corresponding to the solution storage part for crystal growth and a voltage may be applied through a pad 91.

Figure 10A:
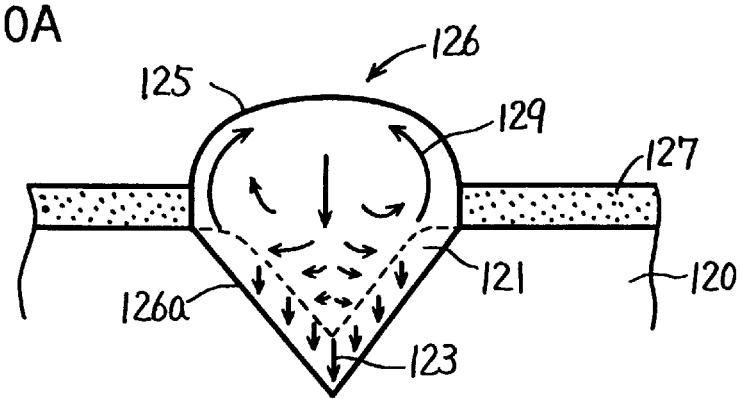
FIG. 10A to FIG. 10C are schematic sectional views for illustrating functions/effects of the grooves formed in the apparatus for crystal growth.
Figure 10B:
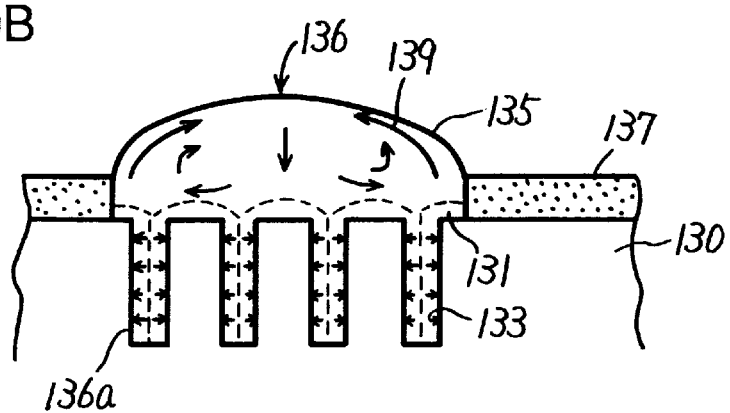
Figure 10C:
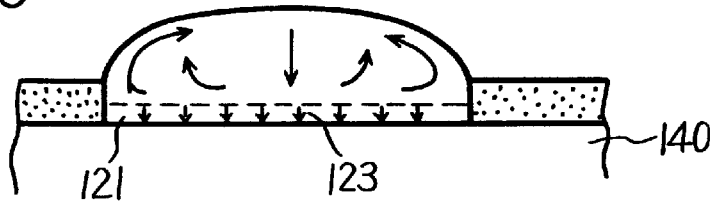

In the present invention, forming a groove in the solution storage part for crystal growth can suppress influence of convection so that crystal growth can take place more stably. FIG. 10A to FIG. 10C are adapted to illustrate the effects of the groove. It is expectable that the range where electrostatic interaction between the dissociating macromolecules in the solution and the substrate surface is exerted (the range may be considered as the width of an electric double layer) is wider in the part with a groove formed by etching, for example, than in the part formed with no groove. As shown in FIG. 10A, for example, when a storage part 126 having a V-groove 126a formed on a silicon substrate 120 is allowed to hold a solution 125, it is expected that the regions where the interaction is exerted are overlapped and the width of the region is widened at the deepest portion of the V-groove 126a. In the figure, a region 121 where the electrostatic interaction is exerted is represented by dotted lines. At the central portion of the V-groove, therefore, a crystal nucleus or a molecular aggregate to be a crystal nucleus can substantially isotropically receive electrostatic attraction from the V-groove surface, and can be more strongly restrained in the space of the V-groove. At an upper portion of the solution 125, convection 129 is generated due to influence of gravity and the like. In the V-groove, on the other hand, the molecules are restrained by the electrostatic attraction, so that influence of the convection is suppressed. Therefore, it is expectable that a crystal nucleus is stably formed and crystal growth takes place stably in the V-groove. This is also considered applicable to a storage part 136 formed with trenches as shown in FIG. 10B. In trenches 136a formed on a silicon substrate 130, it is expectable that regions 131 where electrostatic attraction is exerted are overlapped and influence of convection 139 generated at the upper portion of a solution 135 is not exerted to the deep portion of the trenches 136a. In the trenches 136a, it is expectable that the molecules to be crystallized are restrained by electrostatic attraction 133, and growth of the crystal stably progresses. In general, it is thought that fluctuation of the width of the diffusion supply layer in the vicinity of the crystal nucleus is caused by influence of convection in the solution so that degradation of crystallinity or reduction of growth rate takes place. Therefore, it is preferable to suppress the convection as strongly as possible.

It is conceivable that the molecules to be crystallized are relatively readily influenced by convection in the case of the structure shown in FIG. 10C. On the other hand, a region 121 where electrostatic attraction 123 is exerted is spatially homogeneous, and no gradient of an electric field is formed in the plane of a substrate 140. Therefore, conveniently, it is conceivable that the molecules can readily be two-dimensionally arrayed depending on the type of the molecules to be crystallized.

Figure 11:
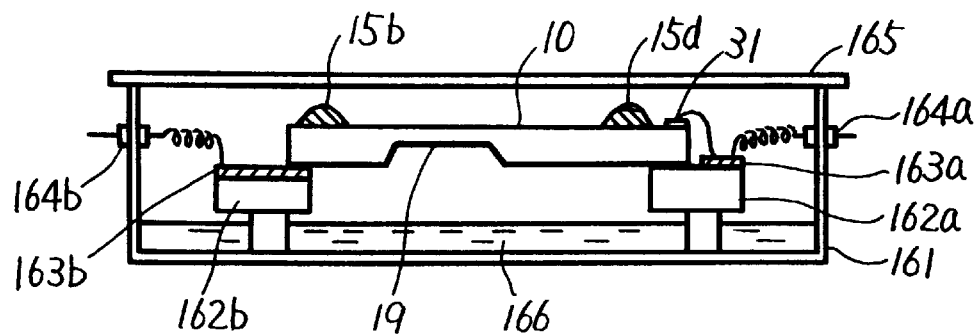
FIG. 11 is a schematic sectional view showing an example of the apparatus for crystal growth according to the present invention.

FIG. 11 shows an example of the apparatus for crystal growth. In the apparatus, a substrate 10 is placed on supports 162a and 162b in a container 161. An electrode 19 is formed on the rear surface of the substrate 10. An electrode 163b is formed also on the support 162b, so that a voltage can be applied to the electrode 19 through a terminal 164b. An electrode 163a is provided also on the support 162a, and the electrode 163a is electrically connected with a pad 31 which is formed on the substrate 10. Power is supplied to the pad 31 through a terminal 164a, so that the solution storage parts formed on the substrate 10 can be heated. A buffer solution 166 is stored on the bottom of the container 161, and its opening can be sealed with an upper lid 165. The substrate 10 is placed on the supports 162a and 162b in the container 161 which can prevent evaporation of the solution, and necessary solutions such as solutions 15b, 15d and the like are dropped onto the substrate 10. The substrate 10 may be directed either upward or downward. After adding the buffer solution 166 or the like to the bottom of the container 161, the opening part may be sealed with the upper lid 165 for starting crystallization. In starting of the crystallization, a current may be supplied by the terminal 164a, for heating the solutions. Further, a bias voltage may be applied to the rear surface of the substrate 10 with the terminal 164b. The heating of the solutions and the application of the bias voltage may be continuously performed, or may be intermittently performed. The substrate 10 holding droplets is allowed to stand in this state, so that crystal growth can take place on a prescribed portion of the substrate.

According to another preferred mode of the present invention, a plurality of first solution storage parts for holding a plurality of types of solutions (e.g., a mother liquor, a precipitant, a buffer solution and the like) as droplets respectively, a second solution storage part for receiving the solutions discharged from the plurality of first solution storage parts and growing a target crystal, and a third solution storage part for receiving the solution discharged from the second solution storage part may be formed on the surface of a substrate forming the apparatus. In the apparatus, the solutions are fed from the first solution storage parts to the second solution storage part through a first passage. Further, the solution is fed from the second solution storage part to the third solution storage part through a second passage. The direction of the flow is a constant direction, and the backflow is suppressed. Mutual diffusion of at least two types of solutions is changed spatially and temporally by the passages, so that conditions suitable for crystallization can be regulated with good reproducibility in the second solution storage part where at least two solutions are mixed with each other. In general, there may be such a case that a reaction product is temporally and/or spatially maintained stable or preferable reaction conditions are attained by using a non-equilibrium open system (dissipative system) as a reaction system in chemical reaction. In the apparatus, the solutions are gradually discharged from the second solution storage part for crystal growth to the third solution storage part so that such a non-equiliblium open system is obtained. An excess part of the solution is preferably discharged from the second storage part through the second passage. The second solution storage part as an open system can contribute to keeping the concentration of the solution therein substantially constant, so that the conditions for crystal growth such as concentration, pH and the like can be maintained optimum for a long time.

In the apparatus according to the present invention, the solution may be selectively fed in a constant direction to obtain an open system. In order to feed the solution in the constant direction while suppressing a backflow, the first passage and/or the second passage may have a structure allowing the solution to gradually fall in the direction of gravity. For example, the first passage and/or the second passage may be a groove, which is formed on the substrate and has a stepwise shape or a gradient. Further, the first passage and/or the second passage may be formed of a plurality of grooves whose widths and depths differ from each other. The width of the groove is preferably widened as going from the upper stream to the lower stream. Further, the structure of a stepwise shape or having a gradient can be formed by deepening the grooves as going down the stream from the upper stream to the lower stream. In the apparatus of the present invention, capillarity in fine grooves may be employed as driving force for diffusion of the solutions. The direction of the flow of the solutions and the flow rates can be controlled by the aforementioned structure. The grooves may be prepared by working the substrate itself, or may be prepared by forming a film such as an oxide film on the substrate and working the film.

Furthermore, the supply amount of the solution may be changed by changing the size of the passage. The mixing ratio of the plurality of types of solutions can be controlled by changing the flow rates of the solutions supplied to the second solution storage part for performing crystallization. When the flow rate is adjusted for each of the passages, more various mixing ratios can be attained, and hence more conditions can be prepared for crystallization.

Further, means for heating the substrate or the stored solutions may be provided in the apparatus. Such means may be a heating electrode which is formed on the substrate, for example. The respective heated solutions are extruded to the passages by driving force of expansion of the volumes thereof. Additionally, the heated solutions readily flow since the viscosity is reduced. Therefore, transition of the solutions is facilitated by heating. When the substrate is partially heated with the heating means, a temperature gradient can be provided in the substrate. The temperature differs between the plurality of second solution storage parts depending on the temperature gradient. Solubility of the substance to be crystallized also varies with the solutions whose temperatures differ from each other. Therefore, more conditions for crystallization can be obtained in a single apparatus due to the temperature difference.

In the apparatus, further, a voltage may be applied to the substrate. The voltage may be applied through an electrode which is formed on a substrate surface opposite to the surface having the solution storage parts, for example. Such an electrode is preferably provided to be capable of applying the voltage at least to the second solution storage part. It is possible to increase or decrease electrostatic effect acting on the substrate surface by applying the bias voltage through the electrode. Crystal growth can be facilitated by increasing the surface potential of the substrate, for example, particularly in the second solution storage part. It is possible to improve selective reaction and aggregation of the molecules to be crystallized with respect to the substrate surface by application of the voltage. The operation principle of controlling the distribution of the surface potential by application of the voltage is as shown in FIG. 8, for example.

Furthermore, the effect of electrostatic attraction acting on the substrate for suppression of convection can be improved by forming a groove or hole in the second solution storage part by fine working. Particularly on the bottom of the groove formed on the substrate, electrostatic interaction can be substantially isotropically exerted on the molecules to be crystallized. When a crystal nucleus is formed on the bottom of the groove, the crystal nucleus can be allowed to stand still on the bottom of the groove by electrostatic interaction, so that the crystal nucleus can be protected against convection based on influence of gravity. When a crystal grows on the basis of a substantially standstill nucleus, it is expected that forming of excess microcrystals is suppressed and a large-sized crystal in which the molecules are regularly gathered on the surface of the crystal nucleus can be obtained. On the other hand, convection readily takes place in the crystallization part when the solution is supplied from the passage. Such convection can be suppressed by forming a groove around the second solution storage part. Namely, the convection can be generated mainly in the groove when the solution is supplied, so that the influence of the convection can be relaxed in the crystallization part.

Figure 12:
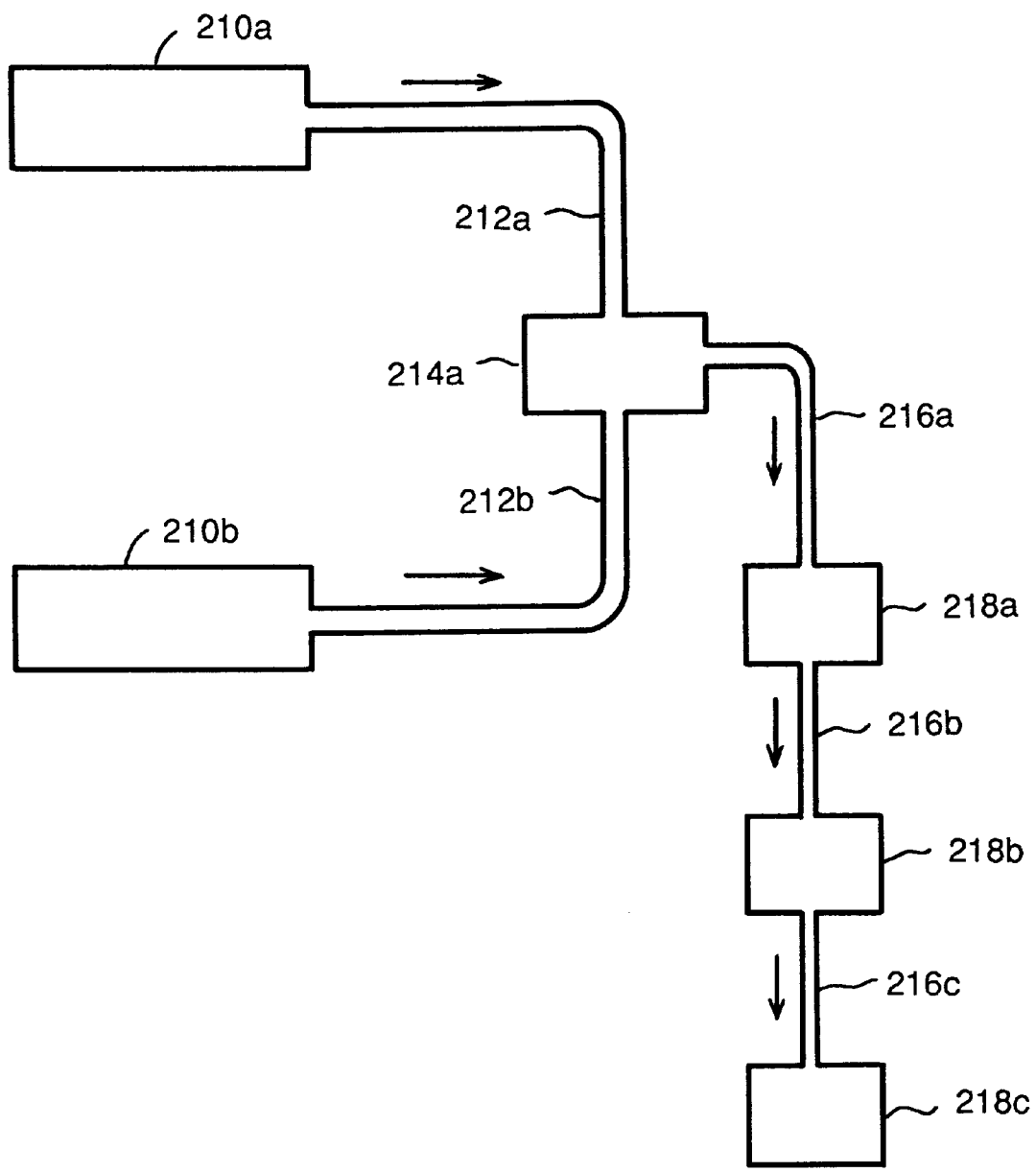
FIG. 12 is a schematic diagram showing another example of the apparatus for crystal growth according to the present invention.

FIG. 12 shows a further example of the arrangement of the solution storage parts and the passages in the apparatus according to the present invention. Solution cells 210a and 210b corresponding to the first solution storage parts, a reaction cell 214a corresponding to the second solution storage part and drain cells 218a, 218b and 218c corresponding to the third solution storage part are formed in proper positions of the surface of a substrate forming the apparatus. The solution cells 210a and 210b are connected with the reaction cell 214a through first passages 212a and 212b respectively. The reaction cell 214a and the drain cell 218a are connected with each other through a second passage 216a, and second passages 216b and 216c are provided between the drain cells 218a and 218b and between 218b and 218c. Solutions are allowed to flow along the direction of arrows. The number of the respective cells may be other than the number as shown in FIG. 12. For example, the number of the solution cells may be at least three, and that of the reaction cells may be at least two. On the other hand, the number of the drain cell may be one or two, or at least four. The passages may be provided depending on the number and arrangement of the reaction cells. For example, a mother liquor containing a macromolecule such as protein to be crystallized may be supplied fiom the solution cell 210a, and a solution for controlling conditions of crystallization such as a buffer solution may be supplied from the solution cell 210b. The reaction cell 214a receives these solutions, and prepares a mixed solution suitable for crystallization. When a molecular complex is to be formed, the reaction cell 214a may hold one molecular species to form the complex, the solution cell 210a may hold another molecular species, and the solution cell 210b may hold the solution for setting conditions. The reaction may be caused by supplying the solutions to the reaction cell 214a from the solution cells respectively.

Figure 13:
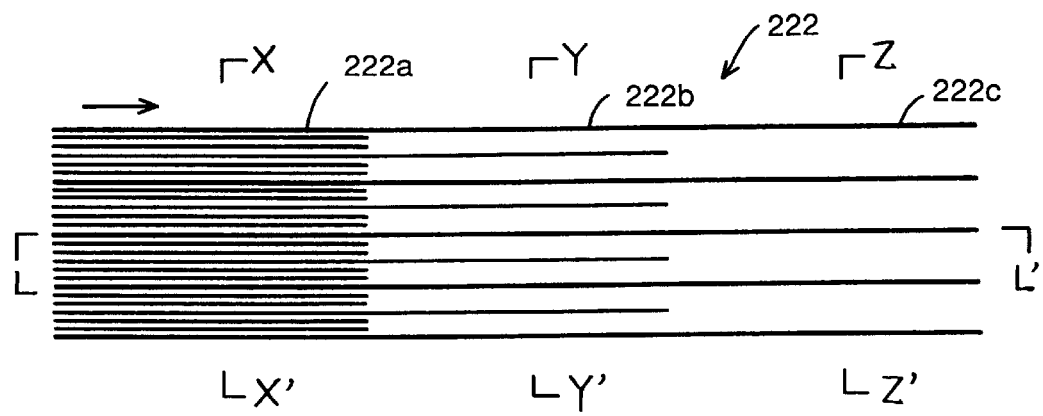
FIG. 13 is a plan view showing another example of the passage in the apparatus according to the present invention.
Figure 14:
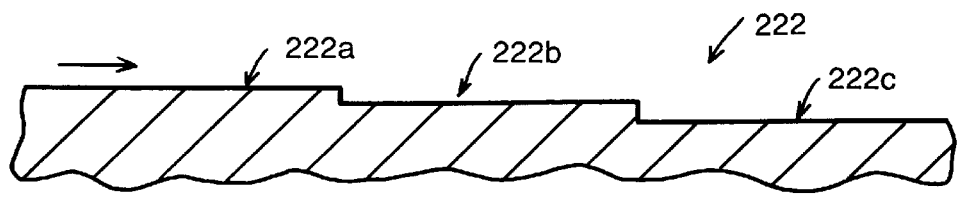
FIG. 14 is an L–L' sectional view of the passage shown in FIG. 13.
Figure 15A:
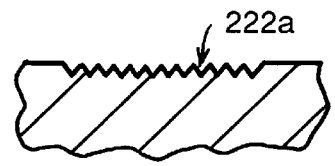
FIG. 15A to FIG. 15C are X–X', Y–Y' and Z–Z' sectional views of the passage shown in FIG. 13.
Figure 15B:
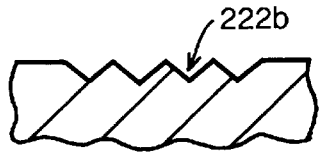
Figure 15C:
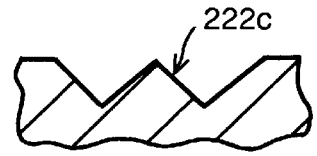

FIG. 13 shows an example of the passage. The passage shown in the figure is formed of a plurality of V-shaped grooves (V-grooves) on a substrate surface. FIG. 14 is an L—L' sectional view of FIG. 13, and FIG. 15A to FIG. 15C show an X–X' sectional view, a Y–Y' sectional view and a Z–Z' sectional view of FIG. 13 respectively. A passage 222 is formed of V-grooves 222a, 222b and 222c whose widths and depths differ from each other. Arrows show a direction where solutions are fed. The widths and depths of the V-grooves increase as going from the upper stream to the lower stream. Further, the density of the V-grooves reduces as going from the upper stream to the lower stream, while the width of the passage is constant. In such a structure, the passage 222 has a stepwise shape with the V-groove parts 222a, 222b and 222c as shown in FIG. 14. In the passage having such a structure, it comes to that the solutions progress in the direction of the arrows by capillarity, while a backflow of the solutions is prevented.

While FIG. 13 shows a passage formed of V-grooves on the surface of the substrate, the shape of the grooves is not restricted to this shape. For example, grooves of another shape such as U-shaped grooves may be formed. Further, the grooves may be formed in the substrate itself, or may be prepared by forming a film such as an insulating film on the substrate and then working the same.

Figure 16:
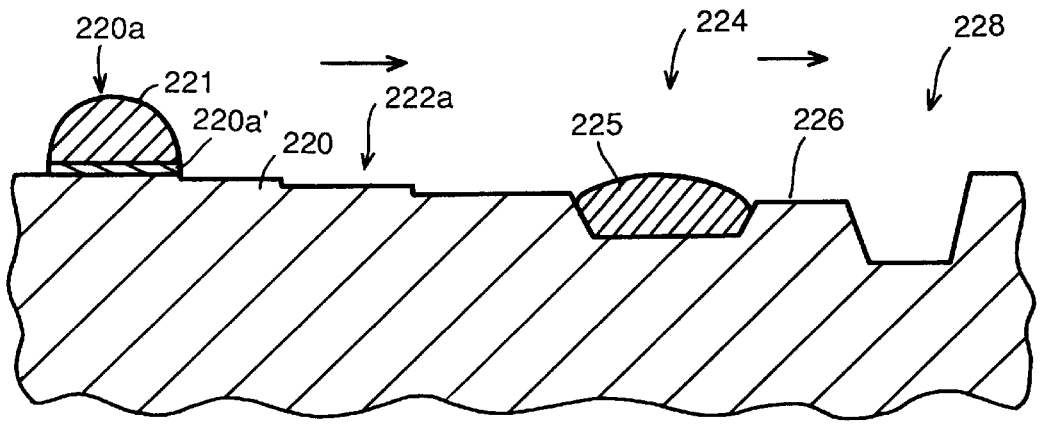
FIG. 16 is a schematic sectional view showing arrangement of the solution holding parts and the passages in the apparatus for crystal growth according to the present invention.

FIG. 16 shows examples of the solution holding parts and passages formed on a substrate. On a substrate 220 consisting of a silicon crystal, for example, a solution cell 220a corresponding to the first solution storage part, a reaction cell 224 corresponding to the second solution storage part and a drain cell 228 corresponding to the third solution storage part are arranged. The solution cell 220a may be a region surrounded with a film 220' a consisting of silicon oxide, for example. A droplet 221 of a solution such as a mother liquor or a buffer solution is held on a depressed region where no film 220' *a* is formed. The solution gradually diffuses to the reaction cell 225 through a first passage 222*a*. The first passage 222*a* may be a groove as shown in FIGS. 13 to 15C, for example. On the other hand, the reaction cell 224 may be a groove or hole formed by etching the substrate surface. The solution gradually flows into this groove or hole, and the volume of the solution held in the reaction cell 224 increases. Between the reaction cell 224 and the drain cell 228, a second passage 226 is so formed that the solution overflowing the reaction cell 224 flows into the drain cell 228. The drain cell 228 is preferably formed of a groove or hole that is deeper than the reaction cell 224, for example. Plural types of solutions are supplied to the reaction cell 224 from a plurality of solution cells, so that a mixed solution is prepared. The mother liquor containing a molecular species to be crystallized is diluted with other solutions in the reaction cell 224. In a droplet 225 containing the mother liquor, an excess part comes to flow into the drain cell 228 from the reaction cell 224 through the second passage 226. Due to this flow, the volume of the solution in the reaction cell 224 is kept substantially constant, while the mother liquor can be prevented from reaching an equilibrium state diluted to the limit. Namely, it is possible to obtain a prescribed dilution ratio in the reaction cell 224 by valance of inflow of the liquids.

Figure 17:
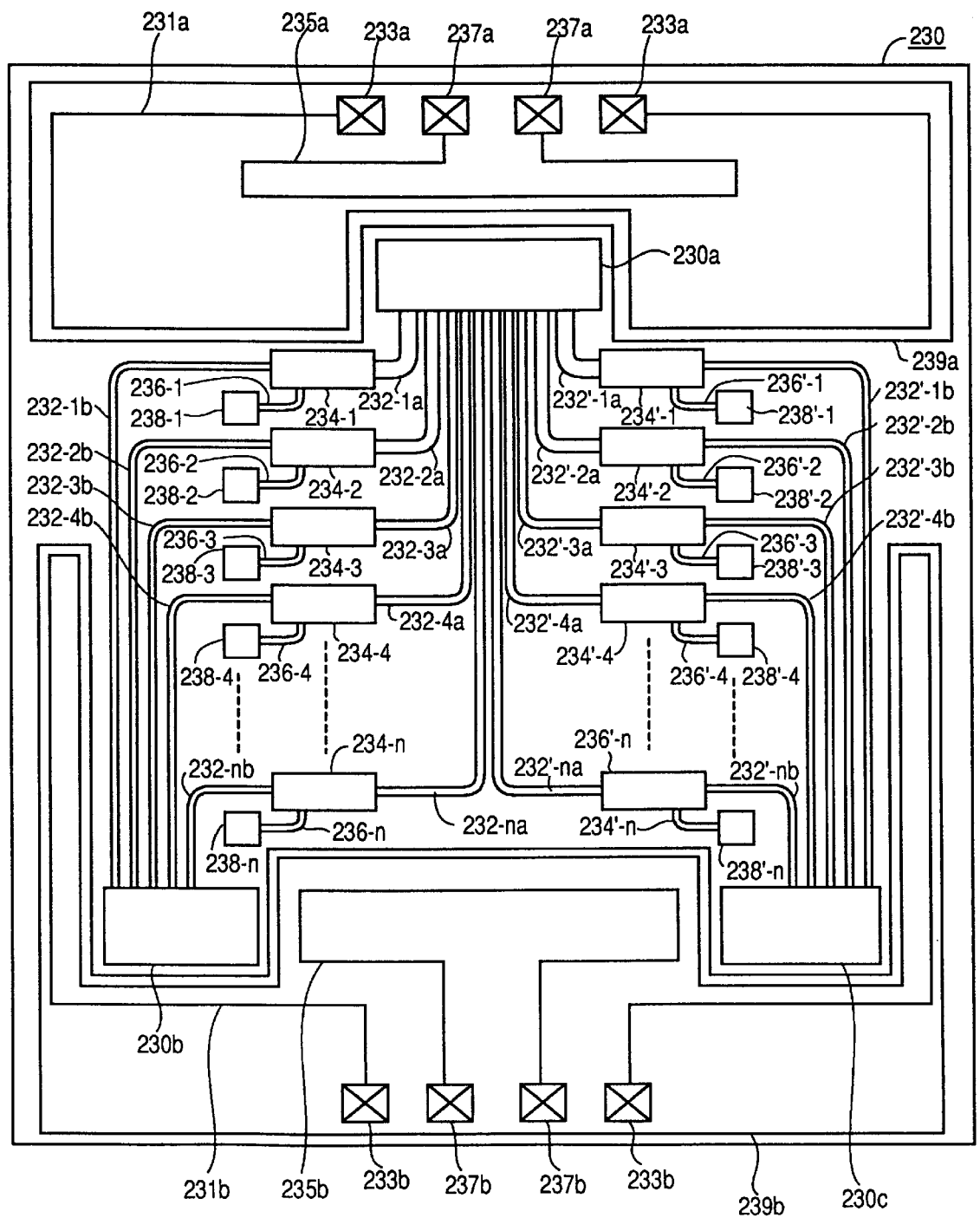
FIG. 17 is a schematic diagram showing another example of the apparatus for crystal growth according to the present invention.

FIG. 17 shows another example of the apparatus according to the present invention. Solution cells 230*a*, 230*b* and 230c are arranged on a substrate 230 at proper spaces. Reaction cells 234-1, 234-2, 234-3, 234-4 234-*n* are provided to receive solutions supplied from the solution cells 230*a* and 230*b* respectively. On the other hand, reaction cells 234'-1, 234'-2, 234'-3, 234'-4 . . . 234'-*n* are provided to receive solutions supplied from the solution cells 230*a* and 230*c* respectively. First passages 232-1*a* to 232-*na* and 232'-1*a* to 232'-*na* extend from the solution cell 230*a* to the respective reaction cells. First passages 232-1*b* to 232-*nb* extend from the solution cell 230*b* to the respective reaction cells, and first passages 232'-1*b* to 232'*nb* extend from the solution cell 230*c* to the respective reaction cells. The first passages whose lengths and widths differ from each other are connected with the plurality of reaction cells respectively as shown in the figure, so that the flow rates of the solutions flowing into the respective reaction cells from the solution cells are different from each other. Therefore, mixed solutions of different concentrations are obtained in the respective reaction cells. Further, drain cells 238-1 to 238-*n* and 238'-1 to 238'-*n* are provided on the substrate corresponding to the respective reaction cells. These drain cells are connected with the respective reaction cells by second passages 236-1 to 236-*n* and 236'-1 to 236'-*n* respectively.

Further, heating electrodes 231*a* and 231*b* and temperature measuring electrodes 235*a* and 235*b* are formed on the substrate 230 in prescribed patterns. Power is supplied to the heating electrodes 231*a* and 231*b* through terminals 233*a* and 233*b* which are formed on the substrate 230. The temperature measuring electrodes 235*a* and 235*b* are connected with terminals 237*a* and 237*b* formed on the substrate 230 respectively. These electrodes and terminals can be readily prepared by previously forming insulating films 239*a* and 239*b* consisting of silicon oxide, for example, on the substrate in prescribed patterns and forming a pattern of a thin chromium film, for example, thereon. The substrate may be heated by energizing the heating electrodes 231*a* and 231*b*.

Figure 18A:
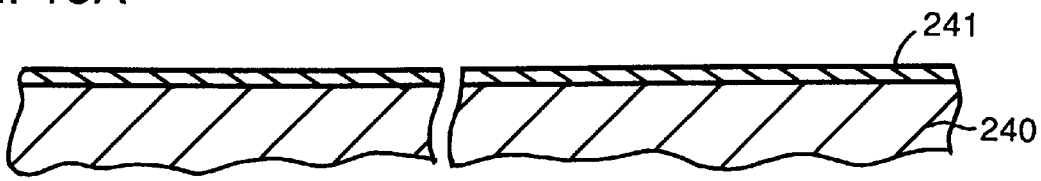
FIG. 18A to FIG. 18D are schematic sectional views showing a process for forming the passages of the apparatus for crystal growth according to the present invention.
Figure 18B:
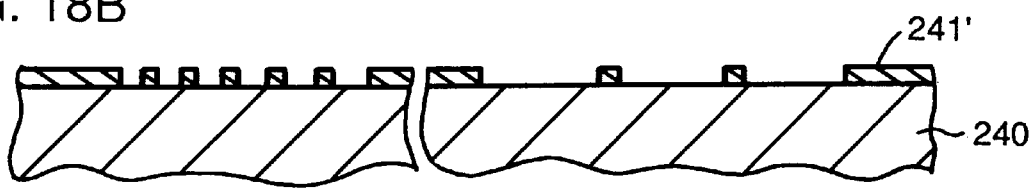
Figure 18C:
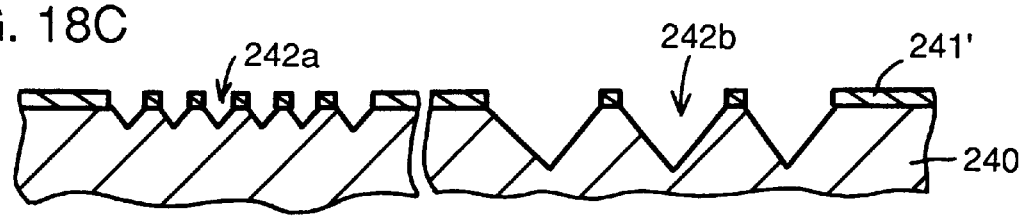
Figure 18D:
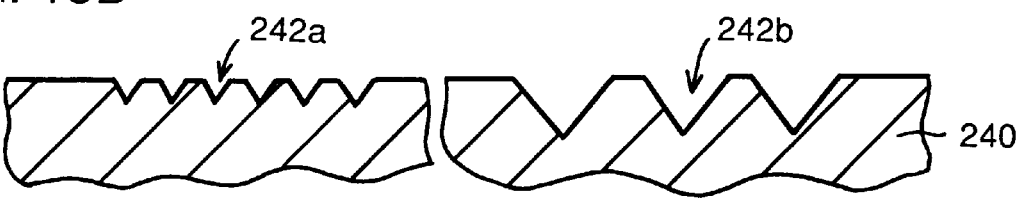

The structure of the apparatus according to the present invention as shown in the above can be obtained by a technique employed for a fabrication process of a semiconductor device. This technique includes thin film formation, patterned resist formation, photolithography, etching and the like. Particularly in the case of employing a silicon crystal as the substrate, various techniques established in the fabrication process of a semiconductor device can be readily applied. FIG. 18A to FIG. 18D show a process for forming the passages in the apparatus according to the present invention. When a silicon crystal is employed as the substrate, a silicon oxide ($SiO_2$) film 241 is first formed on a silicon substrate 240 (FIG. 18A). Then, the silicon oxide film is etched in a prescribed pattern 241' (FIG. 18B). When anisotropic etching is carried out on the exposed silicon surface, V-grooves 242*a* and 242*b* are obtained (FIG. 18C). Further, the silicon oxide film is optionally removed by etching (FIG. 18D). Such a process can result in passages formed of V-grooves.

The solution storage part may have various structures depending on the properties of the substances to be crystallized and the difficulty or easiness of crystallization. The surface of a silicon crystal generally has such an advantage that an excess of crystal nuclei is hardly generated on it since crystal defects and fixed charges are extremely small. Therefore, the intact surface of the silicon crystal may be used as the solution storage part for crystal growth. A silicon oxide film may be formed on the surface of the silicon crystal for improvement of hydrophilicity depending on the properties of the molecule to be crystallized such as protein.

Figure 19:
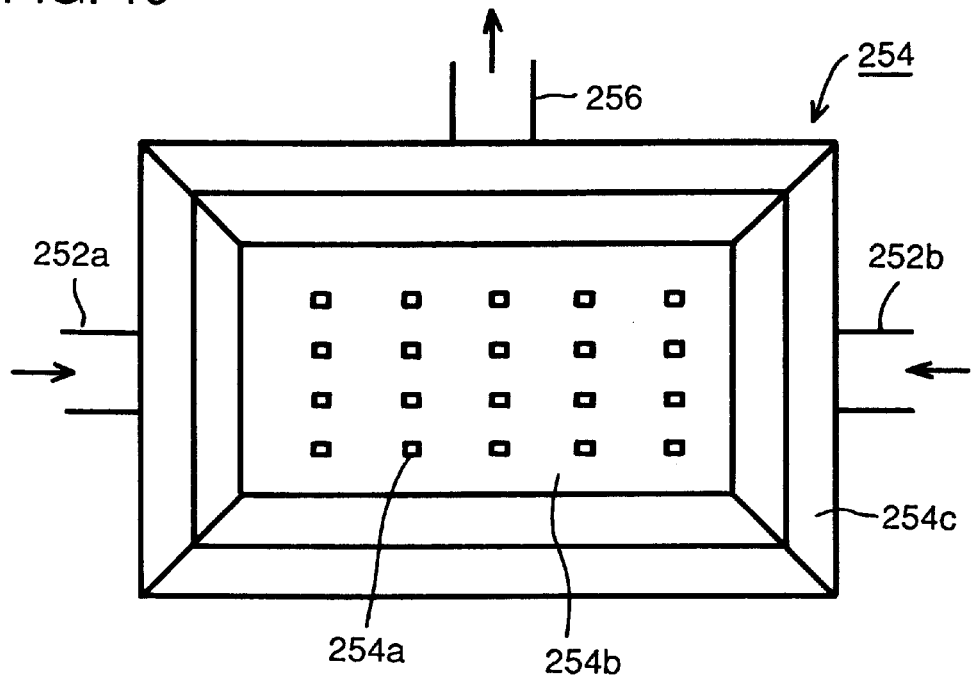
FIG. 19 is a plan view showing another example of the second solution storage part in the apparatus for crystal growth according to the present invention.
Figure 20:
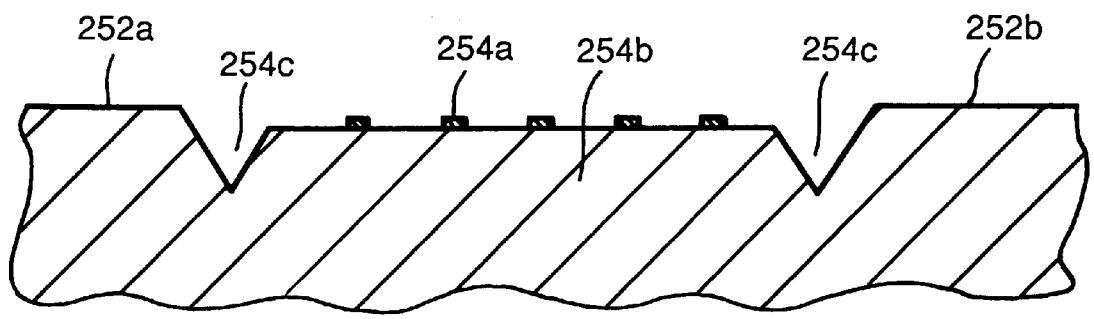
FIG. 20 is a schematic sectional view of the solution storage part shown in FIG. 19.
Figure 21:
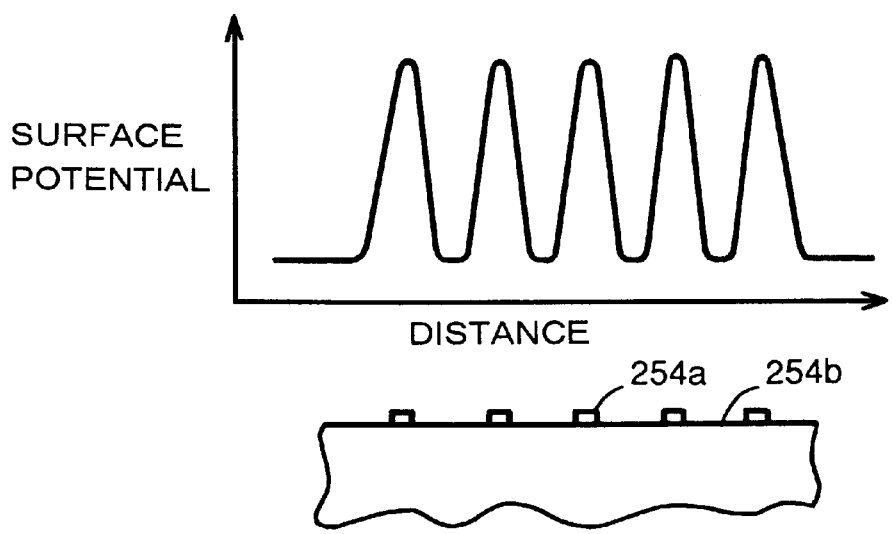
FIG. 21 is a schematic diagram showing the surface potential of the solution storage part shown in FIG. 19.

Examples for accelerating and suppressing formation of crystal nuclei are further shown. When the molecule to be crystallized has negative effective surface charge in an electrolyte solution, for example, stacking a p-type silicon layer on an n-type silicon layer in a prescribed pattern can suppress deposition of a crystal onto an n-type silicon surface and can allow a crystal to selectively grow only on the p-type silicon layer formed in the prescribed pattern, as shown in FIG. 19 and FIG. 20. In a reaction cell 254 shown in FIGS. 19 and 20, a plurality of islands 254*a* consisting of a p-type silicon layer are arranged on an n-type silicon layer 254*b* at prescribed spaces. By forming the islands of the p-type silicon layer on the n-type silicon layer, it is expected that the surface potential may be generated by space charges of these layers as shown in FIG. 21, for example. Thus, it is conceivable that a crystal nucleus is secondarily formed depending on the distribution of the surface potential. By forming such a portion suitable for crystallization at a specific region of the reaction cell by valence electron control, a crystal which is excellent in crystallinity and has a large size can be grown at the specific region while suppressing excessive formation of crystal nuclei or growth of twins. Such a structure allows the position for depositing the crystal to be controlled.

Figure 22:
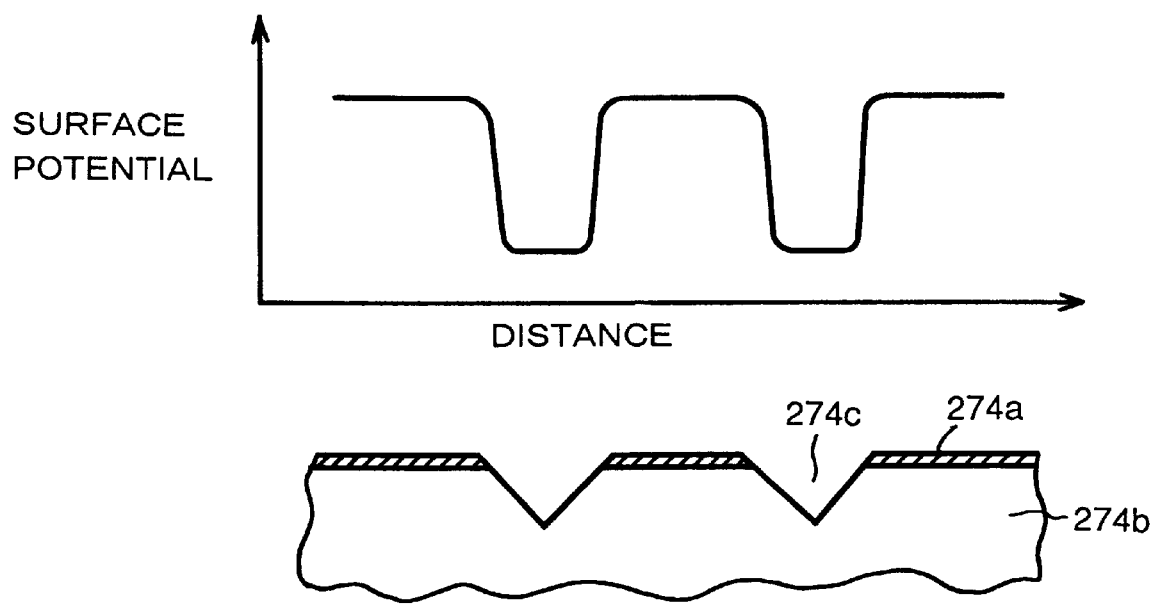
FIG. 22 is a schematic diagram showing another example of the solution storage part for crystallization.

The formation of the regions whose resistance values and/or types of impurity elements spatially differ from each other can be readily attained by selectively doping a substrate consisting of a silicon crystal or the like with impurities. As another method, etching the surface of a substrate consisting of a silicon crystal or the like may expose silicon surfaces whose resistance values differ from each other. FIG. 22 shows an example of etching the surface of a substrate. After entirely forming a p-type silicon layer on an n-type silicon layer 274*b*, grooves 274*c* are formed by etching, and islands 274*a* of the p-type silicon layer are obtained. The surface potential in the substrate of such a structure is as shown in FIG. 22. The surface potential lowers in the portions where the n-type silicon layer 274*b* is exposed by etching.

Figure 23A:
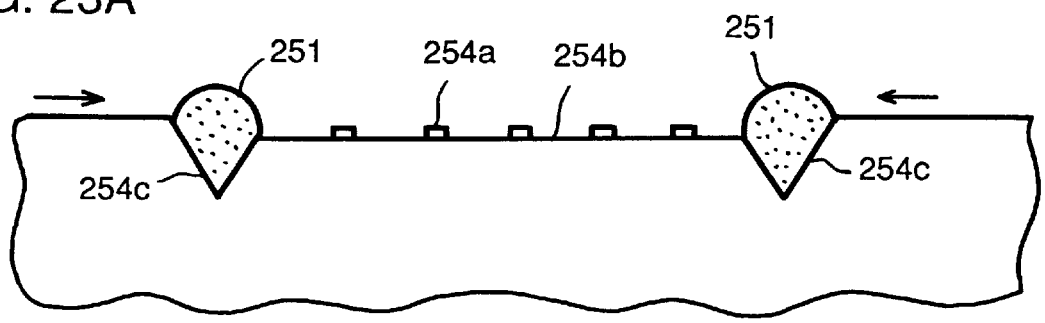
FIG. 23A to FIG. 23C are schematic sectional views for illustrating such a state that solutions are held in the solution storage part for crystallization.
Figure 23B:
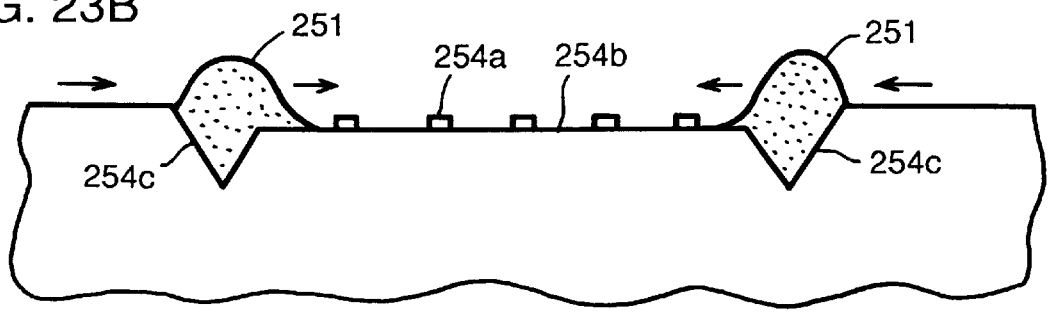
Figure 23C:
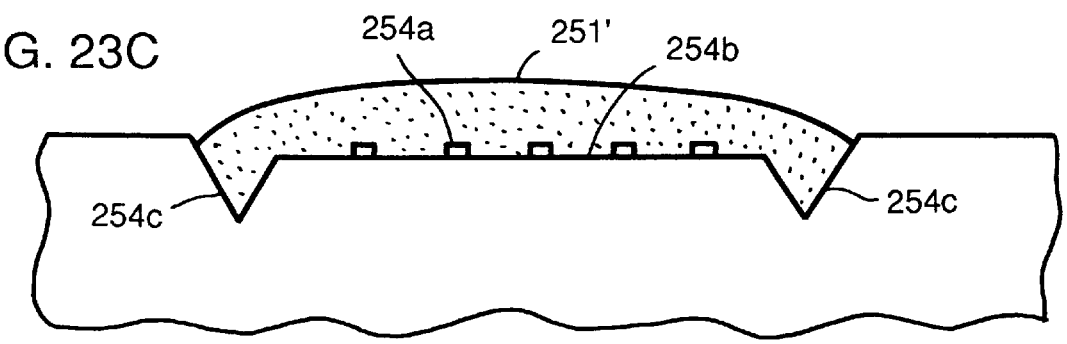

In the apparatus shown in FIGS. 19 and 20, V-groove 254c is also formed around the reaction cell 254. The groove may be properly formed depending on the object of crystallization. Solutions supplied from passages 252a and 252b are temporarily stored in the groove 254c, and then supplied into the depression having the islands of the p-type silicon layer. The solution is also fed from a passage 256 to a drain cell through the groove 254c. FIG. 23A to FIG. 23C are adapted to illustrate the role of the groove part formed in the reaction cell. When starting crystallization, mother liquor containing a macromolecule is supplied to the groove 254c, and held a droplet 251 by surface tension (FIG. 23A). Formation of a crystal is suppressed in this state. This is because the surface of the substrate coming into contact with the droplet suppresses formation of a crystal by the valence electron control. Then, the volume of the droplet 251 is increased as the solution is supplied through the passage as shown in FIG. 23B, and the solution soon comes to move to the flat part in the reaction cell 254 including the islands of the p-type silicon layer. Finally as shown in FIG. 23C, a solution 251' covers the overall flat part, and crystallization is facilitated on any island 254b of the p-type silicon layer. Thus forming the V-groove around the mother liquor for crystallization can be expected to suppress convection in the region for bringing out crystallization. Namely, it is conceivable that convection mainly takes place in the V-groove when the solution is supplied and the convection is relaxed in the flat part performing crystallization.

In the apparatus according to the present invention, a plurality of grooves or a plurality of islands to which impurity element is added may be formed on the surface of the reaction cell serving as the second solution storage part, as above described. Grooves or islands of plural sizes may be formed on one reaction cell. The sizes and depths of the grooves formed on the substrate surface and the sizes of the islands are desirably changed properly depending on the type of the macromolecule to be crystallized. In general, the width of the groove or island may be in the range of 0.01 to 100 $\mu$m. The length of the groove may be in the range of 0.1 to 10 mm, for example. Further, plural grooves or islands may be formed at a space in the range of 1 $\mu$m to 1 mm By forming a large number of islands and grooves whose sizes differ from each other, a possibility of providing a more preferable region for crystallization can be increased. The depth of the groove may also be adjusted in the range of 0.01 to 200 $\mu$m. While these size ranges are preferable mainly in terms of the process of the apparatus, sizes in other ranges exert no decisive bad influence on the performance of the apparatus, i.e., crystallization.

The size of the reaction cell as the second solution storage part formed on the substrate surface should be decided depending on the amount of the employed solution. The size of the reaction cell is preferably about 0.1 to 10 mm square in general. When the reaction cell having a hole or depression is formed by etching the substrate surface, the depth of the hole or depression is preferably in the range of about 0.01 to 500 $\mu$m.

The passages may be formed by etching the substrate itself or etching a film such as an oxide film formed on the substrate surface. The width of the groove may be in the range of 0.01 to 10000 $\mu$m, for example. The length of the groove is preferably formed in the range of 0.1 to 100 mm. Further, plural grooves are preferably formed at a space in the range of 0.01 to 10000 $\mu$m. The depth of the groove is preferably adjusted in the range of 0.01 to 200 $\mu$m. The passage may be formed of a plurality of the grooves having the sizes in these ranges respectively. The whole width of the passage formed of the plurality of grooves may be in the range of 1 $\mu$m to 10 mm.

Additionally, a water-repellent layer is preferably formed on the surface of the solid-state component such as a silicon substrate to surround the solution storage parts and the passages. This layer can effectively prevent a solution from flowing out to the periphery when the solution is held. While a silicon surface obtained by removing the oxide film, for example, is generally water-repellent to pure water or water containing only acid or alkali, the same has decreased water-repellent property to an aqueous solution containing salt such as a buffer solution. When a buffer solution is employed, therefore, a layer consisting of a water-repellent substance should be formed around the silicon substrate. The water-repellant layer may be composed of organic resin, for example, and polyimide resin is one of the materials that can most conveniently form the water-repellent layer. When a water-repellent layer consisting of polyimide is prepared, the substrate is coated with photosensitive or nonphotosensitive polyimide resin and the resin is hardened, and then unnecessary parts may be removed by etching or development to obtain a desired pattern.

While the thickness of the water-repellent layer employed in the present invention may not be functionally limited in particular, that of a thickness in the range of 0.1 to 100 $\mu$m is relatively easy to prepare. Various materials may also be employed for this layer so far as the same exhibit water repellence and are chemically stable in the solution.

According to still another preferred mode of the present invention, a first solution storage part for holding a solution (e.g., a mother liquor, a precipitant, a buffer solution or the like) employed for crystal growth as a droplet, a second solution storage part for receiving the solution discharged from the first solution storage part and growing a target crystal, and a third solution storage part for receiving the solution from the second solution storage part may be formed on the surface of a substrate. In order to hold plural types of solutions independently, a plurality of the first solution storage parts are preferably provided. The first solution storage part is connected with the second solution storage part through a passage provided on the surface of the substrate. The solution employed for crystal growth is fed from the first storage parts to the second storage part by this passage. When a plurality of the second solution storage parts are provided, a plurality of passages are provided for feeding the solutions from each of the first solution storage parts to the second solution storage parts. In this apparatus, the second solution storage part is provided on the front surface of the substrate, and the third solution storage part is provided on the rear surface of the substrate. The second solution storage part and the third solution storage part are connected with each other by a through hole passing through the substrate. The three solution storage parts are connected through the passage and the through hole, so that mutual diffusion of the solutions held in the respective storage parts can be spatially and temporally changed to bring conditions suitable for crystallization particularly in the second solution storage part and/or the third solution storage part in good reproducibility. Generally, in chemical reaction, the chemical reaction may be temporally andior spatially maintained stable or preferred reaction conditions may be attained by rendering the reaction system a nonlinear and non-equilibrium open system (dissipative system). Further, delicate reaction conditions similar to those inside organisms may be attained by such an open system. In order to artificially implement such a non-equilibrium open system, the present invention connects the second solution storage part formed on the front surface of the substrate with the third solution storage part formed on the rear surface of the substrate by the through hole to allow liquid to move between these storage parts. Such a structure gives a non-equilibrium system in which movement of substances mutually takes place between the two storage parts, as described later.

A plurality of the second solution storage parts may be provided in this apparatus. A plurality of passages for carrying solutions are connected to these second solution storage parts respectively. Among these passages, a passage toward one of the second solution storage parts may have a length and/or a depth different from that of a passage toward another one of the second solution storage parts. Further, their depths may be varied at need. Thus, the flow rates of the solutions fed by the respective passages come to differ from each other. Between the plurality of second solution storage parts, the flow rates of the received solutions come to differ from each other. Therefore, different liquid mixtures in which at least two types of solutions are mixed with each other in different ratios can be prepared in the plurality of second solution storage parts.

In this apparatus, capillarity in fine grooves and a fine through hole can be a driving force for diffusion of the solutions between the solution storage parts. For example, the passages for passing the solutions may be formed of a plurality of fine grooves. The grooves may be formed by working the substrate itself by etching or the like, or may be formed by working a film provided on the substrate by etching or the like. In order to structure the passages, it is preferable to form a plurality of grooves whose widths and/or depths differ from each other and to widen the widths of the grooves as going from the upper stream to the lower stream. Further, it is possible to form a structure of a stepwise shape or having a gradient by deepening the grooves as going from the upper stream to the lower stream. The widths and/or the depths of the grooves may be continuously changed, or may be changed in a stepwise manner. Changing the widths and/or the depths of the grooves as going from the upper stream to the lower stream allows the direction and rate of the solution flow to be controlled.

Furthermore, the supply amount of the solution can be changed by changing the size of the passage. The mixing ratio between the plural types of solutions can be controlled by changing the flow rates of the solutions supplied to the second solution storage parts for performing crystallization. When the flow rate is adjusted for each of the plural passages, mixing ratios of more variety can be obtained, so that more conditions can be prepared for crystallization.

Further, means for heating the substrate or the stored solutions may be provided in the apparatus. Such means may be a heating electrode which is formed on the substrate, for example. The respective heated solutions are extruded to the passages by driving force of expansion of the volumes thereof. Additionally, the heated solutions readily flow since the viscosity is reduced. Therefore, transition of the solutions is facilitated by heating. When the substrate is partially heated with the heating means, a temperature gradient can be provided in the substrate. The temperature differs between the plurality of second solution storage parts depending on the temperature gradient. Solubility of the substance to be crystallized also varies with the solutions whose temperatures differ from each other. Therefore, more conditions for crystallization can be obtained in a single apparatus due to the temperature difference. Further, the solutions in the storage parts enter a thermodynamically non-equilibrium state by making the second solution storage part(s) and/or the third solution storage part(s) respectively have a temperature gradient. In this case, it is expected that further preferable reaction conditions are formed.

Furthermore, the effect of electrostatic attraction acting on the substrate for suppression of convection can be improved by forming a groove or hole in the second solution storage part by fine working. Particularly on the bottom of the groove formed on the substrate, electrostatic interaction can be substantially isotropically exerted on the molecules to be crystallized. When a crystal nucleus is formed on the bottom of the groove, the crystal nucleus can be allowed to stand still on the bottom of the groove by electrostatic interaction, so that the crystal nucleus can be protected against convection based on influence of gravity. When a crystal grows on the basis of a substantially standstill nucleus, it is expected that forming of excess microcrystals is suppressed and a large-sized crystal in which the molecules are regularly gathered on the surface of the crystal nucleus can be obtained. On the other hand, convection readily takes place in the crystallization part when the solution is supplied from the passage. Such convection can be suppressed by forming a groove around the second solution storage part. Namely, the convection can be generated mainly in the groove when the solution is supplied, so that the influence of the convection can be relaxed in the crystallization part.

Figure 24:
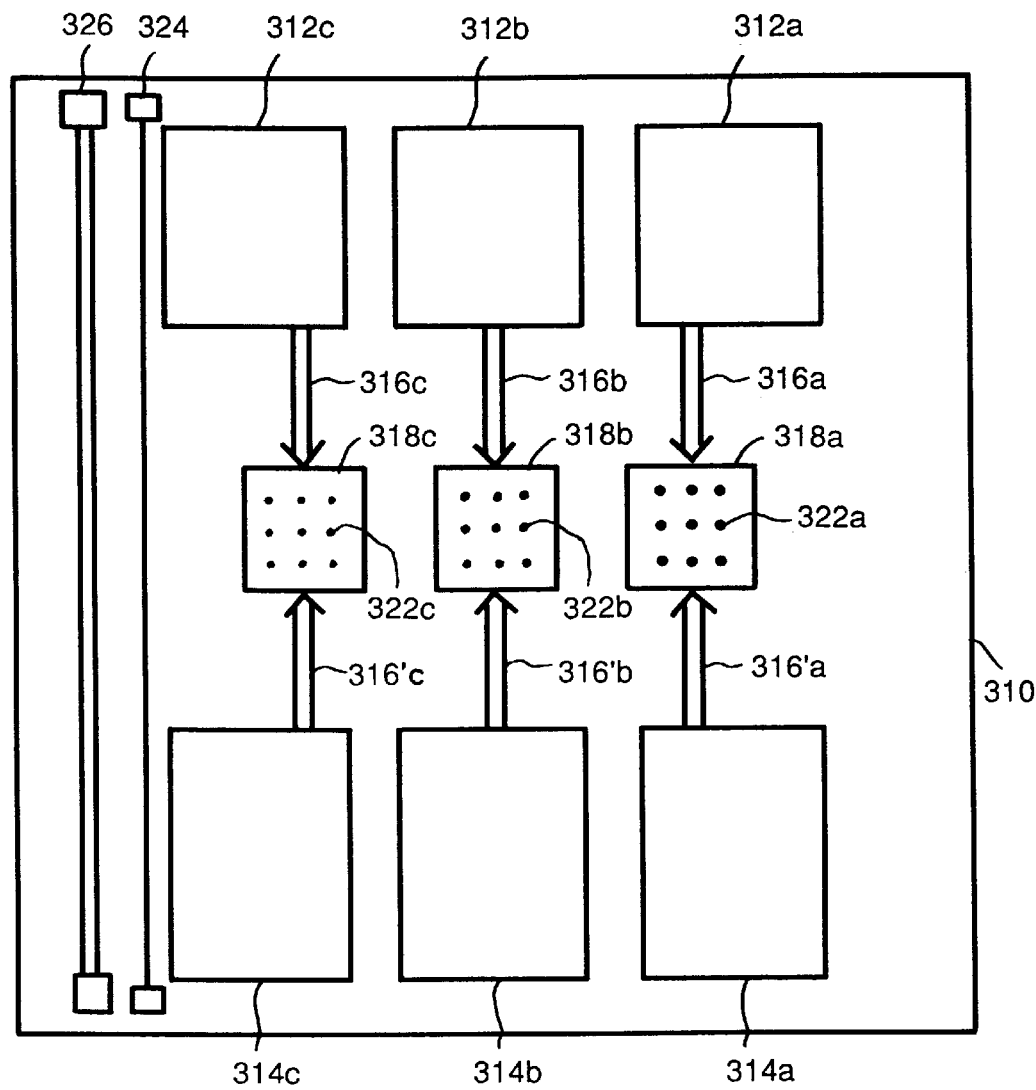
FIG. 24 is a schematic diagram showing a further example of the apparatus for crystal growth according to the present invention.
Figure 25:
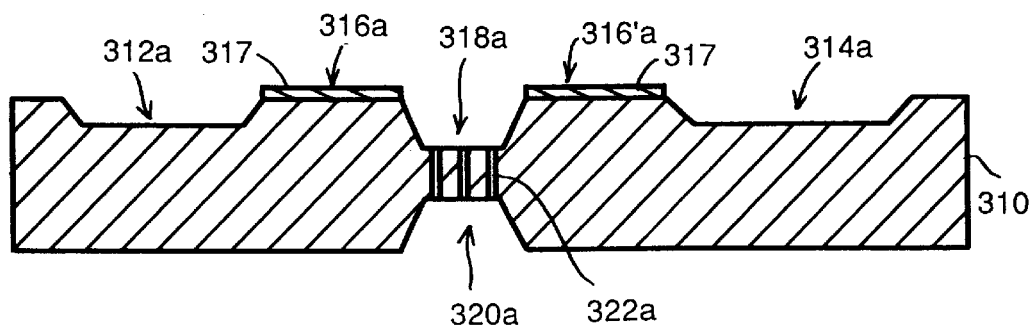
FIG. 25 is a sectional view showing an example of the apparatus having through holes according to the present invention.
Figure 26A:
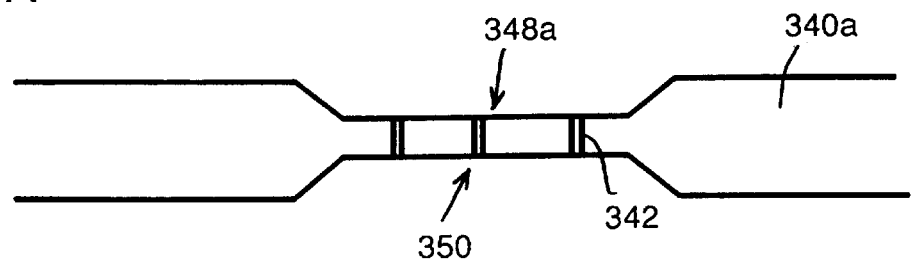
FIG. 26A to FIG. 26D are sectional views showing examples of the second solution storage part and third solution storage part in the apparatus having through holes according to the present invention.
Figure 26B:
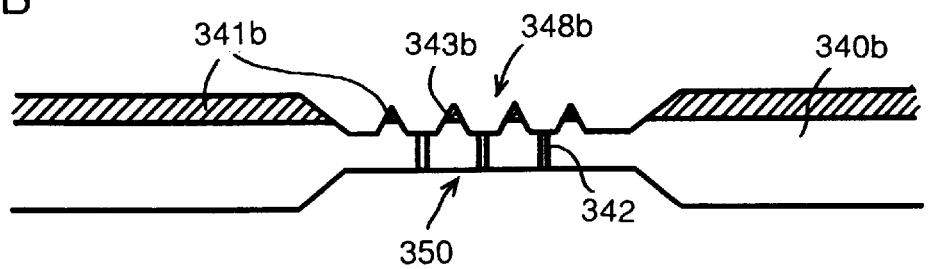
Figure 26C:
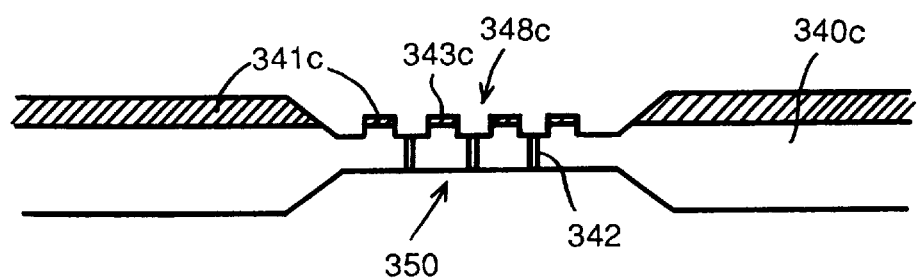
Figure 26D:
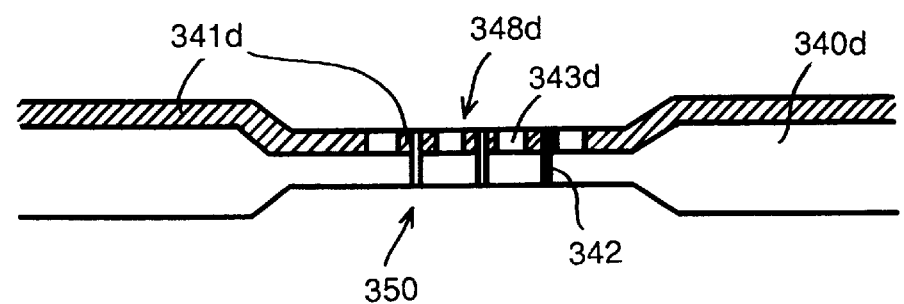

A further example of the apparatus according to the present invention is shown in FIG. 24 and FIG. 25. FIG. 24 schematically shows arrangement of respective solution storage parts, passages and electrodes. FIG. 25 is a sectional view showing the example of the apparatus structure. A plurality of solution cells 312*a*, 312*b*, 312*c*, 314*a*, 314*b* and 314*c* corresponding to the first solution storage part, and reaction cells 318*a*, 318*b* and 318*c* corresponding to the second solution storage part are formed on the surface of a substrate 310 forming the apparatus in proper positions. Passages 316*a*, 316*b*, 316*c*, 316'*a*, 316'*b* and 316'*c* are formed between these solution cells and reaction cells respectively. These passages enable movement of solutions from the solution cells to the reaction cells. As shown in FIG. 25, the solution cells and the reaction cells may be concave parts or holes formed on the substrate 310. Further, the passages may be formed by working a film 17 formed on the substrate 310. As shown in FIG. 25, a reaction cell 320*a* corresponding to the third solution storage part is formed at a position opposed to the reaction cell 318*a* on the rear surface of the substrate 310. The reaction cell 320*a* may also be a concave part or hole formed on the substrate 310. A plurality of through holes 322*a* are formed between the reaction cell 318*a* on the front surface and the reaction cell 320*a* on the rear surface. The through holes 322*a* enable mobilization of liquid between the front surface and the rear surface. Although illustration is omitted, reaction cells are similarly provided also at the positions opposed to the reaction cells 318*b* and 318*c* on the rear surface of the substrate 310 respectively, and the through holes 322*b* and 322*c* allow liquid to move between the reaction cells on the front surface and the reaction cells on the rear surface. No trouble arises even if the number of the cells are other than the number shown in FIG. 24. A heating electrode 326 and a temperature measurement electrode 324 are also provided at an end portion of the substrate 310, as shown in FIG. 24. In this apparatus, a mother liquor of macromolecule to be crystallized such as protein, for example, may be previously supplied to the reaction cells, so that solutions necessary for crystallization are supplied from the plurality of solution cells to the reaction cells. The solution cells 312*a* to 312*c* may also supply the mother liquor containing a macromolecule such as protein to be crystallized respectively, and the solution cells 314a to 314c may also supply a solution for controlling conditions of crystallization such as a buffer solution respectively. The reaction cells 318a to 318c receive these solutions respectively, and give mixed solutions suitable for crystallization. When a molecular complex is to be formed, the reaction cells 318a to 318c may hold one molecular species for forming the complex respectively, the solution cells 312a to 312c may hold another molecular species respectively, and the solution cells 314a to 314c may hold a solution for setting conditions respectively. Supplying the solutions from the solution cells to the reaction cells 318a to 318c respectively can cause reaction to prepare the molecular complex. Furthermore, the reaction cells on the rear surface may previously hold a solution and then the solution may be supplied from the respective solution cells to the reaction cells on the front surface through the passages. This operation can gradually give mutual diffusion between the solution held on the rear surface and the solution held on the front surface.

FIG. 26A to FIG. 26D show various structures of the reaction cells corresponding to the second solution storage part. The reaction cells shown in FIG. 26A have the most basic structure. A concave part or a hole is formed on the front surface of a substrate 340a for providing a reaction cell 348a. A concave part or a hole is also formed on the rear surface of the substrate 340a for providing a reaction cell 350. The reaction cell 348a and the reaction cell 350 are connected with each other by a plurality of through holes 342. In the structure shown in FIG. 26B, an impurity layer 341b is formed on the surface of a substrate 340b, and the portions from which the impurity layer 341b is removed and the portions on which the impurity layer 341b is left are arranged in a prescribed pattern at a reaction cell 348b of the front side. The portions 343b on which the impurity layer 341b is left have tapered shapes. The position where nucleation is facilitated can be controlled by arranging the impurity layer in a prescribed pattern in the reaction cell, as described later. In a reaction cell 348c shown in FIG. 26C, portions 43c on which an impurity layer 41c is left have trapezoidal shapes. A reaction cell 350 is similarly formed on the rear surface of a substrate 340c. In a reaction cell 348d shown in FIG. 26D, portions 343c have no impurity introduced are arranged in a prescribed pattern. The remaining portions are covered with an impurity layer 341d on the surface of a substrate 340d.

Figure 27:
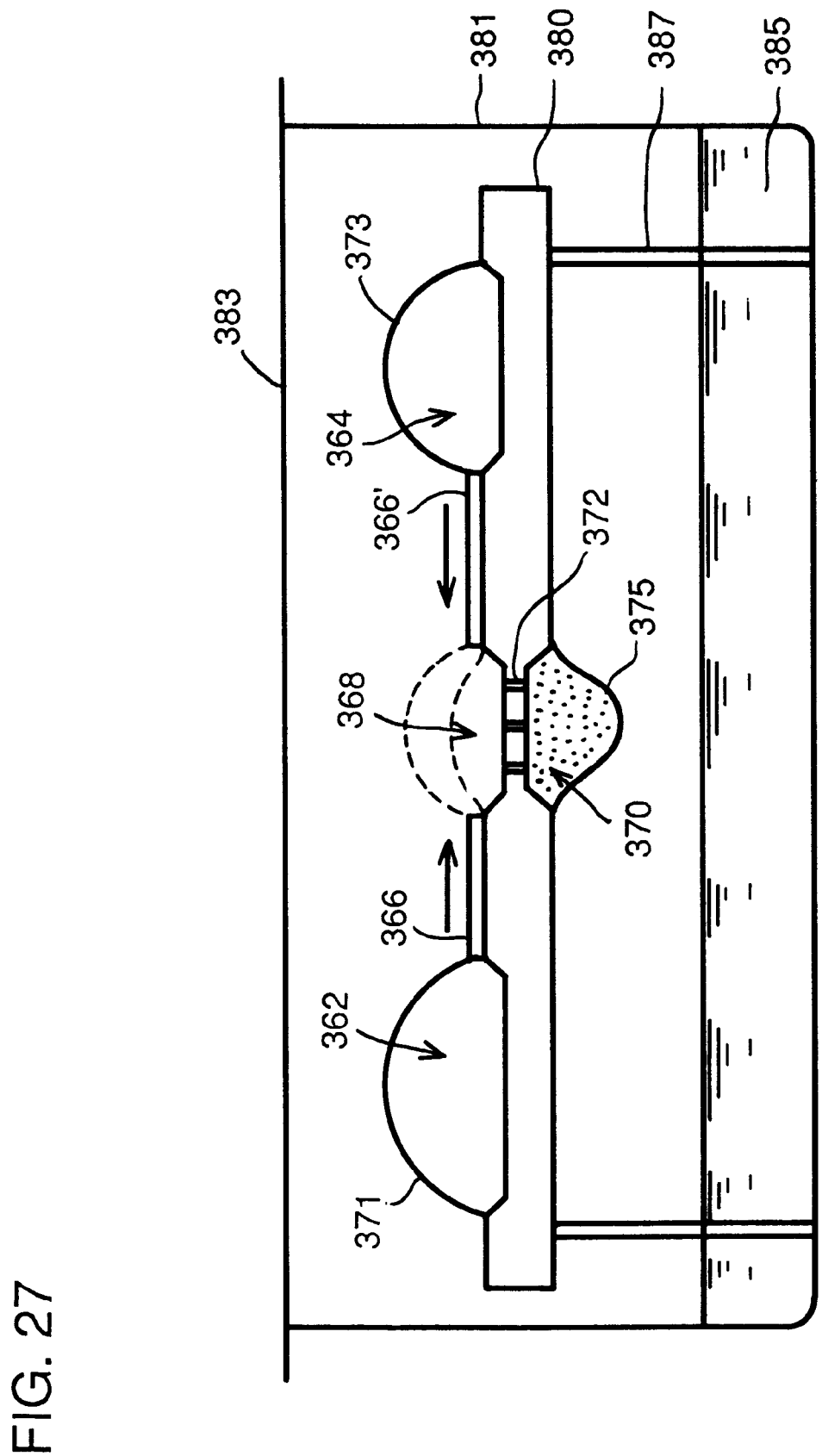
FIG. 27 is a schematic diagram showing a state of growing a crystal with the apparatus having through holes according to the present invention.

FIG. 27 schematically shows an exemplary use of the apparatus. The apparatus of the present invention consisting of a substrate 360 is supported by support legs 387 or the like, and stored in a container 381. A solution 385 such as a buffer solution is held on the bottom of the container 381, and the opening of the container 381 is closed with a lid 383 for preventing evaporation of the solution. Onto solution cells 362 and 364 of the substrate 360 horizontally held by the support legs 387, solutions such as a buffer solution for adjusting conditions of crystallization or a solution containing a substance to be crystallized such as protein are dropped. Parts of droplets 371 and 373 held in the solution cells 362 and 364 respectively come to flow into an upper reaction cell 368 formed on the upper surface of the substrate 360 through passages 366 and 366' respectively. The solutions flowing thereinto shift to a lower reaction cell 370 formed on the lower surface of the substrate via through holes 372. Thus, a droplet 375 hanging down in the direction of gravity is held in the lower reaction cell 370. The solution move by capillarity, to be held in the respective reaction cells. Desired crystallization and/or reaction can be carried out in the reaction cells while making such transition of the solution.

Figure 28A:
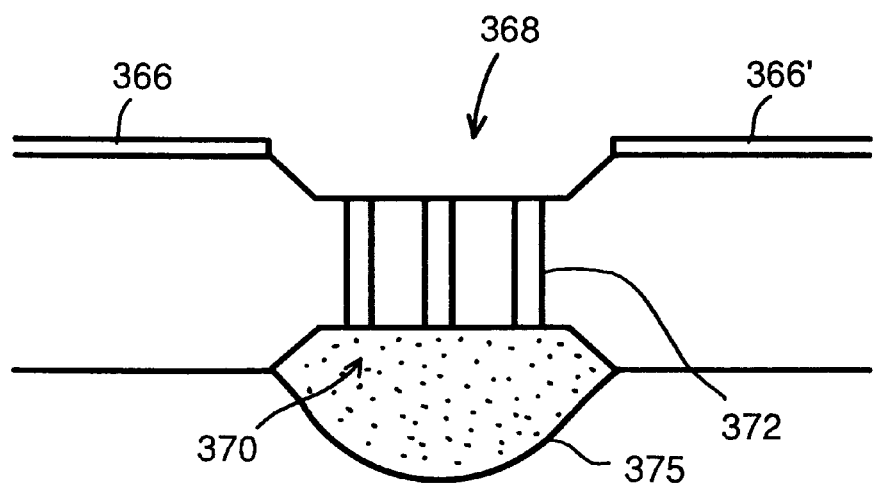
FIG. 28A to FIG. 28C are schematic diagrams showing how the solution flow takes place between the two solution storage parts formed on both surfaces of the substrate in the apparatus having through holes according to the present invention.
Figure 28B:
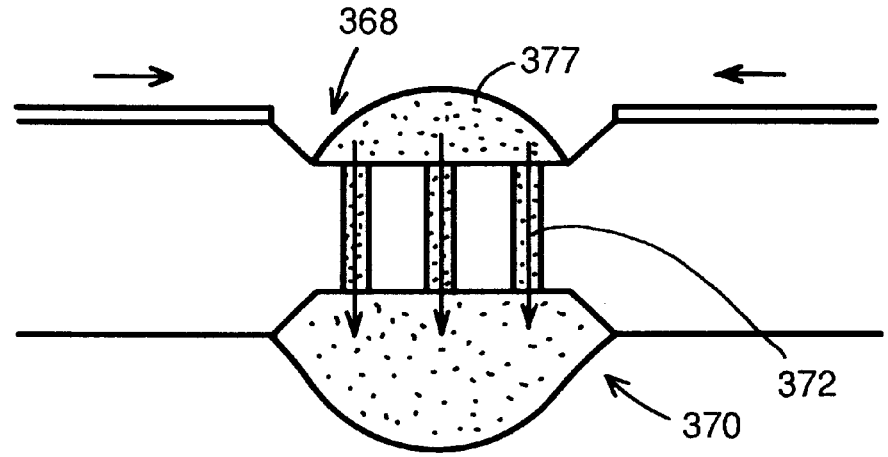
Figure 28C:
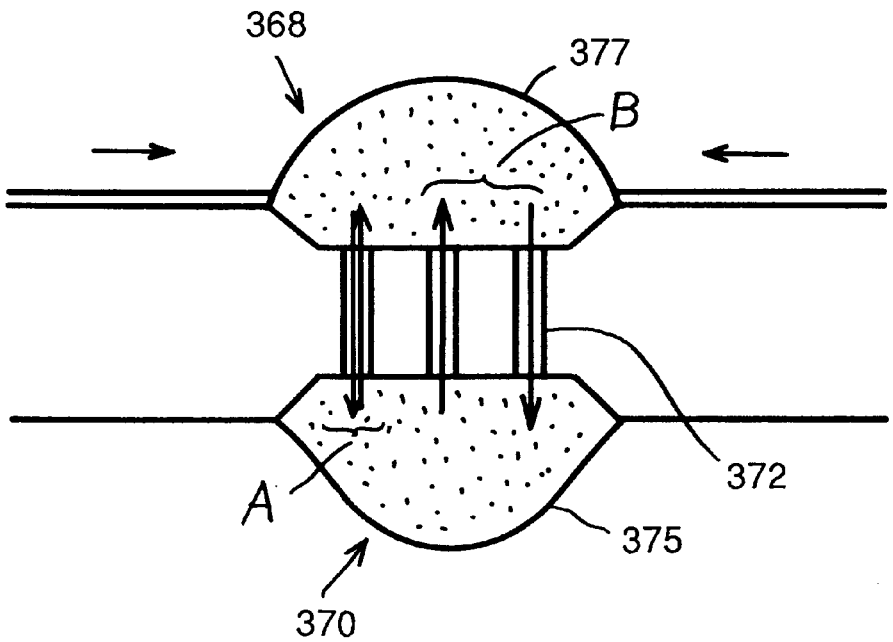

FIG. 28A to FIG. 28C show the functional principle of the upper reaction cell and the lower reaction cell connected with each other by the through holes. As shown in FIG. 28A, the solution flows into the upper reaction cell 368 formed on the upper surface of the substrate 360 through the passages 366 and 366', while the liquid flowing thereinto flows down into the lower reaction cell 370 by the through holes 372, and are held as the droplet 375. When the solution is further allowed to flow into the upper reaction cell 368 as shown in FIG. 28B, the solution come to be held little by little also in the upper reaction cell 368 while the droplet 375 hanging down in the direction of gravity is kept in the lower reaction cell 370. The direction of the solution flow at this time is mainly as shown by arrows. When the solution is further allowed to flow into the upper reaction cell 368, it will cause circulation of the liquid as shown in FIG. 28C. When the through holes 372 have a proper diameter, flows in the upper direction and the lower direction will simultaneously take place in one through hole as shown at A in FIG. 28C. As shown at B in FIG. 28C, flows reversely directed to each other will also take place synchronously between a plurality of through holes. Although the solutions seem to be in an equilibrium state in the reaction cells at a glance, the solutions held in the reaction cells are not in a thermodynamically equilibrium state but in such a biological "living state" that the flow of the solution rhythmically fluctuate. Due to such non-equilibrium environment, it is expectable that chemical reaction including a phenomenon of crystallization permanently progresses.

Figure 29A:
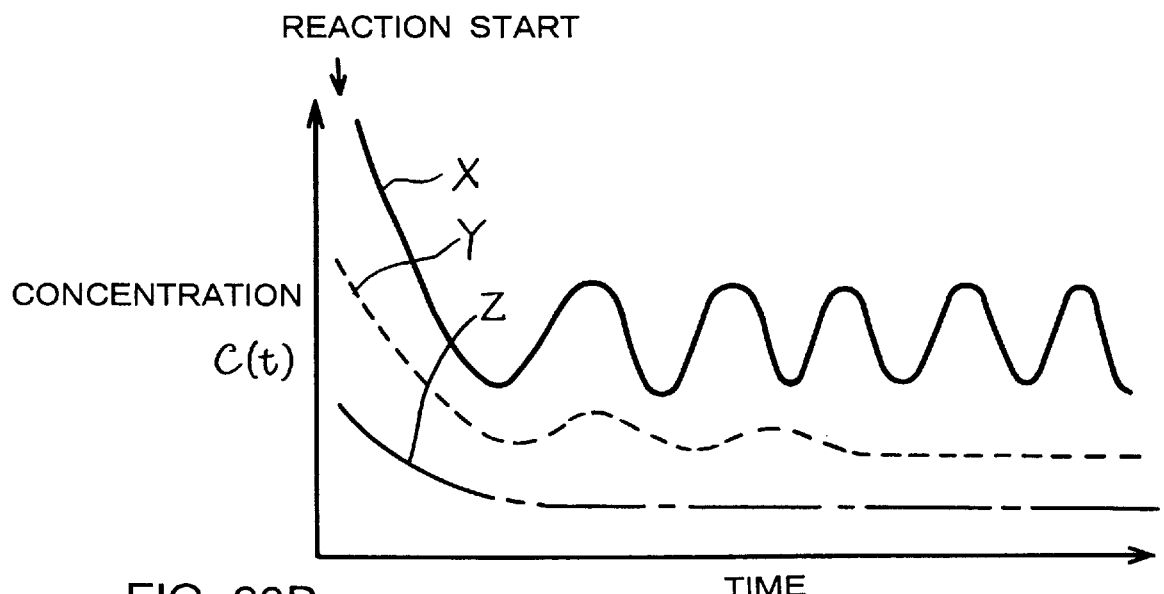
FIG. 29A and FIG. 29B are diagrams showing change of solution concentration in the solution storage parts.
Figure 29B:
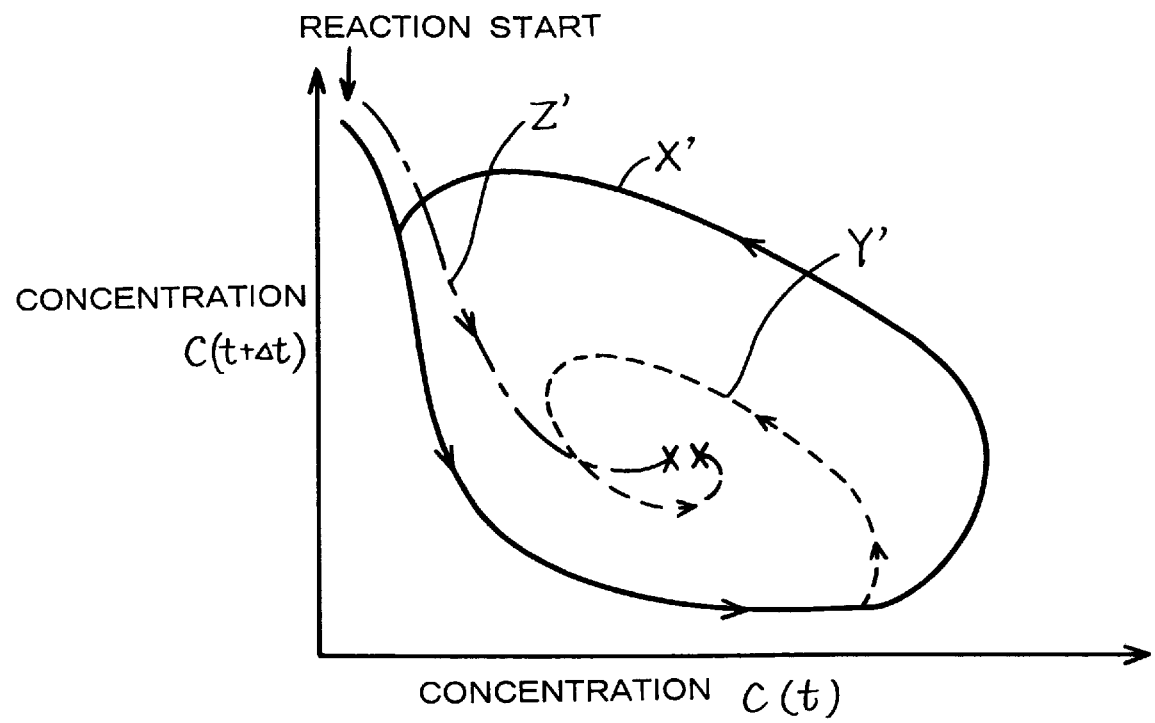

FIG. 29A shows the phenomenon shown in FIG. 28A to FIG. 28C as a change of solution concentration with respect to time. Referring to FIG. 29, the horizontal axis expresses the time and the vertical axis expresses the solution concentration. When simply mixing solutions with each other in a beaker or the like, for example, the concentration of a certain substance gradually reduces in the beaker, finally reaches a constant value, and thereafter remains unchanged. Such a process is shown by a curve Z in FIG. 29A. In the apparatus according to the present invention, on the other hand, the flows such as those shown in FIG. 28A to FIG. 28C take place between the reaction cells, so that the change of the substance concentration with time follows a process shown on a curve X or Y in FIG. 29A. Namely, the concentration will periodically fluctuate over a long time. Such concentration change is similar to phenomena which take place in various substances in organisms. FIG. 29B shows phase orbit curves of the concentration change shown in FIG. 29A. Curves X', Y' and Z' shown in FIG. 29B correspond to the curves X, Y and Z shown in FIG. 29A respectively.

Figure 30:
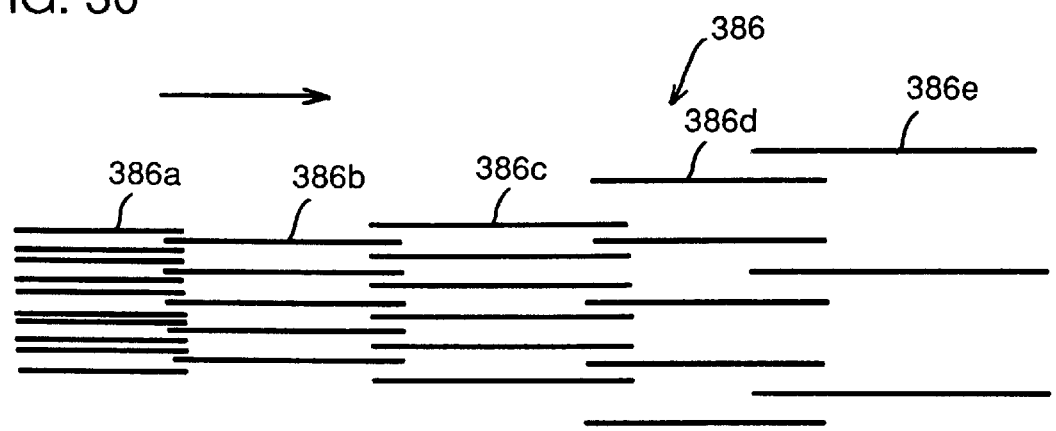
FIG. 30 is a schematic diagram showing still another example of the passage formed on the apparatus according to the present invention.
Figure 31A:
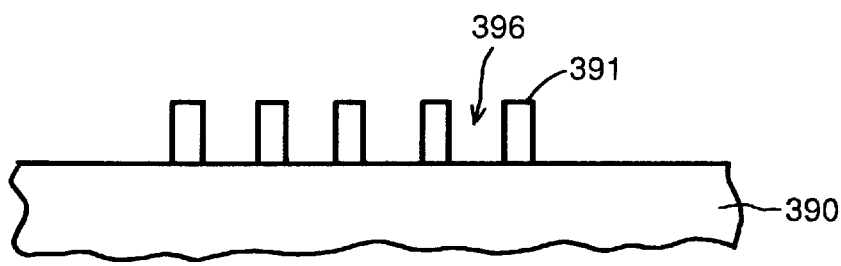
FIG. 31A and FIG. 31B are schematic sectional views showing examples of the grooves forming the passage.
Figure 31B:
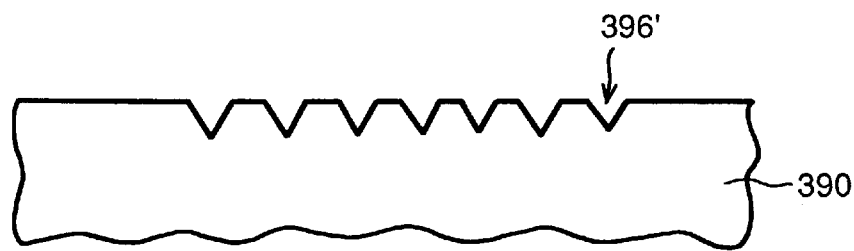

An example of the passage formed on this apparatus is schematically shown in FIG. 30. A passage 386 is formed of plural types of grooves 386a, 386b, 386c, 386d and 386e. The respective grooves 386a to 386e have prescribed lengths, and are partially superposed with the adjacent grooves. The grooves on the right side toward the figure have wider widths than the left-side grooves. Changing the widths of the grooves allows solution to stream in the direction of arrow as shown in the figure by driving force of capillaiity. The grooves forming the passage have sectional structures shown in FIG. 31A and FIG. 31B, for example. Grooves 396 shown in FIG. 31A are built up of a plurality of walls 391 formed on a substrate 390. In the case of employing silicon as the substrate, the perpendicularly upright walls 391 may be prepared from silicon oxide, for example. As shown in FIG. 31B, V-shaped grooves 396' may also formed on a substrate 390 by anisotropic etching, for example. When silicon is employed as the substrate, such V-grooves may be formed by a general method employed for fabrication of a semiconductor device.

A passage as shown in FIG. 13 may be provided in the apparatus. Such a passage may be formed in a process as shown in FIG. 18A to FIG. 18D, for example. In place of V-grooves, grooves of other shapes such as U-shaped grooves may be formed. The grooves may be formed in the substrate itself, or may be obtained by working a film such as an insulating film formed on the substrate. The apparatus may be obtained by a technique employed for a fabrication process for a semiconductor device.

When the molecule to be crystallized has positive effective surface charge in an electrolyte solution, for example, in the apparatus having a through hole, a low-resistance n-type silicon layer formed on a high-resistance n-type silicon layer in a prescribed pattern can suppress deposition of a crystal onto the high-resistance n-type silicon surface so that the crystal can selectively be grown on the low-resistance n-type silicon layer formed in the prescribed pattern. In a reaction cell 428 shown in FIGS. 32 and 33, a plurality of islands 428a consisting of a low-resistance n-type silicon layer are arranged on a high-resistance n-type silicon layer 428b at prescribed spaces. By forming such islands, it is expected that the surface potential generated by space charges of these layers may be as shown in FIG. 34, for example. Thus, it is conceivable that a crystal nucleus is secondarily formed depending on the distribution of this surface potential. Forming such a portion suitable for crystallization at a specific region in the reaction cell by valence electron control can suppress formation of excessive crystal nuclei or growth of twins, so that a crystal having good crystallinity and a large size can be grown at the specific region. Such a structure can control a position for depositing a crystal.

Forming such regions whose resistance values and/or types of impurity elements spatially differ from each other can be readily attained by selectively doping a substrate consisting of a silicon crystal or the like with impurities. As another method, silicon surfaces whose resistance values differ from each other may also be exposed by etching the surface of the substrate consisting of a silicon crystal or the like. FIG. 35 shows an example having an etched surface of the substrate. After forming a low-resistance n-type silicon layer entirely on a high-resistance n-type silicon layer 438b, islands 438a of the low-resistance n-type silicon layer are obtained by forming grooves 438c by etching. The surface potential in the substrate of such a structure is as shown in FIG. 35. The portions where the high-resistance n-type silicon layer 438b is exposed by etching have a higher surface potential.

Figure 32:
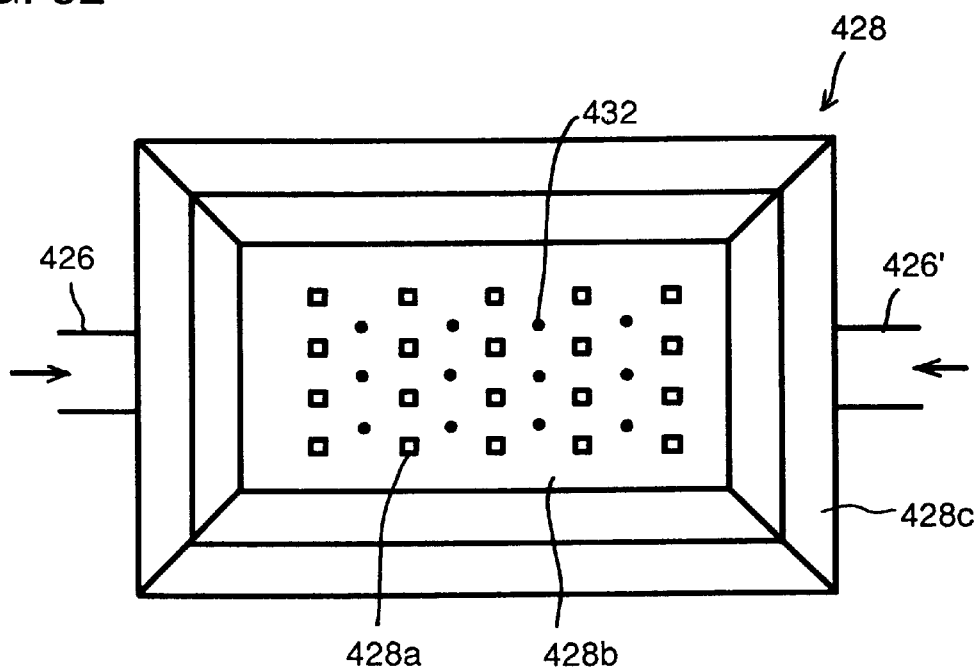
FIG. 32 is a plan view showing a further example of the second solution storage part in the apparatus having through holes according to the present invention.
Figure 33:
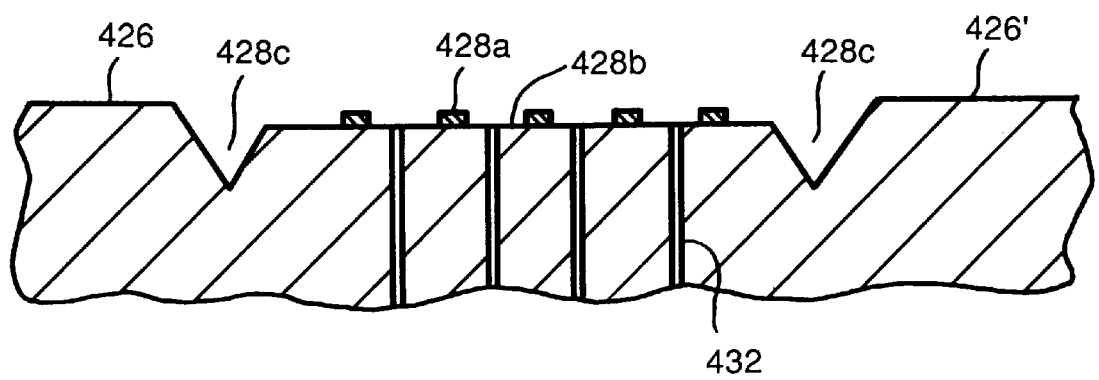
FIG. 33 is a schematic sectional view of the solution storage part shown in FIG. 32.

In the apparatus shown in FIGS. 32 and 33, V-groove 428c is also formed around the reaction cell 428. The groove may be properly formed depending on the object of crystallization. Solutions supplied from passages 426a and 426'b are temporarily stored in the groove 428c, and then supplied to the depression having the islands of the low-resistance n-type silicon layer. Further, the solution are fed to the opposed cell (illustration omitted) via through holes 432. FIGS. 36A to FIG. 36C are adapted to illustrate the role of the groove part formed with the reaction cell. In starting crystallization, a mother liquor containing a macromolecule is supplied to the groove 428c, and held as a droplet 421 by surface tension (FIG. 36A). Formation of a crystal is suppressed in this state. This is because the valence electron control has made the surface of the substrate coming into contact with the droplet suppress the formation of the crystal. Then, as solutions are supplied through the passages as shown in FIG. 36B, the volume of the droplet 421 increases and the solution soon comes to move to a flat part including the islands of the low-resistance n-type silicon layer in the reaction cell 428. Finally as shown in FIG. 36C, a solution 421' covers overall the flat part, and crystallization is facilitated on the islands 428a of the low-resistance n-type silicon layer. Thus, suppression of convection in a region for performing crystallization can be expected by forming V-groove around the mother liquor for crystallization. Namely, it is conceivable that convection mainly takes place in the V-groove when the solutions are supplied, and the convection is relaxed in the flat part performing crystallization.

While an example of forming a region of low-resistance n-type silicon on high-resistance n-type silicon has been shown in the above, a similar effect can be expected also in the case of forming islands of an n-type silicon layer on p-type silicon, for example. The conductivity types and resistance values of silicon may be properly selected depending on the charged states of substances to be crystallized.

In the apparatus having through holes, a plurality of grooves or islands to which impurity is added may be formed on the surface of the reaction cell serving as the second solution storage part, as described above. Grooves or islands of plural sizes may be prepared on a single reaction cell. It is preferable to properly change the size and depth of the groove formed on the substrate surface and the size of the island depending on the type of the macromolecule to be crystallized. In general, the width of the groove or island may be in the range of 0.01 to 100 µm. The length of the groove may be in the range of 0.1 to 10 mm, for example. A plurality of the grooves or islands may be formed at a space in the range of 1 µm to 1 mm. When a large number of the islands and grooves whose sizes differ from each other, a possibility of more preferred regions for crystallization can be increased. The depth of the groove may also be adjusted in the range of 0.01 to 200 µm. While these sizes are preferable ranges mainly in the fabrication of the apparatus, sizes other than these ranges exert no decisive bad influence on the performance of the apparatus, i.e., crystallization.

The size of the reaction cell as the second solution storage part formed on the surface of the substrate having the through hole should be decided depending on the amount of the employed solution. In general, the size of the reaction cell is preferably about 0.1 to 10 mm square. In the case of forming a reaction cell having a hole or depression by etching the substrate surface, the depth of the hole or depression is preferably in the range of about 0.01 to 500 µm.

The passage may be formed by etching the substrate itself or a film such as an oxide film formed on the substrate surface. The width of the groove may be in the range of 0.01 to 10000 µm, for example. The length of the groove is preferably prepared in the range of 0.1 to 100 mm. A plurality of the grooves are also preferably formed at a space in the range of 0.01 to 10000 µm. Further, it is preferable to adjust the depth of the groove in the range of 0.01 to 200 µm. The passage may be formed of a plurality of the grooves having the sizes in these ranges respectively. The whole width of the passage formed of the plurality of grooves may be in the range of 1 m to 10 mm.

In the apparatus having the through hole, the solid-state component surface of a silicon substrate or the like preferably has a water-repellent layer surrounding the solution storage part and the passage. This layer can effectively prevent the solution from flowing out to the periphery when the solution is held. While a silicon surface obtained by removing the oxide film, for example, is generally water-repellent to pure water or water containing only acid or alkali, the same has decreased water-repellent property to an aqueous solution containing salt such as a buffer solution. When a buffer solution is employed, therefore, a layer consisting of a water-repellent substance is preferably formed around the silicon substrate. The water-repellent layer may be composed of organic resin, for example, and resist resin and polyimide resin are examples of the materials that can most conveniently form the water-repellent layer. When a water-repellent layer consisting of polyimide is prepared, the substrate is coated with photosensitive or non-photosensitive polyimide resin and the resin is hardened, and then unnecessary parts may be removed by etching or development to obtain a desired pattern. While the thickness of the water-repellent layer employed in the present invention may not be functionally limited in particular, that of a thickness in the range of 0.1 to 100 $\mu$m is relatively easy to prepare. Various materials may also be employed for this layer so far as the same exhibit water repellence and are chemically stable in the solution.

The through hole formed in the substrate may be formed by etching, for example. When a silicon crystal substrate is employed, for example, the through hole may be formed by anisotropic etching or dry etching. The size of the through hole exerts influence on the periodic fluctuation of the solution held in the solution storage parts. Therefore, the size of the through hole is so set that desired fluctuation can occur. In general, the diameter of the through hole is preferably in the range of 1.0 $\mu$m to 5 mm, and more preferably in the range of 10 $\mu$m to 1 mm. The number of the through holes formed on the respective storage parts is not particularly limited.

The heating electrode and the temperature measurement electrode which may be formed on the apparatus according to the present invention can be readily prepared by patterning a thin film consisting of a resistive metal material. Cr, Ti, NiCr or the like may be mainly employed as the resistive metal material. These may be deposited on the substrate by sputtering or the like, and then patterning by a general method may be carried out to obtain electrodes having desired characteristics. In the case of heating the silicon substrate, the temperature range of 30 to 100° C. is preferable at the vicinity of the heater, and the range of 40 to 80° C. is more preferable.

The present invention may be employed for crystallizing various macromolecules, particularly a macromolecular electrolyte. The present invention is preferably applied to crystallization of protein such as enzyme and membrane protein, polypeptide, peptide, polysaccharide, nucleic acid, and complexes and derivatives thereof, in particular. The present invention is preferably applied to crystallization of a biological macromolecule. The present invention can also be applied to a micro-reactor apparatus for performing capturing, refinement, synthesis and the like of various biological macromolecules such as protein, enzyme and nucleic acid, in vivo or in vitro. The apparatus according to the present invention can have a microstructure and integrated structure by the aforementioned technique.

EXAMPLE 1

Lysozyme from chicken egg white was dissolved in a standard buffer solution of pH 4.5 in a concentration of 50 mg/ml. As to this solution, crystallization was carried out by employing two types of silicon crystals shown below.

(1) Sample-1

An n-type silicon layer of low resistance (specific resistance: about 0.01 $\Omega$cm, thickness: about 0.5 $\mu$m) was entirely formed on an n-type silicon substrate surface of about 30 $\Omega$cm in specific resistance by ion implantation of a phosphorus element. Then an oxide silicon layer of 200 nm was formed on the surface by thermal oxidation. Then, solution storage parts, passages, electrode patterns and pads were formed on its surface in a structure as shown in FIG. 2. These were able to be formed by employing a photolithographic process and an etching technique or the like generally employed for a fabrication process of an LSI. The solution storage parts 12a, 12b and 12c shown in FIG. 2 had a size of 3 mm by 5 mm, and the solution storage part 12d had a size of 3 mm by 10 mm. V-grooves were formed at the respective solution storage parts by anisotropic etching of silicon. The depth of all the V-grooves was 200 $\mu$m. On the other hand, all of the solution storage parts 14 for crystal growth shown in FIG. 2 were in a size of 0.2 mm by 0.2 mm. Also as to these, V-grooves were formed by etching. The depth of the grooves was about 5 $\mu$m. The passages mutually connecting the respective solution storage parts were in a shape of V-grooves. Among the passages shown in FIG. 2, the passages arranged in the vertical direction toward the figure were V-grooves whose width and depth were 50 $\mu$m. The passages arranged in the horizontal direction toward the figure were V-grooves whose width and depth were 100 $\mu$m. The passages connecting the solution storage parts for crystal growth obliquely located to each other were V-grooves whose width and depth were 20 $\mu$m. All the V-grooves were formed by anisotropic etching of the silicon surface.

The heating electrodes 18 and 28 shown in FIG. 2 were obtained by forming a Cr thin film on the silicon oxide film and patterning the same. Its film thickness was 0.2 $\mu$m. Further, Al layers of 1 $\mu$m in thickness were formed on the Cr thin film as the pads 21 and 31. On the rear surface of the silicon substrate, a rear surface electrode as shown in FIG. 3 was prepared by removing the silicon oxide film and then forming thin films of Ti, Ni and Au continuously in thicknesses of 0.05 $\mu$m, 0.2 $\mu$m and 0.2 $\mu$m respectively. Thereafter photosensitive polyimide was applied to the silicon substrate surface and patterning was performed by photolithography so that a polyimide layer of 10 $\mu$m in thickness was formed on the surface other than the solution storage parts and the passages. The obtained structure was employed for a solid-state component for crystallization.

(2) Sample-2

Ion implantation was performed in a method similar to that in the sample-1, for preparing an n-type silicon layer of low resistance on an n-type silicon substrate. The specific resistance and the thickness of the n-type layer are identical to those of the sample-1. Thereafter it was employed as a solid-state component for crystallization as such, without forming V-grooves.

An experiment for crystallization was performed in an apparatus as shown in FIG. 11. The silicon substrate of the sample-l was held in a lidded cell plate of about 40 mm in diameter so that the surface formed with the V-grooves was upward. A buffer solution of pH 4.5 was injected onto the bottom of the cell plate by about 5 ml. After allowing the cell plate holding the silicon substrate to stand still in a cool dark place at 10° C. , the aforementioned solution of lysozyme was dripped onto the solution storage part 12d shown in FIG. 2 not to overflow. A buffer solution of pH 4.5 and an NaCl aqueous solution of 1.0 M were dripped onto the solution storage parts 12a and 12c and onto the solution storage part 12b not to overflow respectively. Thereafter the cell plate was closed with the lid, a current was fed to the heating electrodes, and heating was made until the temperatures of the respective solutions increased to levels around 50° C. The heating was stopped when the respective solutions started to reach the storage parts for crystal growth through the passages. The experiment for crystallization was made as to two cases including the case of applying a voltage of +1.0 V from the outside through the rear surface electrode and the case of bringing the substrate into a floating state without applying voltage. When the voltage was applied, application of the voltage was started after the respective solutions reached the storage parts for crystal growth through the passages by heating, and the application of the voltage was then continuously performed.

The silicon substrate of the sample-2 as such was stored in a cell plate holding a buffer solution of pH 4.5 on its bottom portion. Then, a lysozyme solution similar to the case of the sample-1 was dripped onto the silicon substrate, for forming a droplet of about 10 mm in diameter. Further, a solution prepared by mixing an NaCl aqueous solution of 1.0 M and a buffer solution of pH 4.5 in a volume ratio of 1:1 was dripped onto a place separating from the above droplet by about 5 mm on the silicon substrate, so that a droplet of about 10 mm in diameter was similarly formed. Thereafter a thin passage was formed between the droplets by drawing a line from one droplet to the other droplet with a needle, so that the droplets were connected with each other. The cell plate was closed with the lid, and the silicon substrate was kept in a cool dark place at 10° C.

After keeping the silicon substrates of the sample-1 and the sample-2 in the cool dark places for 50 hours respectively, the respective samples were taken out to observe crystals of lysozyme with a microscope. The results are shown in FIGS. 37, 38 and 39. Further, FIGS. 40, 41 and 42 schematically show the morphology and the state of the crystals shown in FIGS. 37, 38 and 39 respectively. On the silicon substrate of the sample-1, relatively large-sized well grown crystals were obtained on the V-grooves of the solution storage parts as shown in FIGS. 37 and 40 even in the case of applying no voltage. The obtained crystals were good in crystallinity as to the crystal planes, and in single-crystalline state. In the case of applying the voltage, further large-sized crystals which were good in crystallinity were obtained on the V-grooves of the solution storage parts as shown in FIGS. 38 and 41. On the silicon substrate of the sample-2, on the other hand, large-sized crystals of about 1 mm were grown as shown in FIGS. 39 and 42, while they were twins or had inferior surface state of the grown crystals and not much excellent crystals were obtained. This result shows that a large-sized single crystal of good quality can be prepared according to the present invention, even with a very small amount of sample.

EXAMPLE 2

Lysozyme from chicken egg white was dissolved in a standard buffer solution of pH 4.5 in a concentration of 30 mg/ml. Crystallization was performed in two types of apparatuses consisting of silicon crystal.

(1) Sample-1

The surface of an n-type silicon substrate of about 30 Ω·cm in specific resistance was subjected to ion implantation with a phosphorus element and then annealed to entirely form a p-type silicon layer of low resistance (specific resistance: about 0.01 Ω·cm, thickness: about 5 μm). There-after a silicon oxide layer was formed on the surface by thermal oxidation in a thickness of 200 nm. Then, such a structure that two solution cells, three reaction cells and three drain cells were connected with each other through passages as shown in FIG. 43 was formed on the surface of the silicon substrate. On a silicon substrate 500, solution cells 500a and 500b are arranged at a proper space. Reaction cells 504a, 504b and 504c are arranged in a line in the transverse direction. The solution cell 500a are connected with the respective reaction cells through passages 502a, 502c and 502e. The solution cell 500b are connected with the respective reaction cells through passages 502b, 502d and 502f respectively. These passages have structures such as those shown in FIG. 13 to FIG. 15C. Drain cells 508a, 508b and 508c are provided for the respective reaction cells. The respective reaction cells are connected with the respective drain cells through passages 506a, 506b and 506c respectively. These passages are V-grooves formed on the substrate 500.

The overall size of the apparatus (micro.reactor) for crystallization was 30 mm square. The size of the solution cells 500a and 500b was 3 mm by 20 mm. V-grooves of about 10 μm in width were formed around regions of this size by etching, so that these regions were comparted from the other regions and defined the solution cells. The size of the three reaction cells was 2 mm by 5 mm. V-grooves of 40 μm in depth and 200 μm in width were provided around the regions of 2 mm by 5 mm for the respective reaction cells. The V-grooves were formed by etching. Further, the flat regions of 2 mm by 5 mm were anisotropically etched in a depth of 10 μm, while working was performed to leave thin regions of the p-type layer having a width of about 0.2 mm on the surface at a pitch of about 1 mm. Thus, spatial selectivity for aggregation and crystallization of molecules was given to the inner flat region. The size of the respective drain cells connected with the respective reaction cells was 2 mm by 5 mm, and the depth was 100 μm.

The lengths of the passages from the solution cells 500a and 500b to the three reaction cells 504a, 504b and 504c were 5 mm, 10 mm and 20 mm respectively. The width of all the passages was 1 mm. All the passages having the width of 1 mm consist of V-grooves formed by anisotropic etching of silicon. In the structure as shown in FIG. 13 to FIG. 15C, the width and depth of the grooves were changed every third of the entire passage length. In the first third of the passage, the ratio (L/S) of the width of the grooves to the space between the grooves was 1. L/S was 1/10 in the next third, and L/S was 1/20 in the last third. Further, the depth of the grooves were 1 μm in the first third of the passage, 5 μm in the next third, and 50 μm in the last third. Namely, in the case of any passage of 10 mm in length, L/S was 1 μm and the depth was 1 μm in the first length of 3.3 mm, L/S was 5 μm 50 μm and the depth was 5 μm in the next part of 3.3 μm, and L/S was 50 μm 1000 μm and the depth was 50 μm in the last part of 3.3 mm.

The three drain cells were also connected with the respective reaction cells through passages of 2 mm in length. The width of the respective passages was 1 mm. As to the size of the V-grooves forming the passages, L/S was 100 μm 200 μm, and the depth was about 100 μm.

After forming the groove parts, photosensitive polyimide was applied to the silicon substrate surface, and a polyimide layer having a thickness of 10 μm was formed on the surface other than the respective cells and passages by photolithography.

(2) Sample-2

A micro-reactor was prepared similarly to the sample-1, except that three drain cells and passages connected therewith were not formed.

The samples-1 and 2 obtained in the above-described manner were introduced into a lidded cell plate of about 50 mm in diameter, so that the finely worked surface was upward. A buffer solution of pH 4.5 was previously placed onto the bottom of the cell plate by about 5 ml. Thereafter the above solution of lysozyme was dripped onto the three reaction cells of the samples 1 and 2 by 500 µm respectively, and a buffer solution of pH 4.5 was dripped onto the solution cell 100*a* by about 1 ml while a sodium chloride aqueous solution of 0.1 M was dripped onto the solution cell 100*b* by 1 ml without overflow of the droplets.

Then, the cell plate was closed with the lid, and the apparatuses were allowed to stand still in a cool dark place at 10° C. After keeping the samples in the cool dark place for 72 hours, the samples were taken out for observing crystals of lysozyme on the substrates with a microscope. The results are shown in FIGS. 44 and 45. As shown in FIG. 44, on the sample-1, large-sized single crystals having smooth crystal planes and a size of about 1 mm were obtained at the regions of the p-type silicon layer in the reaction cells. In addition, no growth of crystals took place at the regions of the n-type silicon layer exposed by etching. Therefore, it has become apparent that the apparatus according to the present invention is effective for crystallization.

On the sample-2, on the other hand, crystals of relatively large sizes were obtained at the regions of the p-type silicon layer in the reaction cells, as shown in FIG. 45. However, most of the obtained crystals were twins. It was also observed that the crystals were deposited on the regions of the n-type silicon layer. This result was so understood that since the buffer solution and the precipitant were regularly supplied into the reaction cells from the solution cells and no liquids were discharged on the sample-2, excessive crystal nuclei were formed in the reaction cells, and these nuclei further floated in the cells to proceed to crystal growth at various portions. It has become apparent that a crystal of good quality can be obtained by discharging the solution from the reaction cells to keep the balance of the concentration as in the sample-1.

As shown in the above, by employing the apparatus according to the present invention such as the sample-1, a large-sized crystal of good quality can be prepared even with a very small amount of sample.

EXAMPLE 3

Myoglobin derived from a sperm whale was dissolved in a phosphate buffer solution of pH 7.2 in a concentration of 20 mg/ml. As to this solution, crystallization was performed in two types of apparatuses consisting of silicon crystal.
(1) Sample-1

The surface of an n-type silicon substrate of about 20 Ω·cm in specific resistance was subjected to ion implantation of a phosphorus element, and then annealed to entirely form an n-type silicon layer of low resistance (specific resistance: about 0.01 Ω·cm, thickness: about 3 µm). Thereafter a silicon oxide layer was formed on the surface by thermal oxidation in a thickness of 200 nm. Then, three pairs of solution cells, three upper reaction cells, three pairs of passages, a heating electrode and a temperature measurement electrode were formed on the front surface of the substrate in the arrangement as shown in FIG. 24, and three lower reaction cells were formed on the rear surface of the substrate. The size of the silicon substrate was 30 mm square, and the size of the concave solution cells formed on the front surface was 5 mm square. The size of both reaction cells formed on the front and the rear surfaces of the silicon substrate was 3 mm square. Around each of the upper reaction cells, a V-groove of 40 µm in depth and 200 µm in width was provided. The grooves were formed by etching. Further, the flat regions inside the grooves were anisotropically etched in a depth of 50 µm, and thin regions, about 0.2 mm wide, of the low-resistance n-type layer were left on the surface at a pitch of 0.5 mm. Such working gave spatial selectivity for aggregation and crystallization of molecules to the inner flat regions.

The length of the passages from the solution cells to the reaction cells on the substrate surface was 5 mm, and the width of all the passages was 3 mm. All the passages were composed of a plurality of V-grooves obtained by working the silicon oxide. The walls shaping the grooves were formed by etching the silicon oxide layer in a prescribed pattern. In the structure as shown in FIG. 13, the width of the grooves was changed every third of the entire passage length. The width of the grooves was 1 µm in the first third of the passages, 5 µm in the next third, and 50 µm in the last third. The ratio (L/S) of the width of the grooves to the space between the grooves was 1:1 in the first third of the passage, 1:10 in the next third, and 1:20 in the last third. Namely, in any passage of 5 mm in length, L/S was 1 µm/1 µm in the first part of 1.67 mm in length, L/S was 5 µm/50 µm in the next part of 1.67 µm in length, and L/S was 50 µm/1000 µm in the last part of 1.67 µm.

Then, through holes were formed in the substrate by blasting. In the three reaction cells formed on the surface of the substrate, through holes having different diameters were formed at different pitches. A plurality of through holes of 0.1 mm in diameter were formed at a pitch (space) of 0.2 mm in the first cell among the three reaction cells. In the second cell, a plurality of through holes of 0.3 mm in diameter were formed at a pitch of 0.5 mm. In the third cell, a plurality of through holes of 0.6 mm in diameter were formed at a pitch of 0.8 mm.

Then, a Cr film in a thickness of 0.3 µm was formed on the surface of the silicon substrate, and patterned to form a heat generator of 100 µm in width and a temperature measure of 2 µm in width at an end portion of the substrate. Al having a thickness of about 1 µm was deposited on the pads of the Cr thin film. Then, photosensitive polyimide was applied to the silicon substrate surface and patterned by photolithography to form a polyimide layer of 10 µm in thickness on the surface other than the respective cells and passages.
(2) Sample-2

An apparatus of sample 2 was prepared in a method similar to that for sample 1, except that no through holes were formed in sample 2. Namely, in the apparatus of sample 2, the reaction cells formed on the front surface are not connected with those on the rear surface.

The apparatuses (microreactors) of sample-1 and sample-2 prepared in the above-described manner were held in a lidded cell plate of about 50 mm in diameter respectively, as shown in FIG. 27. A buffer solution of pH 7.2 was placed on the bottom of the cell plate by about 5 ml. Then, the above myoglobin solution was dripped onto the three reaction cells of sample-1 and sample-2 by 500 µl respectively, while a buffer solution of pH 7.2 was dripped into one solution cell connected with each reaction cell by about 1 ml and a sodium chloride aqueous solution of 0.2 M was dripped into the other solution cell by 1 ml without spilt droplets. Thereafter the cell plate was closed with the lid and the apparatuses were allowed to stand still in a cool dark place at 10° C. while energizing the heat generators on the silicon substrates for raising the temperature around the heat generators to about 45° C. After keeping the respective samples in the cool dark place for 72 hours, the samples were taken out for observing crystallized states of myoglobin with a microscope. The results are shown below.

In the first reaction cell of sample-1, a large amount of crystals having a very small size of about 0.1 mm were deposited mainly on the low-resistance n-type region. Twin crystals also existed. In the second reaction cell of sample-1, single crystals having smooth surfaces and a large size of about 0.8 mm were obtained on the low-resistance n-type region. On the other hand, no crystal growth took place on the region of high-resistance n-type silicon. On the third reaction cell of sample-1, a large amount of very small crystals similar to those on the first reaction cell were deposited. From the above result, it has become apparent that the second reaction cell is more effective for crystallization in the apparatus of sample-1.

In the apparatus of sample-2, on the other hand, crystals of relatively large sizes were obtained at the regions of the low-resistance n-type layer in the reaction cells, while a large amount of twin crystals were obtained. This suggests that since excessive crystal nuclei are readily produced with the regularly supplied buffer solution and precipitant and a turbulence is readily generated in the reaction cells of the sample-2, the nuclei float in the reaction cells and crystal growth progresses at various places. As the result in sample 1 shows, a large-sized single crystal of good quality can be prepared even with a very small amount of sample by employing the apparatus according to the present invention.

While the regions having valence electrons controlled, i.e., low-resistance n-type regions were arranged in a prescribed pattern in the reaction cells formed on the upper surface of the substrate in the above Example, such regions may be formed only in the reaction cells on the lower surface of the substrate, or may be formed in both reaction cells on the upper surface and the lower surface.

According to the present invention, as described above, it is possible to overcome the disadvantages of the conventional crystallization process which has been carried out with repeating trial and error and with no technique applicable to any substance of various properties. Particularly according to the present invention, the influence of convection in a solvent resulting from gravity can be suppressed, and stable nucleation can be made in the initial process of crystallization. According to the present invention, it is also possible to suppress or control mass production of microcrystals, and to obtain a large-sized crystal that can enable X-ray structural analysis. According to the present invention, a large number of different conditions for crystallization can also be prepared with very small amounts of solutions on a single substrate. Thus, optimum conditions for crystallization can be made for specific molecules. Additionally, in the present invention, application of a voltage can bring a more suitable electrical state on the surface of the substrate for aggregation and crystallization of molecules. Growth of a crystal can be facilitated by application of the voltage. According to the present invention, influence of convection in the solution can also be suppressed in the groove part, so that a crystal can be grown stably. The present invention can make more proper conditions for growing a large-sized crystal in a short time, even if the amount of sample is very small.

The present invention is applied to research, development and production of useful substances, particularly biological macromolecules such as proteins, nucleic acids and the like, in pharmaceutical industry, food industry and the like. According to the present invention, it is possible to grow a crystal having good crystallinity enabling X-ray structural analysis. Information obtained as to the molecular structure and the mechanism of activity as a result of crystal analysis is applied to design and preparation of medicines. The present invention is also applied to purification or crystallization of molecules of interest. In addition, the application of the present invention is expected for the preparation of an electronic device employing biological macromolecules such as proteins. The apparatus of the present invention can selectively adsorb and fix biological macromolecules or the like, and therefore can be applied to biosensors and measuring devices with the biosensors using various biological tissues and biological substances.

The embodiments disclosed this time must be considered as illustrative and not restrictive in all points. The scope of the present invention is shown not by the above description but by claims, and it is intended that all changes in the meaning and range equal to claims are included.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for growing a crystal of a macromolecule contained in a solution, comprising:
   a substrate whose valence electrons are controlled so that the concentration of holes or electrons in a surface part can be controlled in response to the environment of the solution containing said macromolecule, wherein the surface of said substrate has:
      a plurality of first solution storage parts for holding at least two types of solutions respectively,
      a plurality of second solution storage parts for holding the solution containing said macromolecule for growing said crystal, and
      a plurality of passages connecting said plurality of first solution storage parts with said plurality of second solution storage parts to allow distribution of the solutions, and
   the valence electrons are so controlled at least in said second solution storage parts that the concentration of the holes or electrons in the surface part can be controlled in response to the environment of the solution containing said macromolecule.

2. The apparatus for crystal growth in accordance with claim 1, further comprising a means for heating the solution in said first solution storage part.

3. The apparatus for crystal growth in accordance with claim 1, further comprising an electrode for applying a voltage at least to said second solution storage part.

4. The apparatus for crystal growth in accordance with claim 1, wherein, in said plurality of passages, the widths and/or the depths thereof are different from each other.

5. The apparatus for crystal growth in accordance with claim 1, wherein said valence electrons in the surface of said substrate are so controlled that formation of a crystal nucleus of said macromolecule and growth of the crystal are facilitated at a specific region in said second solution storage part while formation of said crystal nucleus is suppressed at the remaining region in said second solution storage part.

6. The apparatus for crystal growth in accordance with claim 1, wherein said substrate comprises a semiconductor substrate to which an impurity is added, and said valence electron control is made by control of the concentration and/or the type of said impurity.

7. The apparatus for crystal growth in accordance with claim 6, wherein said semiconductor substrate consists essentially of a silicon crystal.

8. The apparatus for crystal growth in accordance with claim 6, wherein a groove or hole is formed in said second solution storage part.

9. The apparatus for crystal growth in accordance with claim 6, wherein the concentration and/or the type of said impurity is different between inside and outside said groove or hole.

10. The apparatus for crystal growth in accordance with claim 1, further comprising a coat consisting essentially of an oxide on the surface to be in contact with the solutions.

11. An apparatus for crystal growth, comprising:
the apparatus for crystal growth in accordance with claim 1;
a container capable of housing said apparatus in a sealed state along with a precipitant or a buffer solution; and
a means for supporting said apparatus in said container.

12. A method of growing a crystal of a macromolecule contained in a solution, comprising:
a step of providing the apparatus for crystal growth in accordance with claim 1;
a step of making said plurality of first solution storage parts hold a first solution containing said macromolecule and a second solution being different therefrom respectively;
a step of shifting said fast solution and said second solution to said plurality of second solution storage parts through said plurality of passages so that a plurality of mixed solutions in which said first solution and said second solution are mixed with each other in different ratios are stored in said plurality of second solution storage parts respectively; and
a step of growing the crystal of said macromolecule in said plurality of second solution storage parts storing said plurality of mixed solutions respectively under an electrical state brought to the surface of said substrate by said controlled valence electrons.

13. The crystal growth method in accordance with claim 12, further comprising a step of heating the solution in said first solution storage part, whereby transition of the solution from said first solution storage part through said passage is facilitated.

14. The crystal growth method in accordance with claim 12, further comprising a step of applying a voltage to at least said second solution storage part of said apparatus so that the electrical state brought to the surface of said apparatus is controlled.

15. The crystal growth method in accordance with claim 12, wherein a groove or hole is formed in said second solution storage part, and convection is suppressed and crystallization of said macromolecule is facilitated by said groove or hole.

16. The crystal growth method in accordance with claim 12, wherein said second solution is a buffer solution or a salt solution for changing the pH or the salt concentration of said first solution.

17. The crystal growth method in accordance with claim 12, wherein said second solution is a solution that changes the pH and the salt concentration of said first solution.

18. An apparatus for growing a crystal of a macromolecule contained in a solution, comprising:
a substrate whose valence electrons are controlled so that the concentration of holes or electrons in a surface part can be controlled in response to the environment of the solution containing said macromolecule, wherein
the surface of said substrate comprises:
a plurality of first solution storage parts for holding at least two types of solutions respectively,
a plurality of first passages for discharging the solutions from said plurality of first solution storage parts respectively and unidirectionally feeding the same,
a second solution storage part for simultaneously receiving said at least two types of solutions fed by said plurality of first passages respectively,
a second passage for discharging the solution from said second solution storage part and unidirectionally feeding the same, and
a third solution storage part for receiving the solution fed from said second passage, and
the valence electrons are so controlled at least in said second solution storage part that the concentration of the holes or electrons in the surface part can be controlled in response to the environment of the solution containing said macromolecule.

19. The apparatus for crystal growth in accordance with claim 18, further comprising a means for heating said substrate.

20. The apparatus for crystal growth in accordance with claim 18, further comprising an electrode for applying a voltage at least to said second solution storage part.

21. The apparatus for crystal growth in accordance with claim 18, wherein said first passages and the second passage is a groove formed on said substrate, and said groove has a stepwise shape or a gradient to unidirectionally feed said solution.

22. The apparatus for crystal growth in accordance with claim 18, wherein said first passages and the second passage is composed of a plurality of grooves having different widths and depths and being formed on said substrate, and the widths of said grooves widen and said grooves deepen, as going from the upper stream to the lower stream.

23. The apparatus for crystal growth in accordance with claim 18, wherein among a plurality of said first passages carrying the same type of solution, one of said first passages toward one of said second solution storage parts is different from another of said first passages toward another one of said second solution storage parts in length and width, so that said one of said second solution storage parts receives the solution from said first solution storage part at a flow rate different from said another one of said second solution storage parts.

24. The apparatus for crystal growth in accordance with claim 18, wherein said valence electrons in the surface of said substrate are so controlled that formation of a crystal nucleus of said macromolecule and growth of the crystal are facilitated at a specific region in said second solution storage part while formation of said crystal nucleus is suppressed at the remaining region in said second solution storage part.

25. The apparatus for crystal growth in accordance with claim 18, wherein said substrate consists essentially of an impurity-added semiconductor substrate, and said valence electron control is made by control of the concentration and/or the type of the impurity.

26. The apparatus for crystal growth in accordance, with claim 25, wherein said semiconductor substrate consists essentially of a silicon crystal.

27. The apparatus for crystal growth in accordance with claim 18, wherein a groove or hole is formed in said second solution storage part.

28. A method of growing a crystal of a macromolecule contained in a solution, comprising:
a step of providing the apparatus for crystal growth in accordance with claim 18;
a step of making said plurality of first solution storage parts hold a first solution containing said macromolecule and a second solution different therefrom respectively;

a step of shifting said first solution and said second solution to said second solution storage part through said plurality of first passages and mixing said first solution and said second solution with each other in said second solution storage part; and a step of guiding the obtained mixed solution from said second solution storage part to said third solution storage part through said second passage while growing the crystal of said macromolecule in said second solution storage part storing said mixed solution under an electrical state brought to the surface of said apparatus by said controlled valence electrons.

29. The crystal growth method in accordance with claim 28, wherein said apparatus has a plurality of said second solution storage parts and the plurality of first passages having different sizes, and a plurality of mixed solutions in which said first solution and said second solution are mixed with each other in different ratios are stored in said plurality of second solution storage parts respectively.

30. The crystal growth method in accordance with claim 28, further comprising a step of heating said substrate.

31. The crystal growth method in accordance with claim 28, further comprising a step of applying a voltage to said second solution storage part so that the electrical state brought to the surface of said apparatus is controlled.

32. The crystal growth method in accordance with claim 28, wherein a groove or hole is formed in said second solution storage part, and convection is suppressed and growth of the crystal is facilitated by said groove or hole.

33. The crystal growth method in accordance with claim 28, wherein, said second solution is a buffer solution or a salt solution for changing the pH or the salt concentration of said first solution.

34. The crystal growth method in accordance with claim 28, wherein said second solution is a solution that changes the pH and the salt concentration of said first solution.

35. The apparatus for crystal growth in accordance with claim 18, wherein among a plurality of said first passages carrying the same type of solution, one of said first passages toward one of said second solution storage parts is different from another of said first passages toward another one of said second solution storage parts in length or width, so that said one of said second solution storage parts receives the solution from said first solution storage part at a flow rate different from said another one of said second solution storage parts.

36. An apparatus for growing a crystal of a macromolecule contained in a solution, comprising:

a substrate, having an opposed pair of principal surfaces, whose valence electrons are controlled so that the concentration of holes or electrons in said principal surface parts can be controlled in response to the environment of the solution containing said macromolecule, wherein said substrate comprises:

a first solution storage part, provided on one of said pair of principal surfaces, for holding the solution employed for crystal growth, a passage, provided on one of said pair of principal surfaces, for discharging the solution from said first solution storage part and feeding the same in a prescribed direction, a second solution storage part, provided on one of said pair of principal surfaces, for receiving the solution fed by said passage, a through hole for guiding the solution present in said second solution storage part to the other one of said pair of principal surfaces, and a third solution storage part for receiving the solution fed through said through hole in the other one of said pair of principal surfaces, and the valence electrons are so controlled at least in said second solution storage part or at least in said third solution storage part that the concentration of the holes or electrons in the surface parts can be controlled in response to the environment of the solution containing said macromolecule.

37. The apparatus for crystal growth in accordance with claim 36, wherein said passage is composed of a plurality of grooves having different widths and depths formed on said substrate, and as going from the upper stream to the lower stream, the widths of said grooves widen and said grooves deepen.

38. The apparatus for crystal growth in accordance with claim 36, wherein said substrate comprises a plurality of said second solution storage parts and the third solution storage parts, and the diameter of one said through hole connecting one said second solution storage part with one said third solution storage part is different from the diameter of another said through hole connecting another said second solution storage part with another said third solution storage part.

39. The apparatus for crystal growth in accordance with claim 36, further comprising a means for heating said substrate.

40. The apparatus for crystal growth in accordance with claim 36, wherein said valence electrons are so controlled that formation of a crystal nucleus of said macromolecule and growth of the crystal are facilitated at a specific region in said second solution storage part and the third solution storage part while formation of said crystal nucleus is suppressed at the remaining region in said second solution storage part and the third solution storage part.

41. The apparatus for crystal growth in accordance with claim 36, wherein said substrate consists essentially of a semiconductor substrate to which impurity is added, and said valence electron control is made by control of the concentration or the type of the impurity.

42. The apparatus for crystal growth in accordance with claim 41, wherein said semiconductor, substrate consists essentially of a silicon crystal.

43. The apparatus for crystal growth in accordance with claim 36, wherein a groove or hole is formed in said second solution storage part.

44. A method of growing a crystal of a macromolecule contained in a solution, comprising:

a step of providing the apparatus for crystal growth in accordance with claim 36;

a step of making said first solution storage part hold the solution containing said macromolecule;

a step of feeding said solution fiom said first solution storage part to said second solution storage part through said passage;

a step of circulating said solution between said second solution storage part and said third solution storage part through said through hole; and a step of growing a crystal of said macromolecule in said second solution storage part and said third solution storage part under an electrical state brought to the surface of said apparatus by said controlled valence electrons.

45. The crystal growth method in accordance with claim 44, wherein said apparatus has a plurality of said first solution storage parts, a plurality of said second solution storage parts and a plurality of said passages having different lengths or widths, said plurality of first solution storage parts are allowed to hold a first solution containing said macromolecule and a second solution being different therefrom respectively, said first solution and said second solution are allowed to move to said plurality of second solution storage parts through said plurality of passages, and a plurality of mixed solutions in which said first solution and said second solution are mixed with each other in different rations are allowed to be held in said plurality of second solution storage parts respectively.

46. The crystal growth method in accordance with claim 45, wherein said second solution is a buffer solution or a salt solution for changing the pH or the salt concentration of said first solution.

47. The crystal growth method in accordance with claim 45, wherein said second solution is a solution that changes the pH and the salt concentration of said first solution.

48. The crystal growth method in accordance with claim 44, further comprising a step of heating said substrate.

49. The crystal growth method in accordance with claim 41, further comprising a step of applying a voltage to said second solution storage part so that the electrical state brought to the surface of said apparatus is controlled.

50. The crystal growth method in accordance with claim 44, wherein a groove or hole is formed in said second solution storage part, and convection is suppressed and growth of the crystal is facilitated by said groove or hole.

51. The crystal growth method in accordance with claim 44, wherein said apparatus has a plurality of said first solution storage parts, a plurality of said second storage parts, and a plurality of said passages having different lengths and widths, said plurality of said first solution storage parts are allowed to hold a first solution containing said macromolecule and a second solution being different therefrom respectively, said first solution and said second solution are allowed to move to said plurality of second storage parts through said plurality of passages, and a plurality of mixed solutions in which said first solution and said second solution are mixed with each other in different rations are allowed to be held in said plurality of second solution storage parts respectively.

52. The apparatus for crystal growth in accordance with claim 36, wherein said passage is composed of a plurality of grooves having different widths or depths formed on said substrate, and as going from the upper stream to the lower stream, the widths of said grooves widen or said grooves deepen.

53. The apparatus for crystal growth in accordance with claim 36, wherein said valence electrons are so controlled that formation of a crystal nucleus of said macromolecule and growth of the crystal are facilitated at a specific region in said second storage part or the third solution storage part while formation of said crystal nucleus is suppressed at the remaining region in said second solution storage part or the third solution storage part.

54. The apparatus for crystal growth in accordance with claim 36, wherein said substrate consists essentially of a semiconductor substrate to which impurity is added, and said valence electron control is made by control of the concentration and the type of the impurity.

55. A method of growing a crystal of a macromolecule contained in a solution, comprising:

a step of providing the apparatus for crystal growth in accordance with claim 36;

a step of making said first solution storage part hold the solution containing said macromolecule;

a step of feeding said solution from said first solution storage part to said second solution storage part through said passage;

a step of circulating said solution between said second solution storage part and said third solution storage part through said through hole; and a step of growing a crystal of said macromolecule in said second solution storage part or said third solution storage part under an electrical state brought to the surface of said apparatus by said controlled valence electrons.

56. An apparatus for growing a crystal of a macromolecule contained in a solution, comprising:

a silicon substrate whose electrostatic property in a surface thereof is previously adjusted, wherein said substrate comprises:

a first solution storage part that is a hollow formed on the surface of said substrate;

a second solution storage part that is another hollow formed on the surface of said substrate; and a passage connecting said first solution storage part with said second solution storage part; and said electrostatic property in the surface of said substrate is so adjusted that formation of a crystal nucleus of said macromolecule and growth of the crystal are facilitated at a specific region in said second solution storage part while formation of said crystal nucleus is suppressed at the remaining region in said second solution storage part.

* * * * *

UNITED STATES PATENT AND TRADEMARK OFFICE
CERTIFICATE OF CORRECTION

PATENT NO. : 6,174,365 B1
DATED : January 16, 2001
INVENTOR(S) : Akira Sanjoh

It is certified that error appears in the above-identified patent and that said Letters Patent is hereby corrected as shown below:

Claim 49,
Line 2, "41" is deleted and -- 44 -- is inserted.

Signed and Sealed this

Sixth Day of November, 2001

Attest:

NICHOLAS P. GODICI
Attesting Officer   Acting Director of the United States Patent and Trademark Office